United States Patent
Yamamoto

(10) Patent No.: US 9,887,211 B2
(45) Date of Patent: Feb. 6, 2018

(54) SEMICONDUCTOR DEVICE AND METHOD OF MANUFACTURING THE SAME

(71) Applicant: Renesas Electronics Corporation, Kawasaki-shi, Kanagawa (JP)

(72) Inventor: Yoshiki Yamamoto, Kanagawa (JP)

(73) Assignee: Renesas Electronics Corporation, Tokyo (JP)

( * ) Notice: Subject to any disclaimer, the term of this patent is extended or adjusted under 35 U.S.C. 154(b) by 487 days.

(21) Appl. No.: 14/291,095

(22) Filed: May 30, 2014

(65) Prior Publication Data

US 2014/0353756 A1    Dec. 4, 2014

(30) Foreign Application Priority Data

May 31, 2013 (JP) ................. 2013-116265

(51) Int. Cl.
  *H01L 27/12* (2006.01)
  *H01L 21/84* (2006.01)
  *H01L 21/762* (2006.01)
  *H01L 27/11* (2006.01)
  *H01L 29/78* (2006.01)

(52) U.S. Cl.
  CPC .... *H01L 27/1203* (2013.01); *H01L 21/76283* (2013.01); *H01L 21/84* (2013.01); *H01L 27/1104* (2013.01); *H01L 27/1116* (2013.01); *H01L 29/78* (2013.01)

(58) Field of Classification Search
  CPC .. H01L 27/1104; H01L 27/11; H01L 27/1203; H01L 21/28518; H01L 29/7833; H01L 21/84; H01L 21/76283; H01L 27/1116
  USPC .............................................. 257/351, 369
  See application file for complete search history.

(56) References Cited

U.S. PATENT DOCUMENTS

| 2006/0157797 A1 | 7/2006 | Tateshita |
| 2009/0096036 A1 | 4/2009 | Ishigaki et al. |
| 2011/0195566 A1 | 8/2011 | Lshigaki et al. |

FOREIGN PATENT DOCUMENTS

| JP | 2004-047608 A | 2/2004 |
| JP | 2006-190821 A | 7/2006 |
| JP | 2006-190823 A | 7/2006 |

(Continued)

OTHER PUBLICATIONS

Office Action dated Dec. 6, 2016, in Japanese Patent Application No. 2013-116265.

*Primary Examiner* — Long Pham
(74) *Attorney, Agent, or Firm* — Shapiro, Gabor and Rosenberger, PLLC

(57) ABSTRACT

A semiconductor device using an SOI (Silicon On Insulator) substrate, capable of preventing malfunction of MISFETs (Metal Insulator Semiconductor Field Effect Transistor) and thus improving the reliability of the semiconductor device. Moreover, the parasitic resistance of the MISFETs is reduced, and the performance of the semiconductor device is improved. An epitaxial layer formed on an SOI layer above an SOI substrate is formed to have a large width so as to cover the ends of the upper surface of an isolation region adjacent to the SOI layer. By virtue of this, contact plugs of which formation positions are misaligned are prevented from being connected to a semiconductor substrate below the SOI layer. Moreover, by forming the epitaxial layer at a large width, the ends of the SOI layer therebelow are prevented from being silicided. As a result, increase in the parasitic resistance of MISFETs is prevented.

10 Claims, 51 Drawing Sheets

(56) References Cited

FOREIGN PATENT DOCUMENTS

| | | |
|---|---|---|
| JP | 2007-142036 A | 6/2007 |
| JP | 2008-227205 A | 9/2008 |
| JP | 2008-270473 A | 11/2008 |
| JP | 2009-094369 A | 4/2009 |
| JP | 2010-141281 A | 5/2010 |

SEMICONDUCTOR DEVICE AND METHOD OF MANUFACTURING THE SAME

CROSS-REFERENCE TO RELATED APPLICATION

The present application claims priority from Japanese Patent Application No. 2013-116265 filed on May 31, 2013, the content of which is hereby incorporated by reference into this application.

BACKGROUND

The present invention relates to a semiconductor device and a manufacturing method thereof and particularly relates to the techniques which are effective when applied to a semiconductor device using an SOI (Silicon On Insulator) substrate and a manufacturing method thereof.

As a semiconductor device capable of suppressing short-channel characteristics and suppressing element variations, today, a semiconductor device using an SOI substrate is used. The SOI substrate is a substrate in which a BOX (Buried Oxide) film (buried oxide film) is formed on a supporting substrate formed of, for example, high-resistance Si (silicon), and a thin layer (silicon layer, SOI layer) mainly containing Si (silicon) is formed on the BOX film. When MISFETs (Metal Insulator Semiconductor Field Effect Transistors: MIS-type field-effect transistors) are formed on the SOI substrate, short-channel characteristics can be suppressed without doping an impurity into a channel layer. As a result, mobility can be improved, and element variations caused by impurity fluctuation can be improved. Therefore, when a semiconductor device is manufactured by the SOI substrate, improvement in the integration density and operation speed of the semiconductor device and improvement in operation margins by variation reduction can be expected.

Japanese Patent Application Laid-Open Publication No. 2006-190821 (Patent Document 1) describes that source/drain regions of a MOSFET (Metal Oxide Semiconductor Field Effect Transistor) on a silicon substrate are formed by a first epitaxial growth layer and a second epitaxial growth layer, the second epitaxial growth layer being formed so as to run on an isolation region.

Japanese Patent Application Laid-Open Publication No. 2006-190823 (Patent Document 2) describes a structure in which an epitaxial growth layer constituting source/drain regions of a MOSFET on a silicon substrate is formed so as to be placed on an isolation region.

Japanese Patent Application Laid-Open Publication No. 2009-094369 (Patent Document 3) describes providing an SOI region and a bulk region on a silicon substrate and forming MISFETs in the regions.

Japanese Patent Application Laid-Open Publication No. 2008-270473 (Patent Document 4) describes forming an SRAM (Static Random Access Memory) on an SOI substrate.

SUMMARY

If source/drain regions of a MISFET are formed in an active region of an SOI substrate and if contact plugs are to be connected to the upper surfaces of the source/drain regions, the formation positions of the contact plugs may be misaligned from above the SOI layer to an isolation region side. In this case, if the contact plug reaches a supporting substrate, the MISFET and the supporting substrate are conducted to each other, and there is a problem that the MISFET does not normally operate.

Moreover, upon siliciding of an epitaxial layer on an SOI layer, if the SOI layer is silicided from a lateral direction, the resistance of the MISFET is increased since the width of the SOI layer is reduced, and the MISFET may not normally operate.

The above-mentioned problems become more notable as miniaturization of the semiconductor devices advances.

The above and other preferred aims and novel characteristics of the present invention will be apparent from the description of the present specification and the accompanying drawings.

The typical ones of the inventions disclosed in the present application will be briefly described as follows.

In a semiconductor device of an embodiment, ends of an upper surface of an isolation region adjacent to an SOI layer are covered with an epitaxial layer formed on the SOI layer of an upper portion of an SOI substrate.

In a method of manufacturing the semiconductor device of the embodiment, the ends of the upper surface of the isolation region adjacent to the SOI layer are covered with an epitaxial layer formed on the SOI layer of an upper portion of the SOI substrate.

According to the embodiment disclosed in the present application, the reliability of the semiconductor device can be improved. Particularly, malfunction of the semiconductor device can be prevented.

Moreover, according to the embodiment disclosed in the present application, the performance of the semiconductor device can be improved. Particularly, the resistance of the semiconductor device can be reduced.

BRIEF DESCRIPTIONS OF THE DRAWINGS

DETAILED DESCRIPTION

Hereinafter, embodiments of the present invention will be described in detail with reference to the accompanying drawings. Note that components having the same function are denoted by the same reference symbols throughout the drawings for describing the embodiment, and the repetitive description thereof will be omitted.

First Embodiment

In a first embodiment, regarding formation of semiconductor elements on an SOI substrate, preventing contact plugs, which are connected to the elements, from being connected to a supporting substrate will be described below. Moreover, preventing reduction of the width of an SOI layer on a BOX film will be described below.

First, manufacturing steps of isolation regions and MIS-type field-effect transistors (hereinafter, simply referred to as MISFETs) on an SOI substrate according to the present embodiment will be described with reference to the drawings. FIG. 1 to FIG. 30 are cross-sectional views taken during manufacturing steps of a semiconductor device that is the present embodiment, in other words, n-channel-type and p-channel-type MISFETs formed on the SOI substrate and a bulk silicon substrate.

Figure 1:
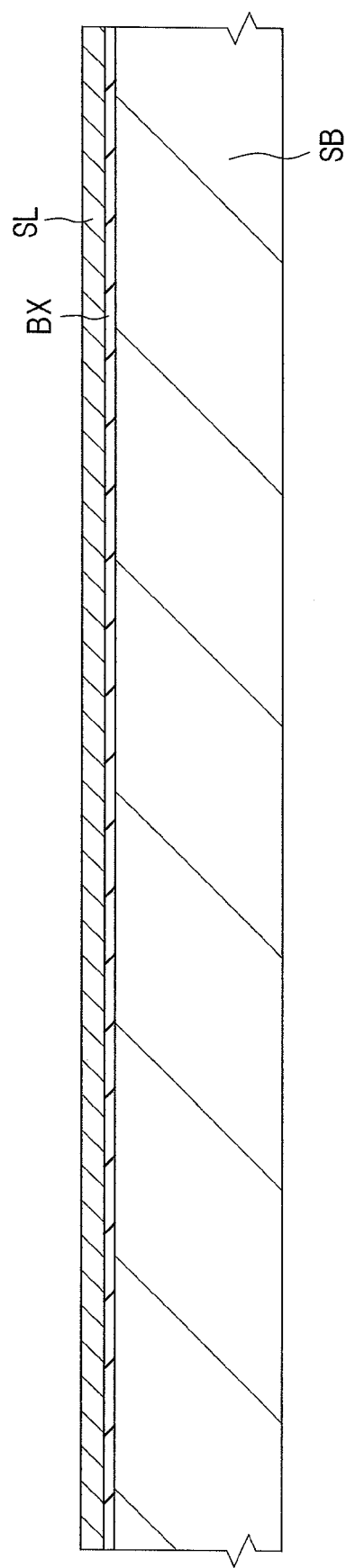
FIG. 1 is a cross-sectional view showing a method of manufacturing a semiconductor device of a first embodiment of the present invention.

First, as shown in FIG. 1, a semiconductor substrate SB on which a BOX film BX and an SOI layer (silicon layer) SL are stacked is prepared. The semiconductor substrate SB is a supporting substrate formed of Si (silicon). The BOX film BX, in other words, a first insulating film on the semiconductor substrate SB is a silicon oxide film. The SOI layer SL serving as a first semiconductor layer on the BOX film BX is a layer formed of single-crystal silicon having a resistance of about 1 to 10 Ωcm.

In the present application, the semiconductor substrate SB serving as the supporting substrate, the box film BX serving as a buried oxide film on the semiconductor substrate SB, and the SOI layer SL on the BOX film BX will be collectively referred to as an SOI substrate. Also, the semiconductor substrate SB exposed from the BOX film BX and the SOI layer SL in a later-described step will be referred to as a bulk silicon substrate. Also, a region in which the upper surface of the semiconductor substrate SB is covered with the BOX film BX and the SOI layer SL will be referred to as an SOI region, and a region in which the upper surface of the semiconductor substrate SB is exposed from the BOX film BX and the SOI layer SL and which is a region in which a semiconductor element is formed will be referred to as a bulk region.

The SOI substrate is composed of the semiconductor substrate SB, the BOX film BX, and the SOI layer SL can be formed by the following procedure. The SOI substrate can be formed by a SIMOX (Silicon Implanted Oxide) method, wherein, first, $O_2$ (oxygen) is ion-implanted into a main surface of the semiconductor substrate SB, which is formed of Si (silicon) by high energy, and Si (silicon) and oxygen are bonded to each other in a thermal treatment thereafter to form a buried oxide film (BOX film) at a position slightly deeper level than the surface of the semiconductor substrate.

The SOI substrate can be also formed by bonding and pasting the semiconductor substrate SB having an oxide film formed on the surface thereof and another semiconductor substrate formed of Si (silicon) with each other by applying high temperature and pressure and then polishing the silicon layer in one side to reduce the thickness thereof.

Herein, the crystal orientation of the SOI layer SL and the semiconductor substrate SB is (100), and the direction of a channel is (hereinafter, simply referred to as a channel orientation) is 45 degrees, i.e., <100>. It is conceivable that the channel orientation may be, for example, 0 degree or 45 degrees. However, in this case, the channel orientation is 45 degrees instead of 0 degree. This is for forming an epitaxial layer, which is to be formed in a later step, at a larger width. The direction of the channel referred to herein, in other words, the channel orientation is the direction between a pair of source and drain (source/drain) regions composing a MISFET formed on the semiconductor substrate SB. Thus, the channel orientation is the direction of the current which flows in the channel between the source region and the drain region.

Figure 2:
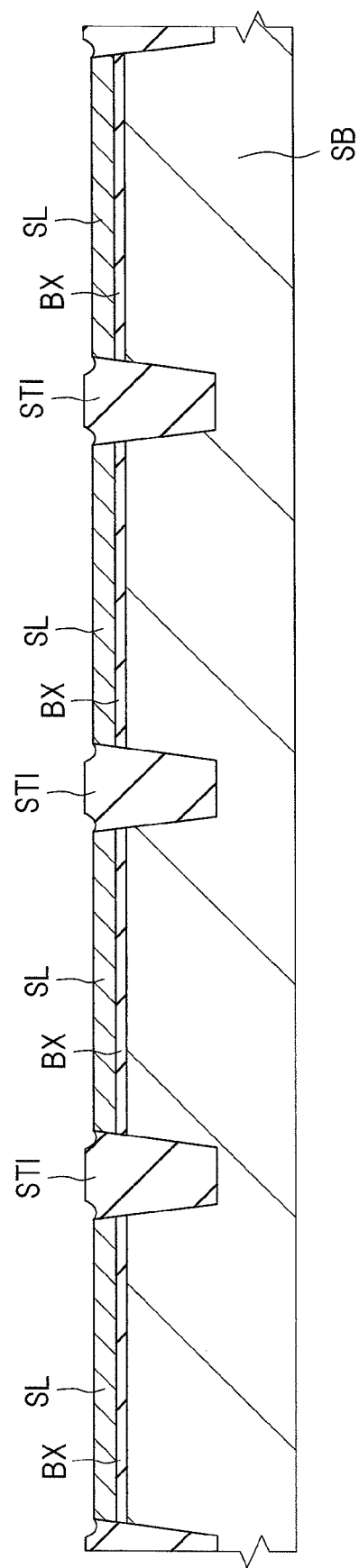
FIG. 2 is a cross-sectional view showing the method of manufacturing a semiconductor device continued from FIG. 1.

Then, as shown in FIG. 2, by a known method, isolation regions STI formed of an insulating film having an STI (Shallow Trench Isolation) structure are formed on the semiconductor substrate SB. In a step of forming the isolation regions STI, first, for example, a hard mask pattern (not shown) formed of an insulating film is formed on the SOI layer SL, and dry etching is carried out while using the hard mask pattern as a mask, thereby forming a plurality of trenches, which reach an intermediate depth of the semiconductor substrate SB from the upper surface of the SOI layer SL. The trenches are formed by forming openings in the SOI layer SL, the BOX film BX, and the semiconductor substrate SB.

Then, a liner oxide film is formed by thermally oxidizing Si (silicon) exposed inside the trenches, the interiors of the trenches are subsequently completely buried with a silicon oxide film formed by a CVD. Then, the upper surface of the silicon oxide film is polished by, for example, CMP (Chemical Mechanical Polishing). Then, the hard mask is removed. As a result, the isolation regions STI mainly including the silicon oxide film are formed. The isolation regions STI are inactive regions, which mutually separate a plurality of active regions on the semiconductor substrate SB. Thus, the planar-view shapes of the SOI layer SL or the semiconductor substrate SB separated by the isolation regions STI, in other words, the active regions are defined by being surrounded by the isolation regions STI.

In FIGS. 3 to 5, FIGS. 7 to 10, FIG. 12, FIG. 15, FIGS. 17 to 22, FIG. 24, and FIG. 26 used in the following description, an SOI region 1A is shown on the left side of the drawings, and a bulk region 1B is shown on the right side of the drawings. MISFETs formed in the SOI region will be referred to as SOI-MISFETs, and MISFETs formed in the bulk region will be referred to as bulk-MISFETs. The plurality of isolation regions STI are formed so as to mutually separate the regions of the SOI region 1A, the bulk region 1B, and a back gate contact region 1C. In each of the SOI region 1A and the bulk region 1B, the plurality of isolation regions STI are formed so as to separate the regions in which elements are to be formed.

Figure 6:
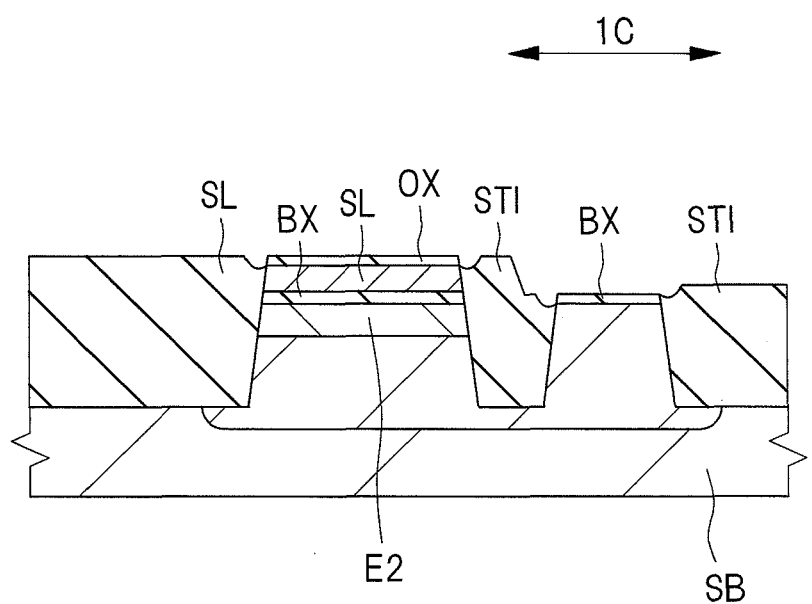
FIG. 6 is a cross-sectional view showing the method of manufacturing a semiconductor device continued from FIG. 5.

FIG. 6 is a cross-sectional view of the semiconductor device in a manufacturing step and shows the back gate contact region 1C. FIG. 11, FIG. 14, FIG. 25, and FIG. 28 are plan views of the semiconductor device in manufacturing steps. FIG. 13, FIG. 16, FIG. 23, FIG. 27, FIG. 29, and FIG. 30 are cross-sectional views of the semiconductor device in manufacturing steps.

Figure 3:
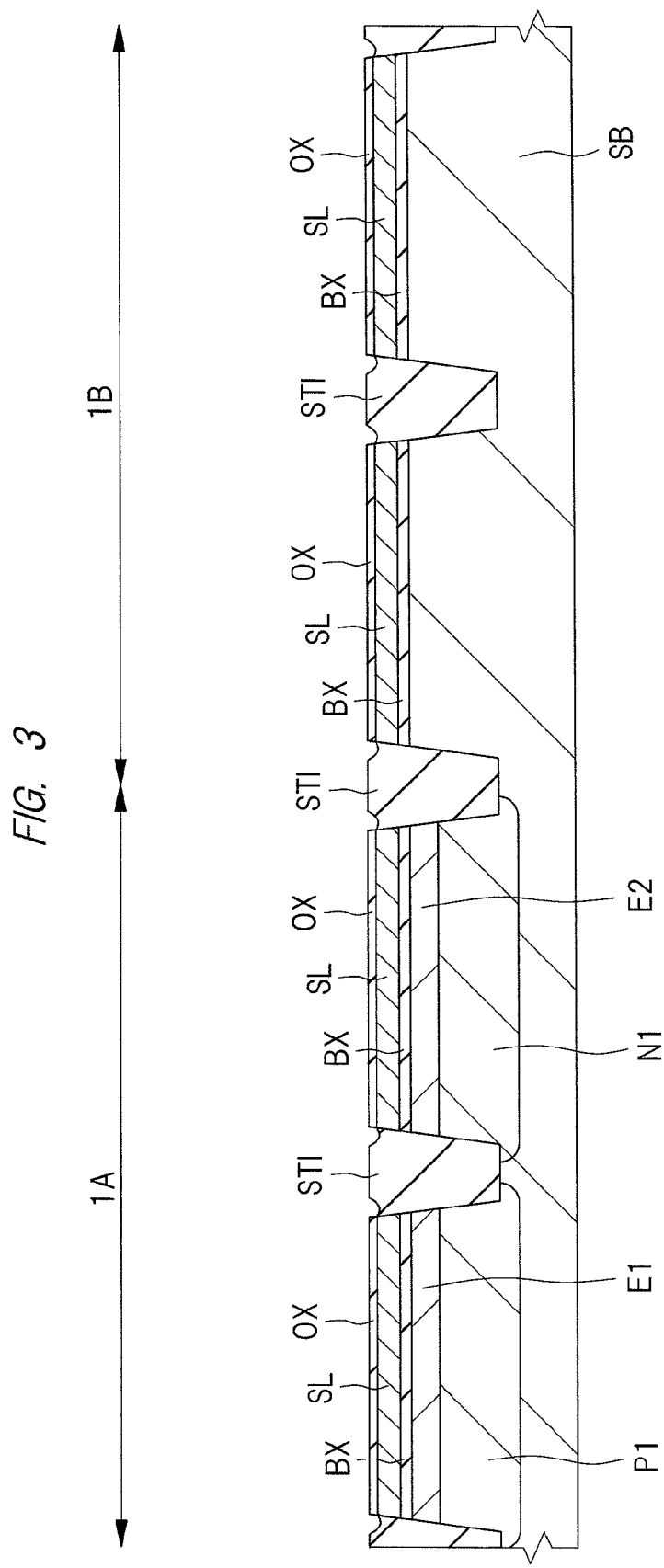
FIG. 3 is a cross-sectional view showing the method of manufacturing a semiconductor device continued from FIG. 2.

Then, as shown in FIG. 3, an insulating film OX formed of a silicon oxide film is formed on the upper surface of the SOI layer by thermal oxidation. The insulating film OX formed of the hard mask covering the upper surface of the SOI layer SL may be formed by remaining part of the hard mask formed of the above-described insulating film.

Then, in the SOI region 1A in which insulating-film SOI-MISFETs are to be formed, a p-type well P1 and a threshold-voltage control diffusion region E1 are selectively formed in desired regions of the semiconductor substrate SB by ion implantation via the thin insulating film OX, the thin SOI layer SL, and the thin BOX film BX by lithography techniques. Subsequently, similarly, an n-type well N1 and a threshold-voltage control diffusion region E2 are selectively formed in desired regions of the semiconductor substrate SB.

Figure 4:
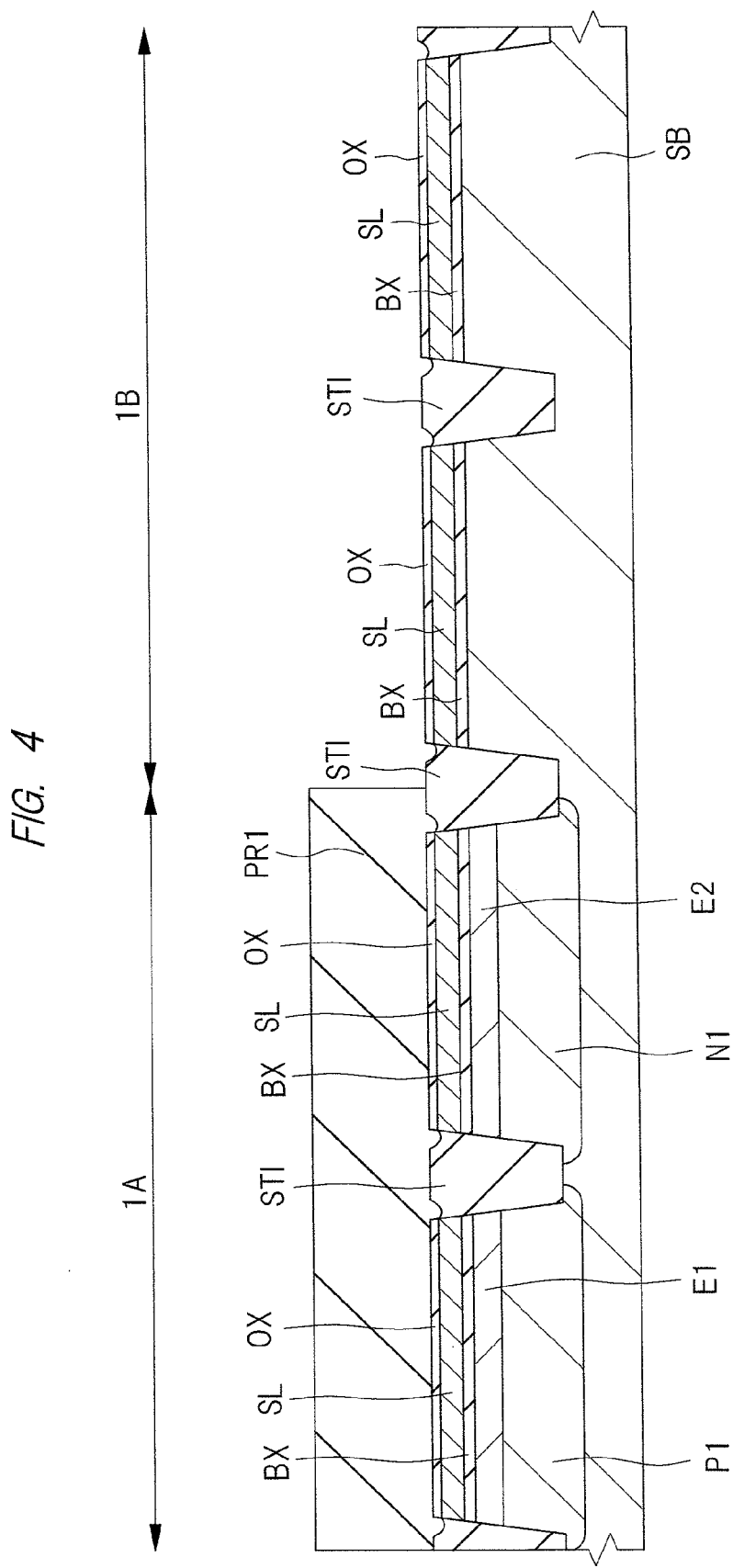
FIG. 4 is a cross-sectional view showing the method of manufacturing a semiconductor device continued from FIG. 3.

Subsequently, as shown in FIG. 4, a photoresist pattern PR1 is formed in the SOI region 1A in which SOI-MISFETs are to be formed. Specifically, a photoresist film is applied on the SOI substrate, and the photoresist pattern PR1 which is open in the bulk region 1B, in which bulk-MISFETs are to be formed, and in the back gate contact region 1C (see FIG. 6), in which a back gate contact is to be formed, is formed by lithography techniques.

The back gate contact refers to formation of a conductor film electrically connected to the semiconductor substrate SB in order to supply electricity to the semiconductor substrate SB and carry out modulation of the channels of the SOI layer SL below elements via the BOX film BX in a case in which the elements are formed in the SOI region 1A. In this process, the photoresist pattern PR1 is formed so as to cover the isolation region STI at the boundary between the SOI region 1A and the bulk region 1B and the isolation region STI at the boundary between the SOI region 1A and the back gate contact region 1C (see FIG. 6). Thus, the SOI region 1A is covered with the photoresist pattern PR1.

Figure 5:
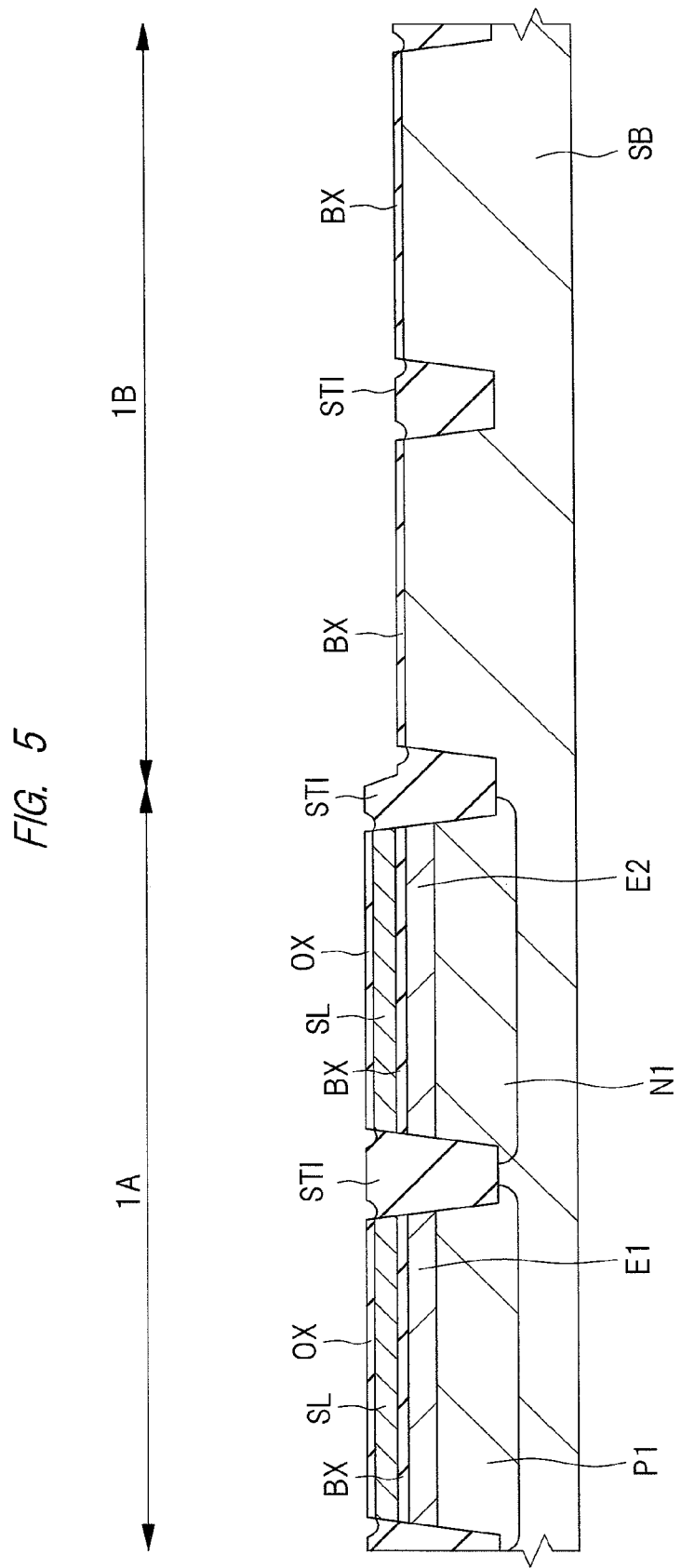
FIG. 5 is a cross-sectional view showing the method of manufacturing a semiconductor device continued from FIG. 4.

Subsequently, as shown in FIG. 5 and FIG. 6, the insulating film OX of the bulk region 1B and the back gate contact region 1C, which are open, is removed by, for example, hydrofluoric-acid cleaning. In this process, part of the upper part of the isolation regions STI of the bulk region 1B formed of the silicon oxide film is also removed, and unevenness between the semiconductor substrate SB and the isolation regions STI can be adjusted in the bulk region 1B, and unevenness on STI generated at the photoresist pattern PR1 can be smoothened. Then, after the SOI layer SL is selectively removed while using the BOX film BX as a stopper, for example, by dry etching techniques, the photoresist pattern PR1 is removed.

Then, if needed, for example, after the BOX film BX on the semiconductor substrate SB of the bulk region 1B is removed by hydrofluoric-acid cleaning, the surface of the semiconductor substrate SB may be oxidized by about 10 nm by thermal oxidation, and a damage layer, which has been introduced into the semiconductor substrate SB by dry etching used for removing the SOI layer SL, may be removed by sacrifice oxidation, which removes the formed silicon oxide film. Then, the state which is the same as that of FIG. 5 and FIG. 6 is reproduced, for example, by forming a thin silicon oxide film of about 10 nm on the semiconductor substrate SB again by thermal oxidation.

In the bulk region 1B and the back gate contact region 1C formed through the above steps, the unevenness between the surface of the semiconductor substrate SB and the surface of the SOI layer SL in the SOI region 1A is as small as about 20 nm. This enables formation of SOI-MISFETs and bulk-MISFETs in the same step in deposition and processing of a polysilicon film, which later serves as gates, and this is effective for, for example, prevention of unprocessed uneven portions or gate disconnection.

Figure 7:
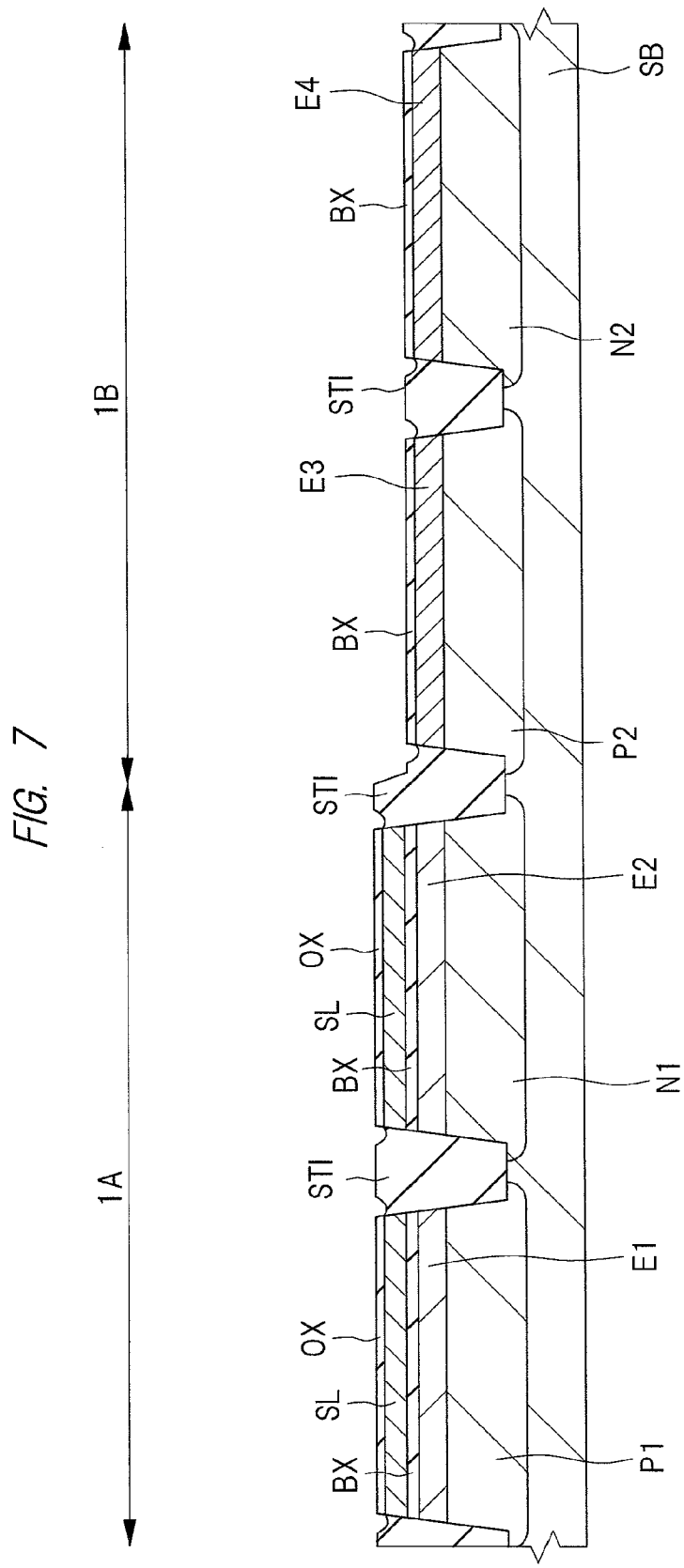
FIG. 7 is a cross-sectional view showing the method of manufacturing a semiconductor device continued from FIG. 6.

Subsequently, as shown in FIG. 7, in the bulk region 1B, a p-type well P2 and a threshold-voltage control diffusion region E3 are selectively formed in desired regions of the semiconductor substrate SB by lithography techniques and ion implantation via the thin BOX film BX. Subsequently, similarly, an n-type well N2 and a threshold-voltage control diffusion region E4 are selectively in desired regions of the semiconductor substrate SB.

Figure 8:
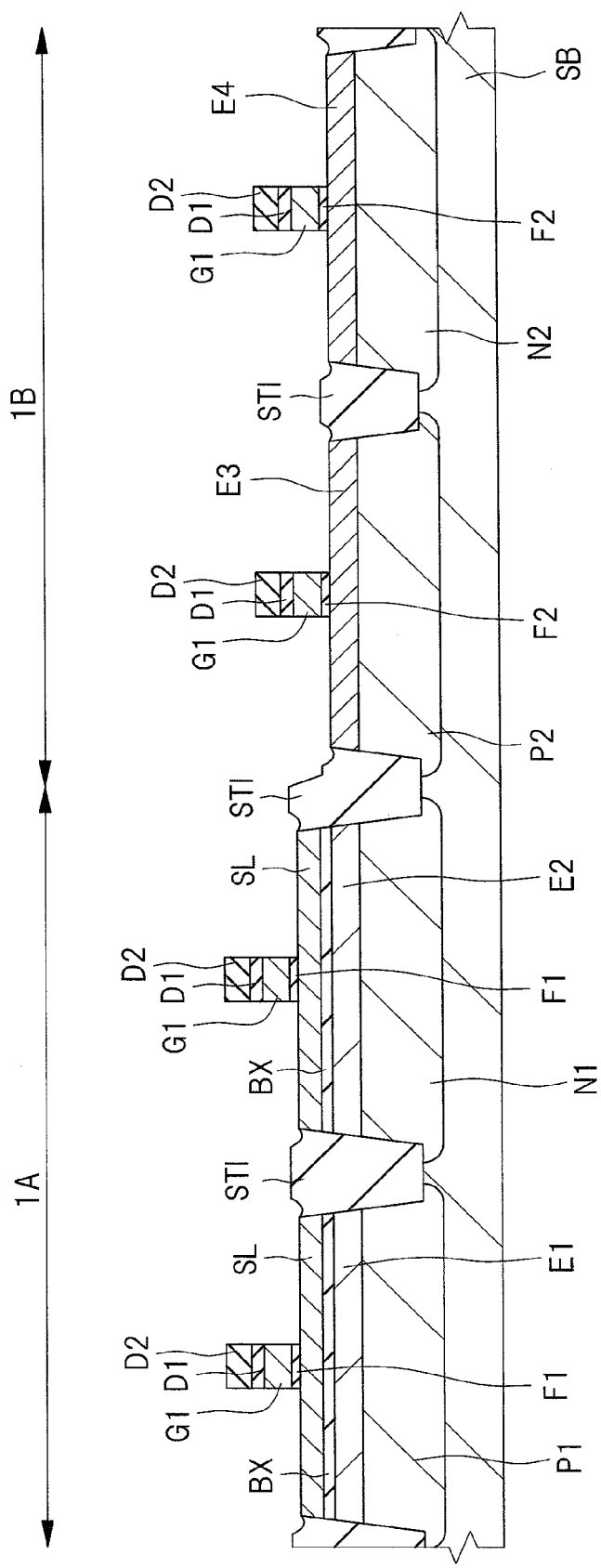
FIG. 8 is a cross-sectional view showing the method of manufacturing a semiconductor device continued from FIG. 7.

Subsequently, as shown in FIG. 8, a gate insulating film F1 of SOI-MISFETs is formed in the SOI region 1A, and a gate insulating film F2 of bulk-MISFETs is formed in the bulk region 1B. Then, for example, a polysilicon film G1 having a thickness of 40 nm, a silicon oxide film D1 having a thickness of 50 nm, and a silicon nitride film D2 having a thickness of 30 nm are sequentially stacked by CVD; and gate electrodes composed of the polysilicon film G1 and a gate protective film composed of the silicon oxide film D1 and the silicon nitride film D2 are formed by lithography techniques and anisotropic dry etching. In FIG. 8 and the cross-sectional views used below, the film thickness of the silicon oxide film D1 is shown to be thin in order to facilitate understanding of the drawings, wherein the magnitude relations of the film thicknesses of the polysilicon film G1, the silicon oxide film D1, and the silicon nitride film D2 as described above are not precisely shown.

The gate insulating film F1 of the SOI-MISFETs in the SOI region 1A and the gate insulating film F2 of the bulk-MISFETs in the bulk region 1B are specifically formed in the following manner. First, the BOX film BX exposed on the surface in the bulk region 1B is removed, for example, by hydrofluoric-acid cleaning to expose the surface of the semiconductor substrate SB. Subsequently, for example, a thermally-oxidized film of 7.5 nm is formed on the semiconductor substrate SB by thermal oxidation.

In this process, similarly in the SOI region 1A, the insulating film OX exposed on the surface is removed, and a thermally-oxidized film having a thickness of 7.5 nm is formed on the SOI layer SL. This is selectively removed, for example, by lithography techniques and hydrofluoric-acid cleaning. Then, cleaning is carried out for removing etching residues, an etching solution, etc., and a thermally-oxidized film having a thickness of 1.9 nm is formed on the SOI layer SL, for example, by thermal oxidation.

A nitride film of 0.2 nm is formed to be laminated on a main surface by nitriding the surfaces of the thermally-oxidized film having a thickness of 7.5 nm and the thermally-oxidized film having a thickness of 1.9 nm with an NO gas; and an insulating film formed on the SOI layer SL serves as the gate insulating film F1, and an insulating film formed on the semiconductor substrate SB serves as the gate insulating film F2. Then, as described above, the polysilicon film G1, the silicon oxide film D1, and the silicon nitride film D2 are formed.

In this manner, the gate insulating film F2 of the bulk-MISFETs is formed to be thicker than the gate insulating film F1 of the SOI-MISFETs. Thus, the withstand voltage of the bulk-MISFETs can be increased, enabling high-voltage operations.

In the present embodiment, since the unevenness between the SO region 1A and the bulk region 1B is as small as about 20 nm as described above, this is within an allowable range of a focal depth upon lithography, and both of the regions can be simultaneously formed.

Figure 9:
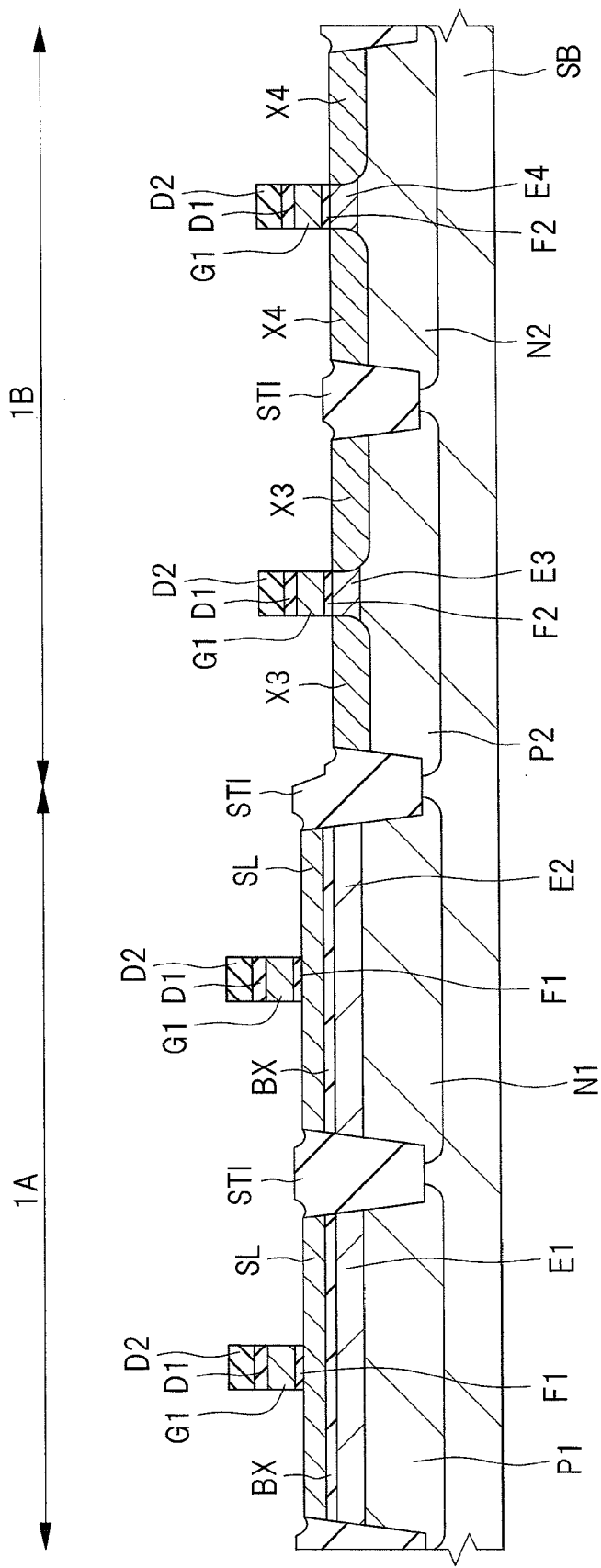
FIG. 9 is a cross-sectional view showing the method of manufacturing a semiconductor device continued from FIG. 8.

Then, as shown in FIG. 9, for example, As (arsenic) ions are ion-implanted into the n-type bulk-MISFETs, and, for example, $BF_2$ ions are ion-implanted into the p-type bulk-MISFETs by lithography techniques by acceleration energy of 45 keV under conditions of implantation amounts of $3\times10^{13}/cm^2$ and $5\times10^{13}/cm^2$, respectively. In this process, the silicon nitride film D2 and the silicon oxide film D1 serving as the gate protective films prevent the impurities from being implanted into the polysilicon film G1, which is to serve as gate electrodes, and channel regions below gates, a shallow n-type diffusion layer (hereinafter, referred to as an extension layer) X3 and a shallow p-type diffusion layer (also, referred to as an extension layer) X4 are formed in surface regions of the semiconductor substrate SB in a self-aligned manner. In this ion implantation, the SOI region 1A is protected by the photoresist film (not shown), and the impurities are not implanted thereinto.

Figure 10:
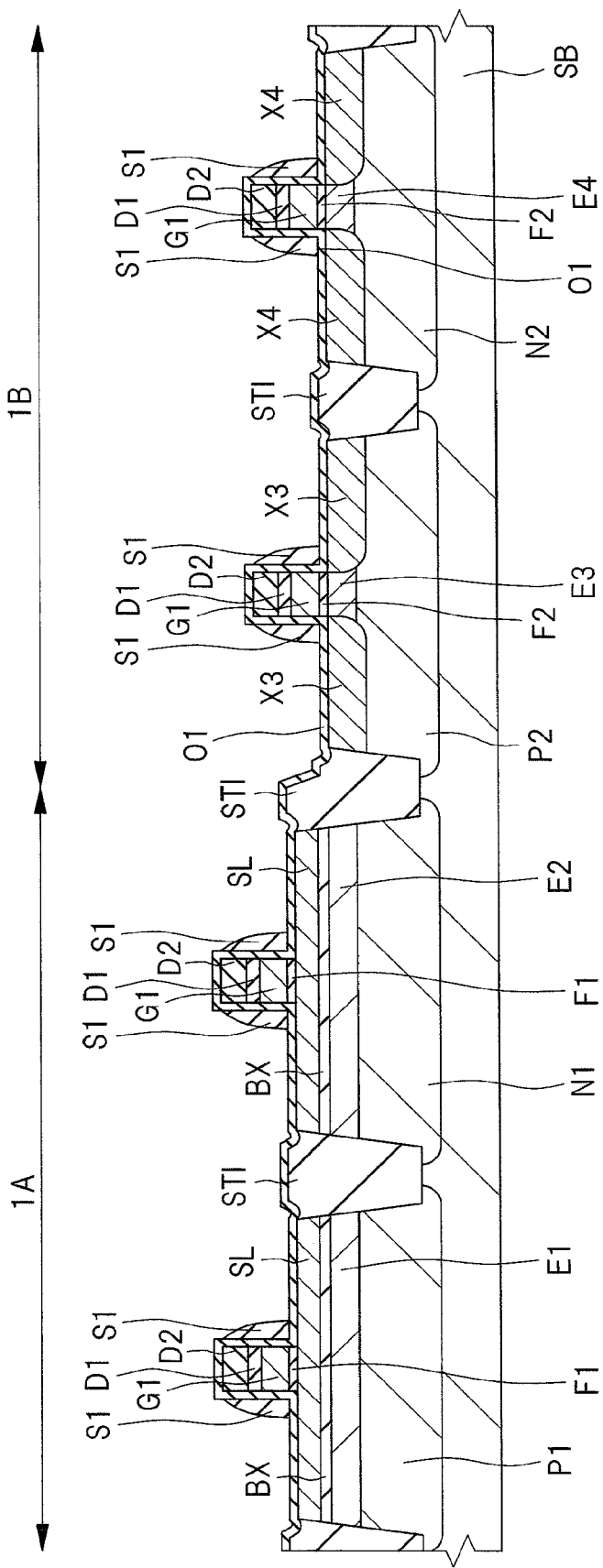
FIG. 10 is a cross-sectional view showing the method of manufacturing a semiconductor device continued from FIG. 9.

Subsequently, as shown in FIG. 10, a silicon oxide film O1 having a thickness of 10 nm and a silicon nitride film having a thickness of 40 nm are sequentially deposited, for example, by CVD, and the silicon nitride film is selectively subjected to anisotropic etching while using the silicon oxide film O1 as a stopper, thereby forming sidewalls S1 formed of the silicon nitride film. In the present method, the thin SOI layer SL is protected by the silicon oxide film O1;

therefore, reduction of the film thickness thereof and introduction of damage caused by dry etching can be prevented.

Figure 11:
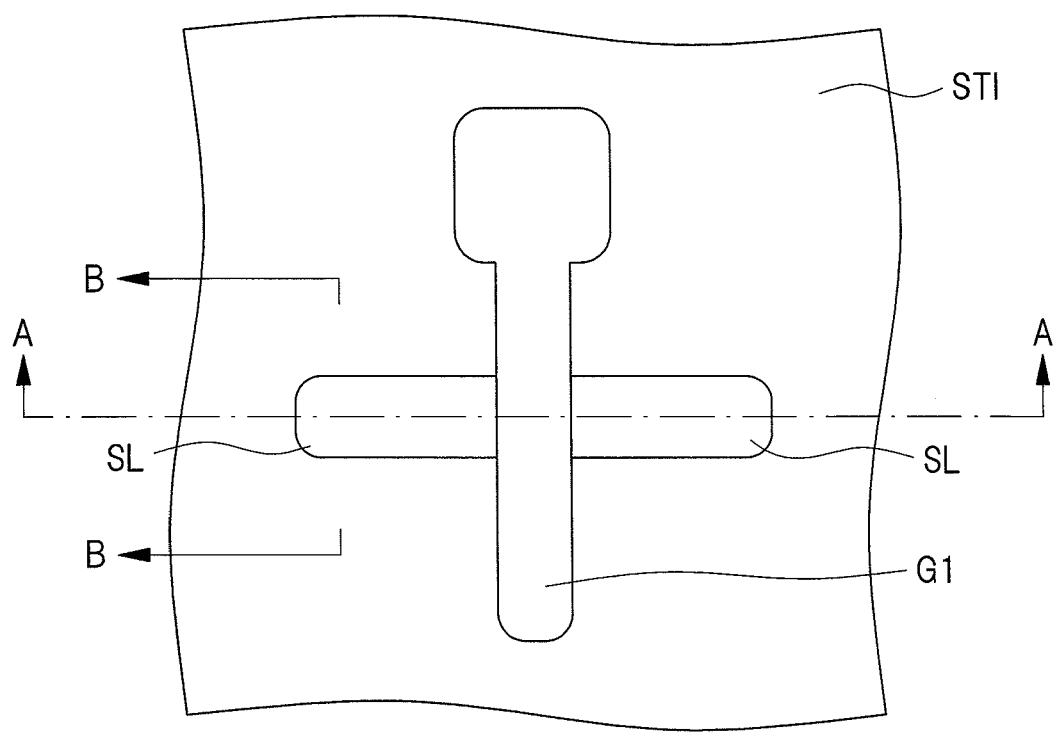
FIG. 11 is a plan view showing the method of manufacturing a semiconductor device continued from FIG. 10.
Figure 12:
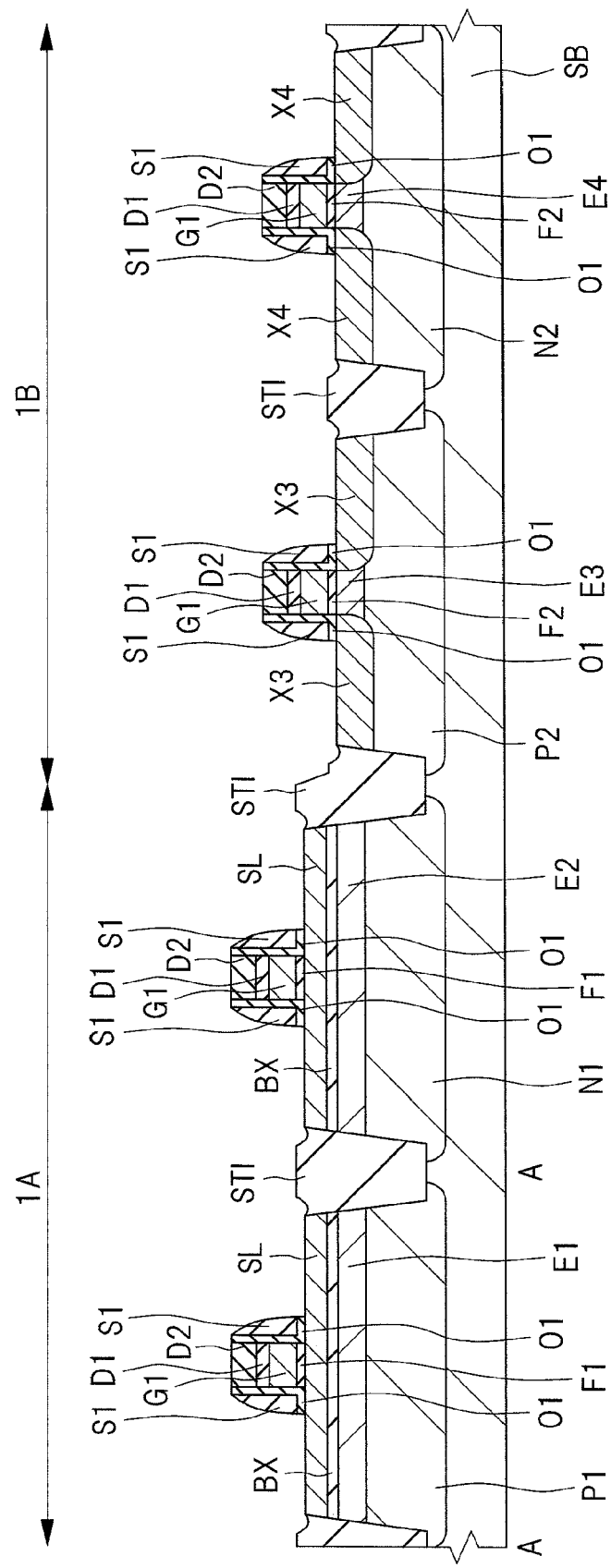
FIG. 12 is a cross-sectional view showing the method of manufacturing a semiconductor device continued from FIG. 10.
Figure 13:
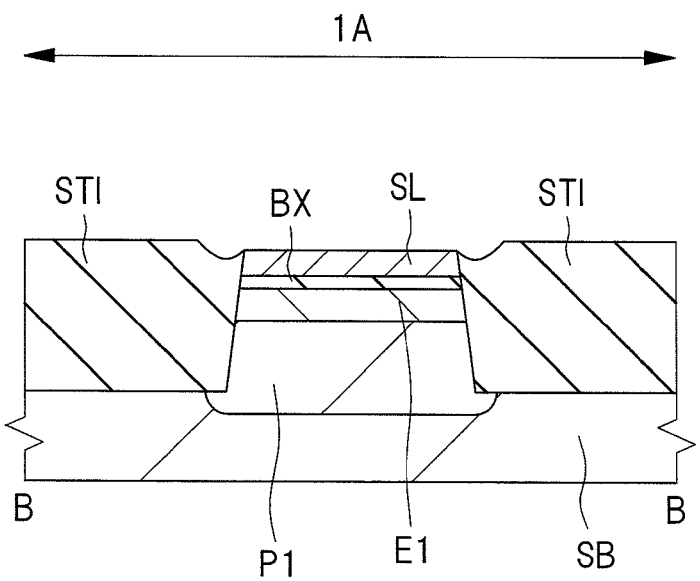
FIG. 13 is a cross-sectional view showing the method of manufacturing a semiconductor device continued from FIG. 10.

Subsequently, as shown in FIG. 11, FIG. 12, and FIG. 13, the exposed silicon oxide film O1 is removed, for example, by hydrofluoric-acid cleaning to expose the SOI layer SL of the SOI-MISFETs and the semiconductor substrate SB of the bulk-MISFETs, which are to serve as source/drain regions. The cross-sectional view of FIG. 12 of the formation region of the n-type MISFET in the left side of the SOI region 1A is the cross-sectional view at a line A-A of the plan view of FIG. 11. FIG. 13 is a cross-sectional view at a line B-B of FIG. 11. In other words, FIG. 12 is a cross-sectional view along the gate-length direction of the MISFET, and FIG. 13 is a cross-sectional view along the gate-width direction of the MISFET, in other words, the longitudinal direction of the gate electrode and shows a cross section of an active region sandwiched by the isolation regions STI.

If needed, CDE (Chemical Dry Etching) may be carried out in order to remove damage layers of the surfaces of the SOI layer SL and the semiconductor substrate SB introduced by, for example, ion implantation or dry etching. Then, the semiconductor substrate SB is cleaned in order to remove etching residues, etc.

As shown in FIG. 11, the polysilicon film G1 is extending in a first direction along the semiconductor substrate SB (see FIG. 12), and, at one end of the same direction, in other words, the gate-width direction, an electricity supplying region for connecting a contact plug to the polysilicon film G1, which is to serve as a gate electrode later, is formed. The electricity supplying region is formed of the polysilicon film G1 and has a larger width than that of the gate electrode in a second direction orthogonal to the first direction, in other words, in the gate-length direction of the gate electrode, which is to be formed later. The electricity supplying region is disposed immediately above the isolation region STI instead of the active region.

The SOI layer SL which is surrounded by the isolation regions STI and has an upper surface exposed from the isolation regions STI is an active region and is extending in the second direction so as to intersect with the extending direction of the polysilicon film G1 in a plan view. As shown in FIG. 13, the width of the upper surface of the SOI layer SL in the gate-width direction is extremely small compared with the width of the SOI layer SL in the gate-length direction.

In the present embodiment, as shown in FIG. 11 and FIG. 13, structures in the manufacturing process of an n-channel-type SOI-MIFET are shown in drawings and explained as an example of the elements formed on the semiconductor substrate SB.

Figure 14:
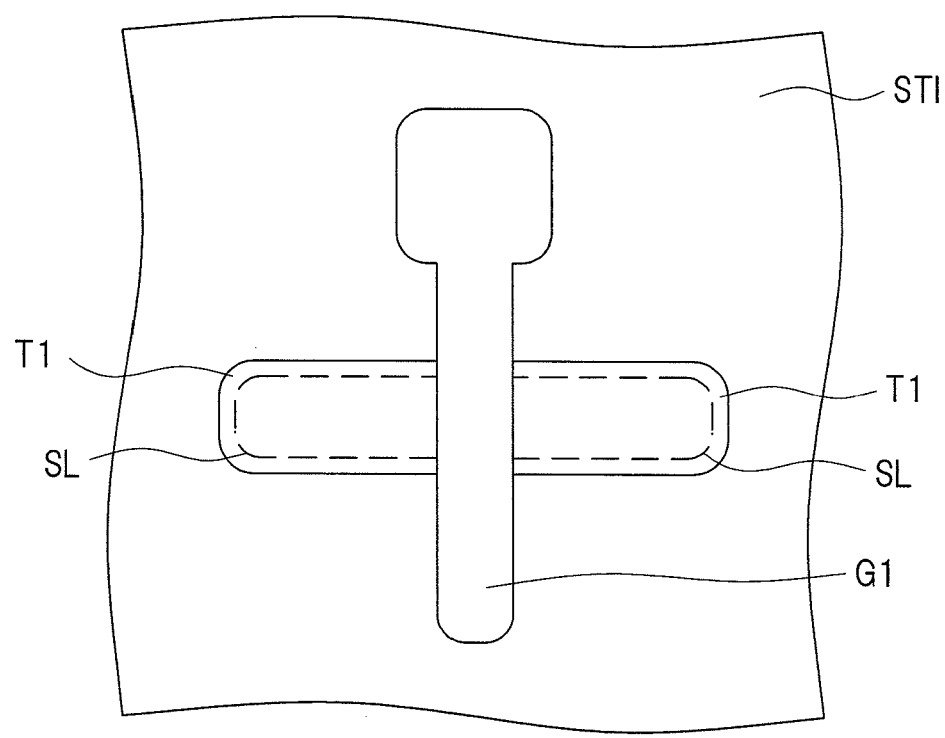
FIG. 14 is a plan view showing the method of manufacturing a semiconductor device continued from FIG. 11.
Figure 15:
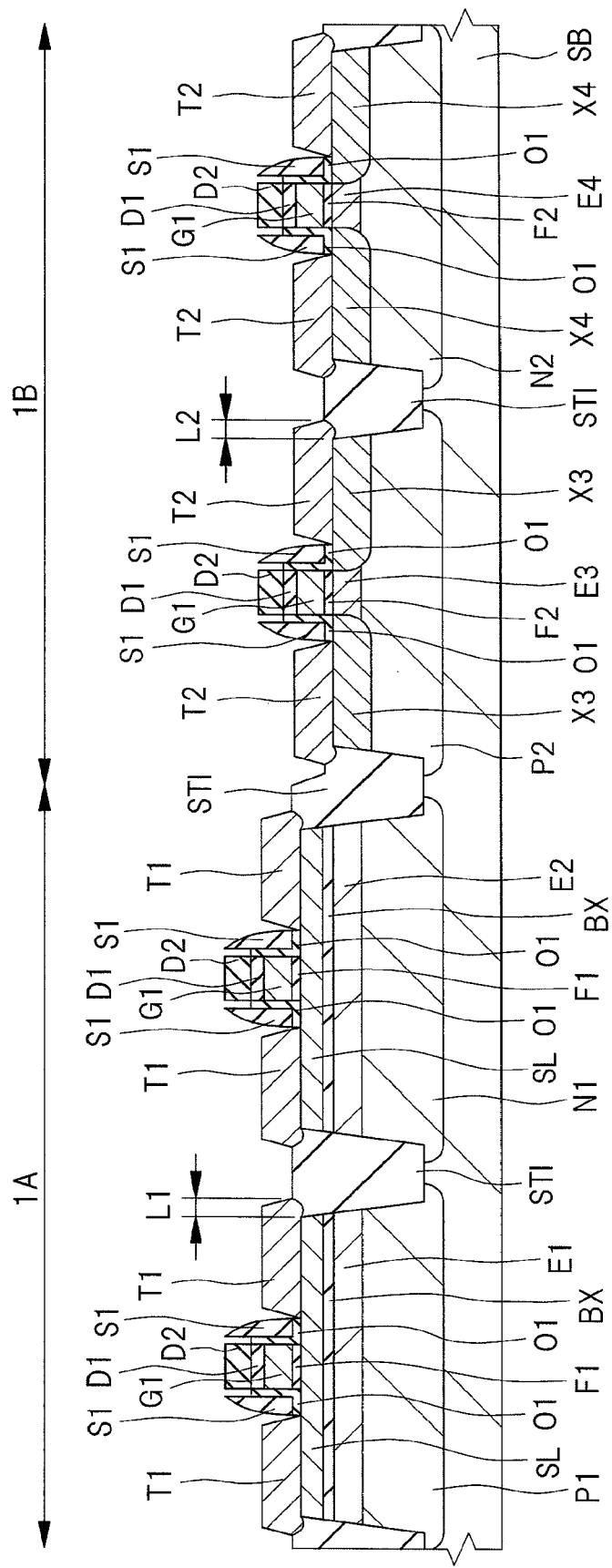
FIG. 15 is a cross-sectional view showing the method of manufacturing a semiconductor device continued from FIG. 11.
Figure 16:
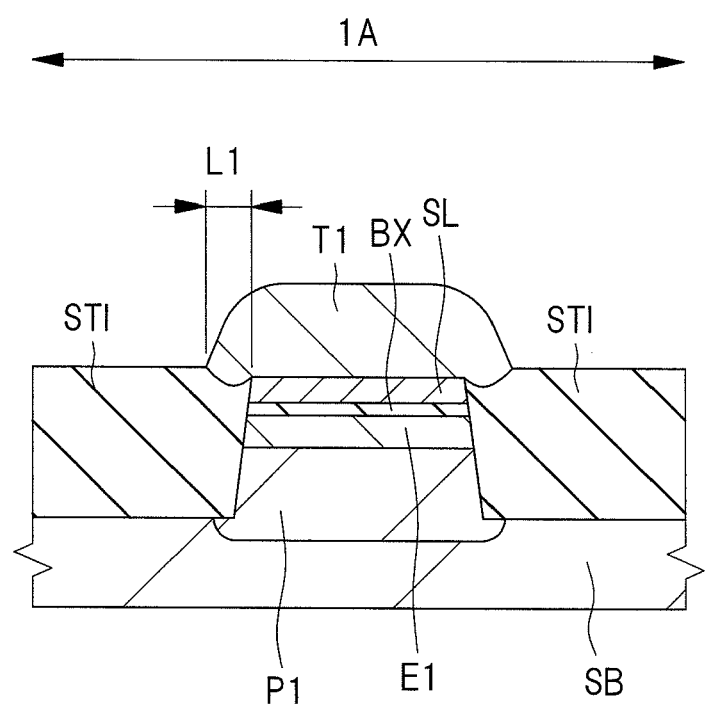
FIG. 16 is a cross-sectional view showing the method of manufacturing a semiconductor device continued from FIG. 11.

Then, as shown in FIG. 14, FIG. 15, and FIG. 16, a stacked single-crystal layer formed of silicon or silicon germanium is selectively formed on exposed single-crystal silicon (the SOI layer SL and the semiconductor substrate SB) by selective epitaxial growth. More specifically, by selective epitaxial growth, an epitaxial layer (stacked layer) T1 is formed on the SOI layer SL exposed in the SOI region 1A, and an epitaxial layer (stacked layer) T2 is formed on the semiconductor substrate SB exposed in the bulk region 1B. FIG. 11 and FIG. 14 are plan views showing mutually the same location, and FIG. 15 and FIG. 16 are cross-sectional views showing the same locations as the regions shown in FIG. 12 and FIG. 13, respectively.

The epitaxial growth is carried out by subjecting a boat on which a plurality of semiconductor substrates are disposed to treatment in a furnace serving as a reaction chamber by, for example, a batch-type epitaxial-growth apparatus. In this process, for example, a $SiH_4$ (silane) gas is supplied into the furnace as a film formation gas, and a chlorine-atom containing gas is supplied as an etching gas, thereby carrying out epitaxial growth treatment. For example, HCl (hydrochloric acid) gas or Cl (chlorine) gas can be used as the chlorine-atom containing gas, which is the etching gas.

The above-described film formation gas is a Si-atom containing gas, which mainly constitutes the epitaxial layers T1 and T2. The above-described etching gas is a gas used for preventing the upper surfaces of the isolation regions STI from covered with the excessively-formed epitaxial layers T1 and T2. In other words, by carrying out epitaxial growth and using the etching gas, the epitaxial layers T1 and T2 are prevented from being excessively largely formed.

In this process, in the selective epitaxial growth, a characteristic that the film thickness of the grown single-crystal semiconductor layer is different depending on the concentration of the impurity contained in single-crystal silicon serving as a base is utilized to provide a difference in the film thicknesses of the epitaxial layers T1 and T2 in the SOI region 1A and the bulk region 1B. In other words, the property that the higher the impurity concentration contained in the silicon layer serving as the base, the thinner the film thickness of the grown epitaxial film is utilized.

Since the extension layers X3 and X4 are formed in the semiconductor substrate SB serving as a base at the bulk-MISFETs, the impurity concentration of the SOI layer SL serving as the base in the SOI region 1A is low compared with the bulk region 1B. Therefore, as shown in FIG. 15, because of the above-described dependency of the epitaxial film thickness on the impurity concentration of the single-crystal silicon layer serving as the base, the film thickness of the epitaxial layer T1 of the SOI-MISFETs can be formed to be thicker than the film thickness of the epitaxial layer T2 of the bulk-MISFETs by one time of epitaxial growth. For example, the epitaxial layer T1 having a film thickness of 50 nm is formed for the SOI-MISFETs, and the epitaxial layer T2 having a film thickness of 30 nm is formed for the bulk-MISFETs. In the drawings, the difference in the film thicknesses of the epitaxial layers T1 and T2 is not shown.

In this process, as shown in FIG. 14, FIG. 15, and FIG. 16, the epitaxial layers T1 and T2 are formed so as to protrude from ends of the upper surface of the SOI layer SL to the isolation regions STI side adjacent to the ends. More specifically, the epitaxial layers T1 and T2 are formed not only immediately above the SOI layer SL, but at a large width so as to be placed on the upper surfaces of the isolation regions STI. Therefore, in the direction along the main surface of the semiconductor substrate SB, the widths of the epitaxial layers T1 and T2 are larger than the same-direction width of the SOI layer SL which is in contact therewith at the bottom surfaces thereof. In other words, in the gate-length direction and the gate-width direction, the widths of the epitaxial layers T1 and T2 are larger than the width of the SOI layer SL.

Thus, the epitaxial layers T1 and T2 are formed so as to be partially overlapped with the isolation regions STI in a plan view. In FIG. 14, the outline of the upper surface of the SOI layer SL covered with the epitaxial layer T1, in other words, the boundary between the SOI layer SL and the isolation region STI is shown by a broken line.

The present inventor has found out that the width of an epitaxial layer in the direction along the main surface of the semiconductor substrate, in other words, in the transverse direction is larger when the epitaxial layer is formed on the substrate in a case in which the channel orientation is 45 degrees, in other words, <100> than in a case in which the channel orientation is 0 degree, in other words, <110>. In this manner, the easiness of growth of the epitaxial layer in the transverse direction is changed depending on the channel orientation with respect to the silicon layer, which is the base.

In the present embodiment, in order to form the wide epitaxial layers T1 and T2 in the above-described manner, the semiconductor substrate SB and the SOI layer SL have a plane orientation of (100) and a channel orientation of <100>. As a result, further increase of the widths of the epitaxial layers T1 and T2 is enabled.

Moreover, the present embodiment employs a condition of epitaxial growth in which the selectivity of etching is reduced, for example, by reducing the amount of the etching gas supplied in the above-described epitaxial growth step. By virtue of this, the amounts of the epitaxial layers T1 and T2 removed by the etching gas is suppressed, and formation of the wide epitaxial layers in the above-described manner is enabled.

Moreover, in the present embodiment, the epitaxial layers T1 and T2 are further largely grown by extending the time to carry out the epitaxial growth. By virtue of this, formation of the wide epitaxial layers in the above-described manner is enabled.

As described above, the film thicknesses of the epitaxial layers are changed depending on the concentration of the impurity(ies) contained in the silicon layer, which is the base. By utilizing this, in the present embodiment, the impurity concentration of the upper surface of the SOI layer SL or the upper surface of the semiconductor substrate SBb are reduced, thereby increasing the film thicknesses of the epitaxial layers T1 and T2 formed on the upper surface, wherein extension of the epitaxial layers T1 and T2 in the transverse direction can be increased.

By the above-described method, the epitaxial layers T1 and T2 having wide transverse-direction widths are formed, and the epitaxial layers T1 and T2 are formed so as to be placed on the isolation regions STI. Specifically, in the direction along the main surface of the semiconductor substrate SB, the epitaxial layers T1 and T2 are formed to protrude from the end of the SOI layer SL or the semiconductor substrate SB serving as the base to the isolation region STI side by 5 nm or more.

Thus, in the direction along the main surface of the semiconductor substrate SB and in the direction orthogonal to the boundary between the SOI layer SL in the SOI region 1A and the isolation region STI, the distance L1 between the end of the epitaxial layer T1 in the vicinity of the boundary and the boundary is distant by 5 nm or more. Similarly, in the direction along the main surface of the semiconductor substrate SB and in the direction orthogonal to the boundary between the semiconductor substrate SB in the bulk region 1B and the isolation region STI, the distance between the end of the epitaxial layer T2 in the vicinity of the boundary and the boundary is distant by 5 nm or more.

In this case, the ends of the upper surface of the isolation regions STI have lower height compared with a center part of the upper surface of the isolation region STI and are concave. This is for a reason that, in the direction along the main surface of the semiconductor substrate SB, the density of the insulating film is sometimes lower in the ends of the isolation regions STI than in the center part of the isolation regions STI, and the upper surfaces of the ends are at the positions that are easily removed by etching in the step of forming the isolation regions STI. In the present embodiment, since the width of the epitaxial layer T1 is increased in the above-described manner, part of the epitaxial layer T1 buries the concaves of the ends of the upper surfaces of the isolation regions STI. Thus, in the gate-length direction and the gate-width direction, the concaves of the ends of the upper surfaces of the isolation regions STI are buried with the epitaxial layers T1 and T2.

Each of the concave upper surfaces is formed at a position lower than the upper surface of the SOI layer SL or the semiconductor substrate SB adjacent to the isolation region STI. In other words, the concave at the end of the upper surface of the isolation region STI is concave to the position lower than the upper surface of the SOI layer SL or the semiconductor substrate SB adjacent to the isolation region STI.

If the above-described concave at the end of the isolation region STI is large, the height of the upper surface of the end of the isolation region STI becomes lower than the height of the upper surface of the SOI layer SL, and it is conceivable that the sidewall of the SOI layer SL is exposed from the isolation region STI. In such a case, when epitaxial growth is carried out by the above-described step, the epitaxial layer T1 in contact with the exposed sidewall of the SOI layer SL is formed. In other words, the sidewall of the SOI layer SL is covered with the epitaxial layer T1.

Figure 17:
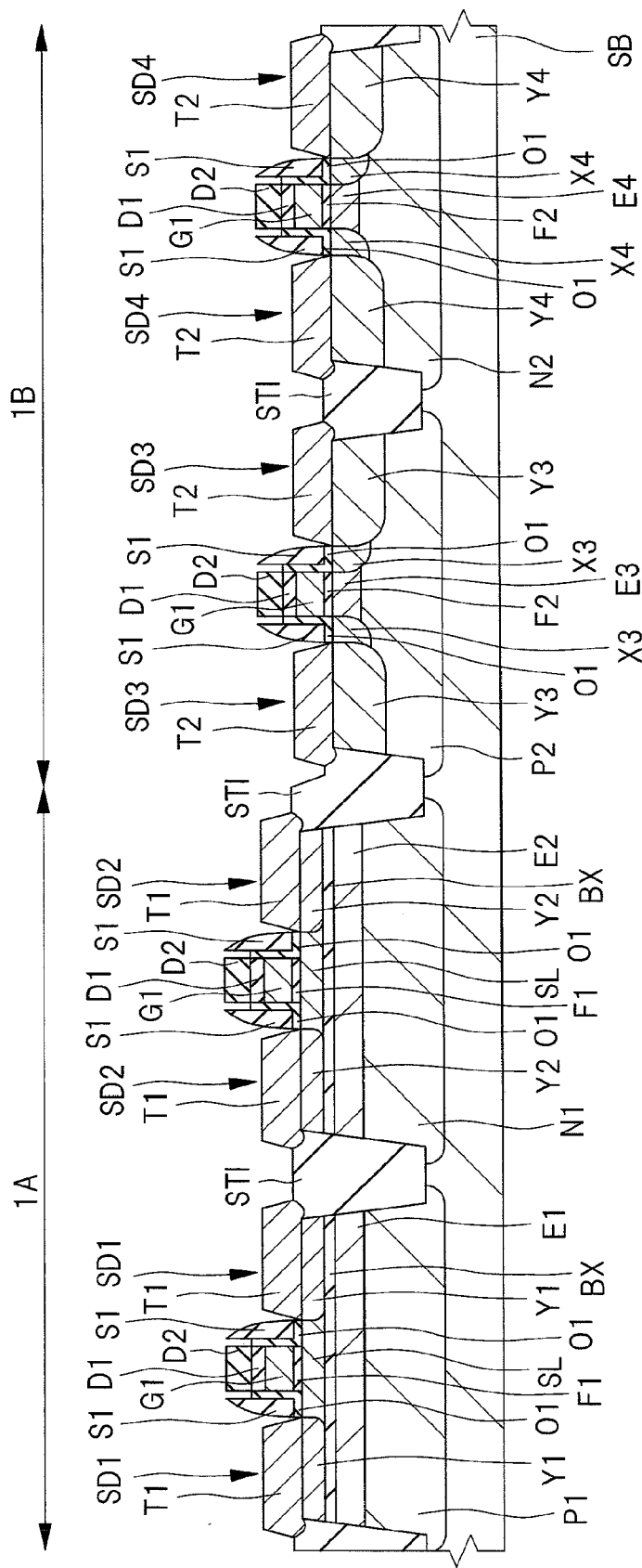
FIG. 17 is a cross-sectional view showing the method of manufacturing a semiconductor device continued from FIG. 14.

Then, as shown in FIG. 17, by lithography techniques, for example, As ions are ion-implanted into the n-type MISFET and the n-type bulk-MISFET under conditions of acceleration energy of 11 keV and an implantation amount of $4 \times 10^{15}/cm^2$. In this process, the silicon nitride film D2 and the silicon oxide film D1 serving as the gate protective films prevent impurities from being implanted into the polysilicon film G1, which is to serve as gate electrodes, and the channel regions below the gates, and an n-type diffusion layer SD1 of the SOI-MISFET and an n-type diffusion layer SD3 of the bulk-MISFET are formed in a self-aligned manner.

More specifically, at the n-type SOI-MISFET, the impurity is implanted into the epitaxial layer T1 and the SOI layer SL therebelow, and the n-type diffusion layer SD1 constituting source/drain regions is formed. In this process, the regions of the SOI layer SL constituting the n-type diffusion layer SD1 are formed as semiconductor regions Y1. Similarly, at the n-type bulk-MISFET, the impurity is implanted into the epitaxial layer T2 and the semiconductor substrate SB therebelow, and n-type diffusion layer SD3 constituting source/drain regions is formed. In this process, the regions of the semiconductor substrate SB constituting the n-type diffusion layer SD3 are formed as semiconductor regions Y3.

Moreover, although illustration is omitted, by additionally ion-implanting, for example, P (phosphorous) ions under the conditions of acceleration energy 12 keV and an implantation amount of $5 \times 10^{14}/cm^2$, diffusion-layer impurity compensation regions of the SOI-MISFETs may be formed also in the semiconductor substrate SB below the BOX film BX at the SOI-MISFETs. An object of this is to reduce the joint capacity of the diffusion layer constituting the source/drain regions and to compensate for the threshold-voltage diffusion regions E1, which have been subjected to implantation before, by implanting ions of the opposite conductivity type and form impurity compensation regions to cause it them to be close to intrinsic impurity regions.

The above ion implantation can be carried out in a common step for the SOI-MISFETs and the bulk-MISFETs by adjusting implantation conditions in order to simplify the process. In the present embodiment, as described above, the semiconductor regions Y1 and Y2 are formed by implanting the impurity ions into the SOI layer SL, and semiconductor regions X1 and X2 (see FIG. 19) are formed by further implanting impurity ions into the SOI layer SL in a later step; wherein, the SOI layer SL referred to in the present application refers to the semiconductor layers including the semiconductor layers X1, X2, Y1, and Y2. For example, in FIG. 17, it can be said that the semiconductor regions Y1 are in contact with the bottom surface of the epitaxial layer T1, but it can be also said that the SOI layer SL is in contact with the bottom surface of the epitaxial layer T1.

Subsequently, also for the p-type SOI-MISFET and the bulk-MISFET, in a manner similar to the above description, a p-type diffusion layer SD2 of the SOI-MISFET and a p-type diffusion layer SD4 of the bulk-MISFET are formed. More specifically, at the p-type SOI-MISFET, an impurity(ies) is implanted into the epitaxial layer T1 and the SOI layer SL therebelow, and the p-type diffusion layer SD2 constituting the source/drain regions is formed. In this process, the regions of the SOI layer SL constituting the p-type diffusion layer SD2 are formed as the semiconductor regions Y2. Similarly, at the p-type bulk-MISFET, an impurity(ies) is implanted into the epitaxial layer T2 and the semiconductor substrate SB therebelow, and the p-type diffusion layer SD4 constituting source/drain regions are formed. In this process, the regions of the semiconductor substrate SB constituting the p-type diffusion layer SD4 are formed as the semiconductor region Y4.

Also, a diffusion-layer impurity compensation region (not shown) may be formed on the upper surface of the semiconductor substrate SB of the p-type SOI-MISFET.

Figure 18:
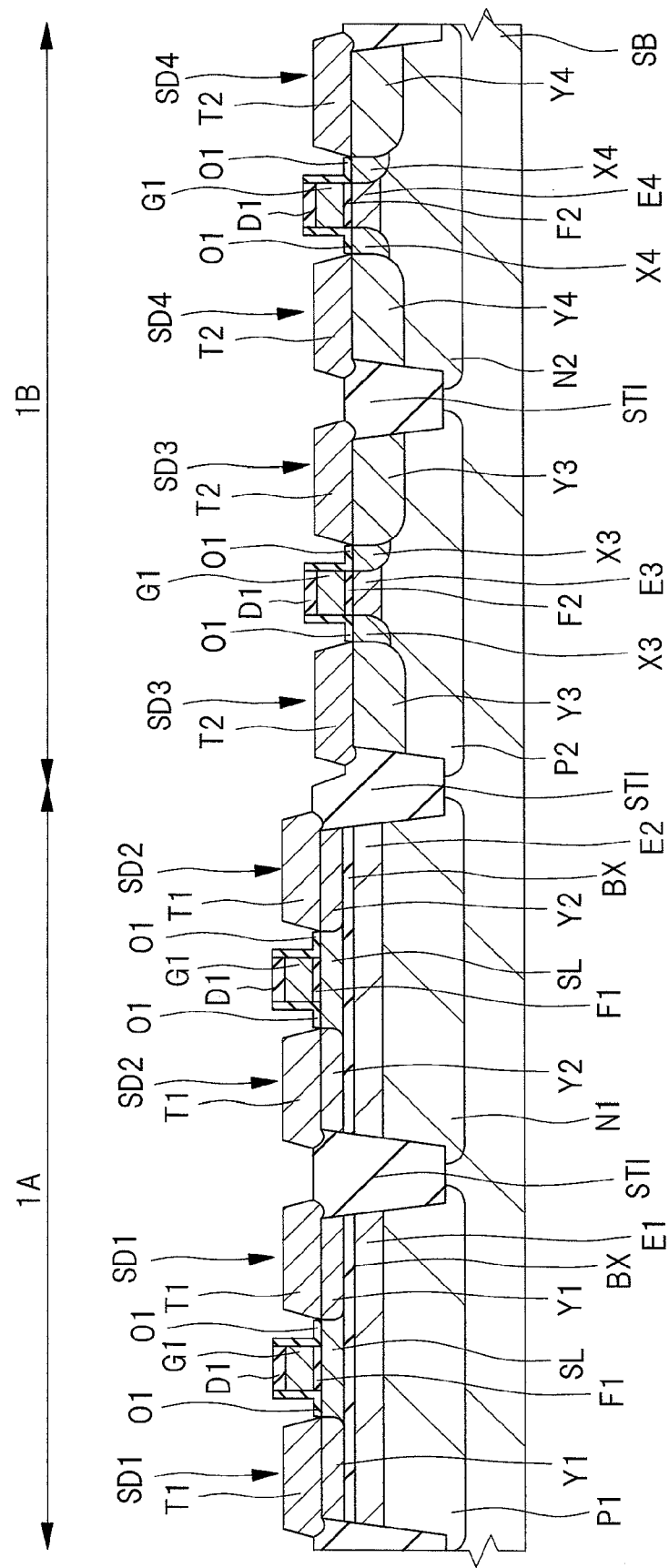
FIG. 18 is a cross-sectional view showing the method of manufacturing a semiconductor device continued from FIG. 17.

Then, as shown in FIG. 18, for example by cleaning using hot phosphoric acid, the sidewalls S1 composed of the silicon nitride film and the silicon nitride film D2 of the gate protective film are selectively removed.

Figure 19:
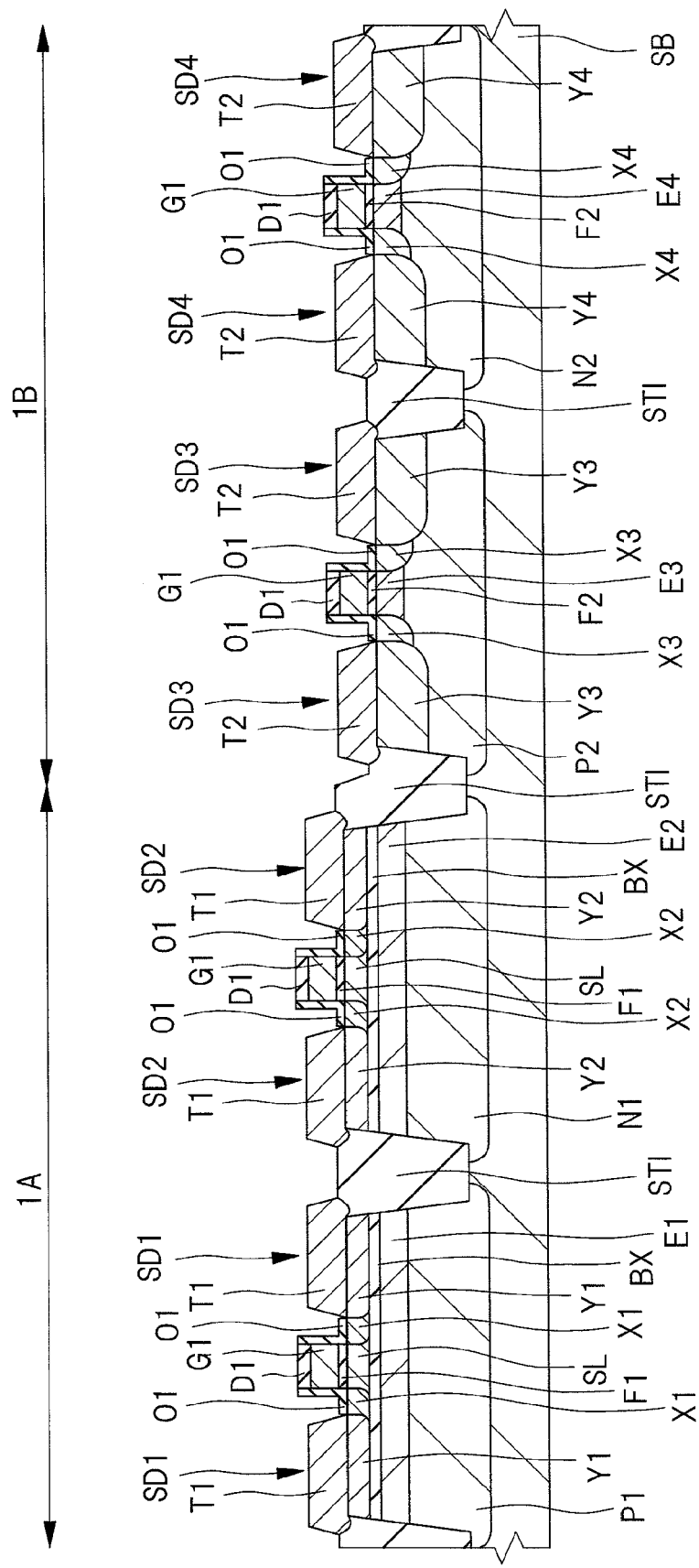
FIG. 19 is a cross-sectional view showing the method of manufacturing a semiconductor device continued from FIG. 18.

Then, as shown in FIG. 19, by lithography techniques, for example, As ions are ion-implanted into the n-type SOI-MISFET under the conditions of acceleration energy of 4 keV and an implantation amount of $5\times10^{15}/cm^2$. In this process, because of the silicon oxide film D1 serving as the gate protective film, the impurity is not implanted into the polysilicon film G1, which is to serve as the gate electrode, and the channel region below the gate, and the n-type extension layer X1 is formed in a self-aligned manner.

Similarly, for example, B (boron) ions are ion-implanted into the p-type SOI-MISFET under the conditions of acceleration energy of 2 keV and an implantation amount of $5\times10^{14}/cm^2$, and the p-type extension layer X2 is formed.

Subsequently, for example by RTA (Rapid Thermal Anneal) at 1050° C. in a nitrogen atmosphere, the implanted impurity is activated and diffused to control the distances between the extension layers X1 and X2 and the gates.

In this process, the silicon oxide film O1 of the gate sidewalls deposited in advance can play a role of controlling the distances between the extension layers X1 and X2 and the gates upon ion implantation as offset spacers.

Moreover, in the present embodiment, thermal load after formation of the extension layers X1 and X2 can be reduced; therefore, expansion of the extension layers due to thermal diffusion can be prevented, and they can be formed with good controllability.

Furthermore, even if the extension layers X1 and X2 become amorphous because of high-concentration ion implantation, the channel region and the semiconductor regions Y1 or Y2 in both sides below the gate are single-crystal layers since implantation ions have not reached there; therefore, the extension layer can be caused to become a single crystal while using them as seed layers, and increase in external resistance can be prevented.

Figure 20:
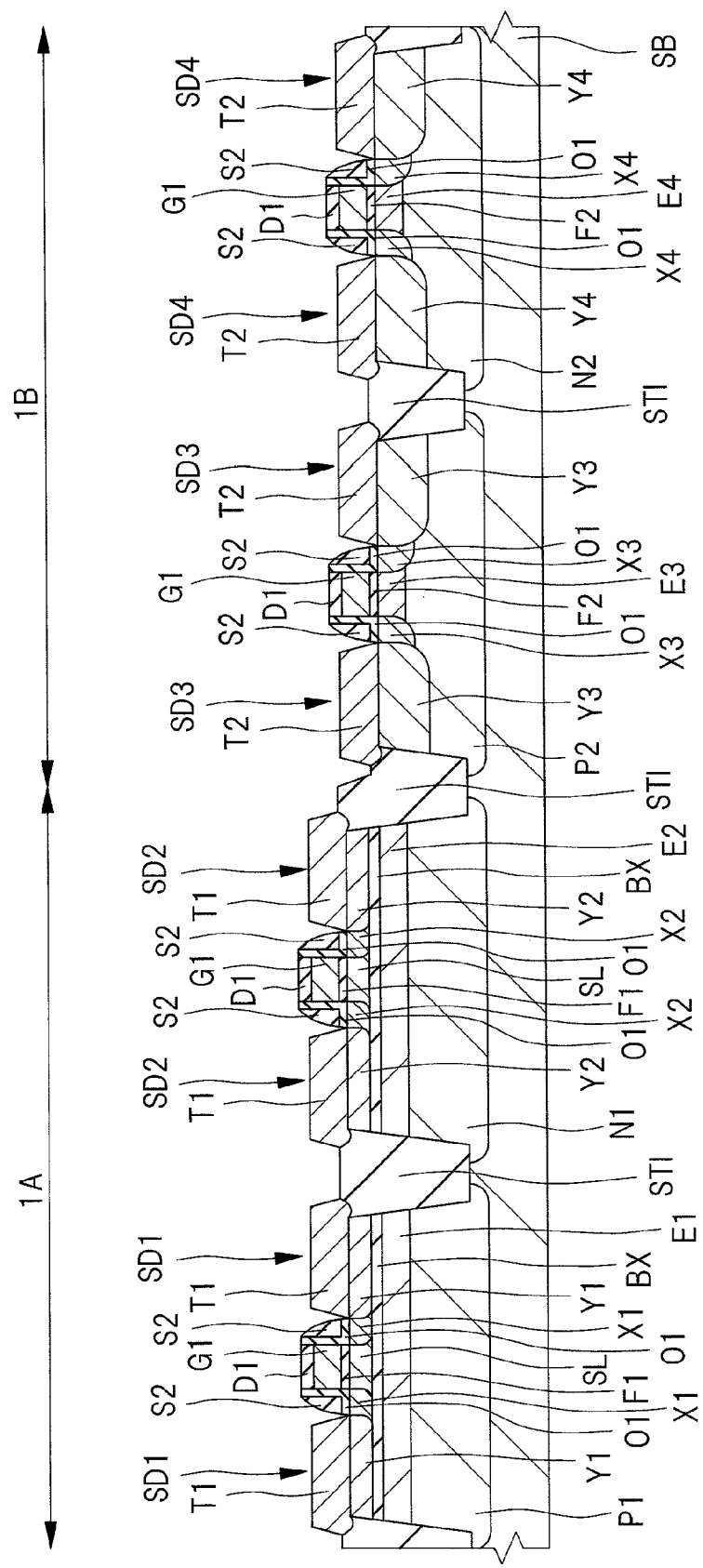
FIG. 20 is a cross-sectional view showing the method of manufacturing a semiconductor device continued from FIG. 19.

Then, as shown in FIG. 20, a silicon nitride film having a thickness of 40 nm is deposited on the entire surface of the SOI substrate, and anisotropic etching is carried out, thereby forming sidewalls S2 formed of the silicon nitride film on sides of the gates. In this process, sidewalls (not shown) are also formed between the epitaxial layers T1 and T2 and the isolation regions STI. They play a role of preventing Ni (nickel) deposited on STI in a later silicide step from being diffused to the stacked layers and excessively forming a silicide layer.

Figure 21:
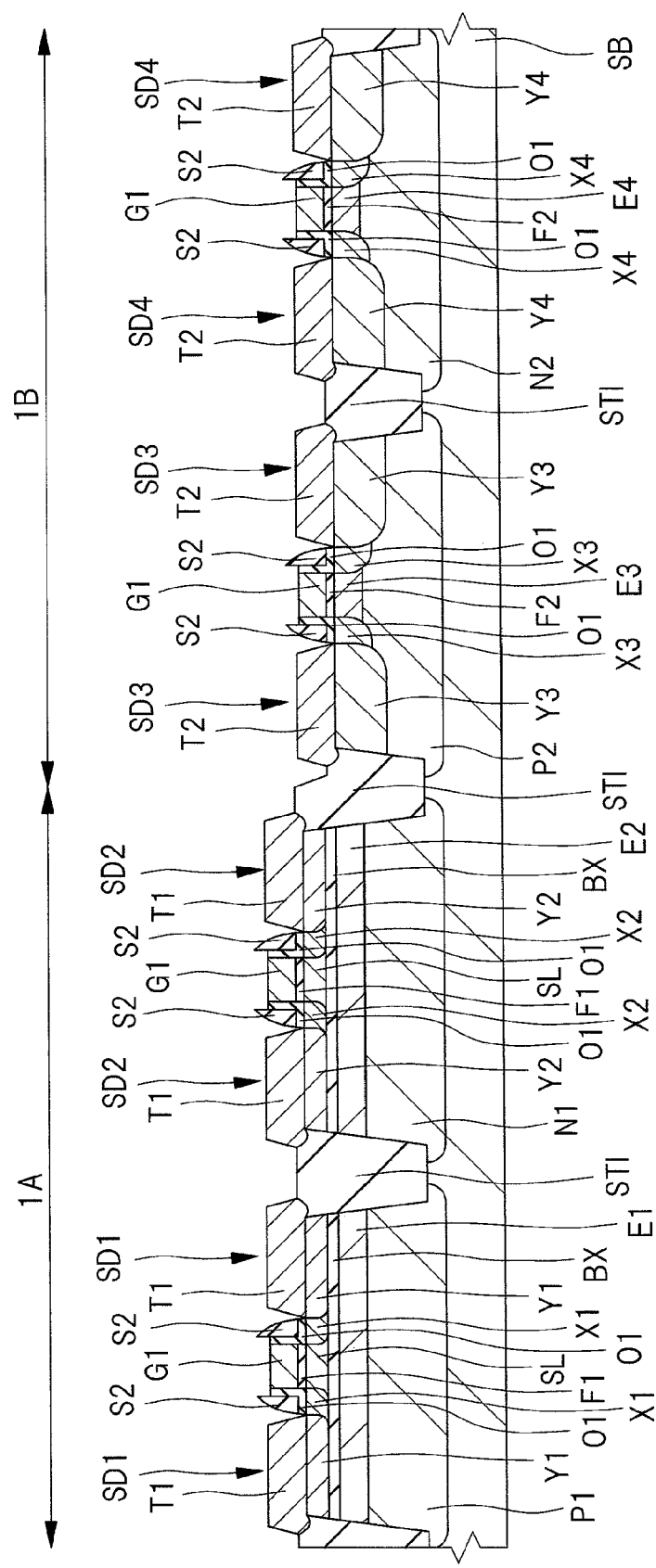
FIG. 21 is a cross-sectional view showing the method of manufacturing a semiconductor device continued from FIG. 20.

Then, as shown in FIG. 21, the silicon oxide film D1 of the gate protective film is selectively removed, for example, by hydrofluoric-acid cleaning, and the polysilicon film G1, which is to serve as the gates, is exposed.

Figure 22:
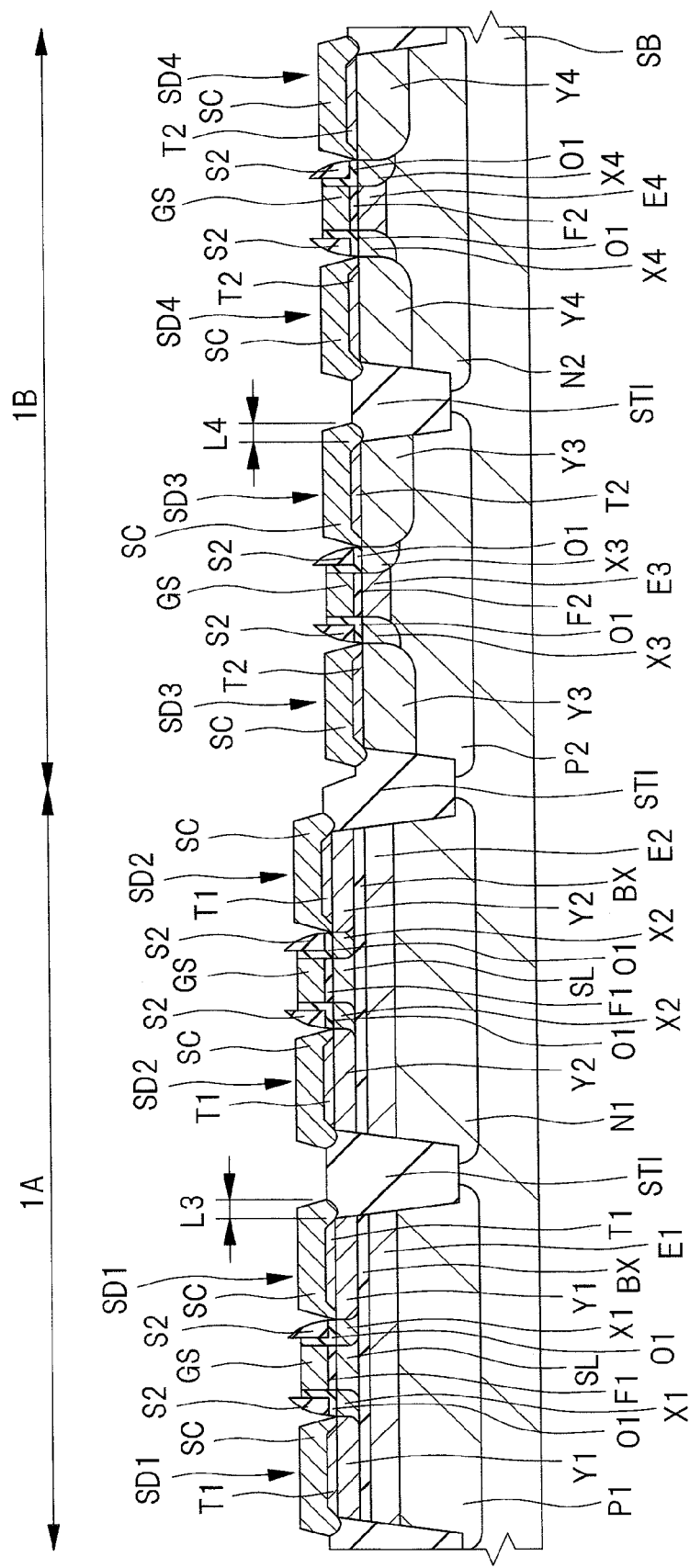
FIG. 22 is a cross-sectional view showing the method of manufacturing a semiconductor device continued from FIG. 21.
Figure 23:
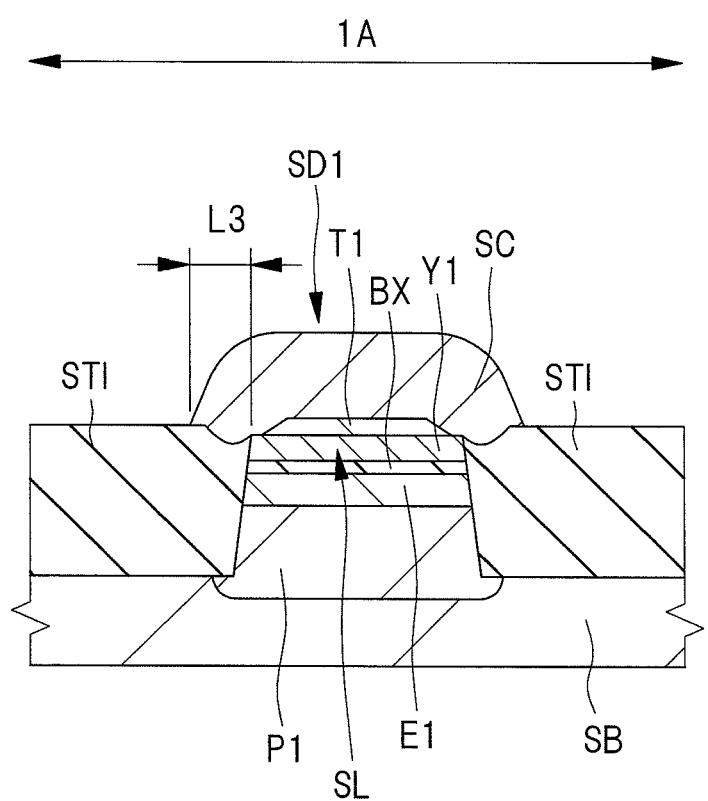
FIG. 23 is a cross-sectional view showing the method of manufacturing a semiconductor device continued from FIG. 21.

Then, as shown in FIG. 22 and FIG. 23, a metal film, for example, a Ni film of 20 nm is caused to adhere (deposited) to the entire surface of the SOI substrate, for example, by sputtering and is reacted with silicon by thermal treatment at 320° C. to form a silicide layer. Subsequently, after the unreacted Ni film is removed, for example, by a mixed aqueous solution of hydrochloric acid and hydrogen peroxide water, it is subjected to thermal treatment at 550° C. to control the phase of the silicide layer. FIG. 23 is a cross-sectional view showing the same location as FIG. 16.

As a result, gate electrodes GS in which the entire regions of the gate electrodes formed of the exposed polysilicon film G1 are fully silicided are formed. Moreover, as a result, the silicide layer SC is formed at least on upper regions of the n-type diffusion layers SD1 and SD3, which are n-type and p-type high-concentration diffusion layers, and the p-type diffusion layers SD2 and SD4.

In the above-described silicide treatment, the entire impurity-unadded polysilicon film G1 including the regions in contact with the gate insulating films F1 and F2 is converted to a silicide layer, and the gate electrodes GS are formed. As a result, resistance of gate wiring is reduced, and desired threshold voltage values of the MISFETs are realized by the work function of the silicide layer. Moreover, gate depletion, which is a problem at polysilicon gate electrodes, can be suppressed.

Through the above-described step, the n-type and p-type SOI-MISFETs having the source/drain regions and the gate electrodes GS are formed in the SOI region 1A. Also, in the bulk region 1B, the n-type and p-type bulk-MISFETs having the source/drain regions and the gate electrodes GS are formed.

In the above-described silicide step, the epitaxial layers T1 and T2 are silicided since they are reacted with the metal film in contact with the sidewalls thereof, wherein Si (silicon) is consumed also from the lateral direction. However, as described with reference to FIG. 14 to FIG. 16, the epitaxial layers T1 and T2 are formed at large widths so as to be placed on the isolation regions STI. Therefore, the SOI layer SL, which is a semiconductor layer, can be prevented from being silicided from the lateral direction; and, therefore, the parasitic resistance of the SOI layer SL can be prevented from being increased since the width in the lateral direction is small.

Since the epitaxial layer T1 is formed to be placed on the isolation region STI as described above, after the surface of the epitaxial layer T1 is silicided in the above-described silicide step, the upper surface of the isolation region STI adjacent to the SOI layer SL becomes a state in which it is covered with the epitaxial layer T1 and the silicide layer SC formed on the surface of the epitaxial layer T1. If the entire epitaxial layer T1 immediately above the isolation region STI has been silicided, the upper surface of the isolation region STI adjacent to the SOI layer SL becomes a state in which it is covered with the silicide layer SC formed on the surface of the epitaxial layer T1.

The above-described structure is similar also at the epitaxial layer T2 in the bulk region 1B. More specifically, the upper surface of the isolation region STI adjacent to the upper surface of the semiconductor substrate SB, which is an active region in the bulk region 1B, becomes a state in which it is covered with at least the silicide layer SC formed on the surface of the epitaxial layer T2.

In the present application, the silicide layer SC formed on the surface of the epitaxial layer T1 is sometimes explained as part of the epitaxial layer T1. This also applies to the epitaxial layer T2 and the silicide layer SC formed on the surface thereof. For example, in FIG. 23, it seems that the epitaxial layer T1 is not covering the upper surface of the isolation region STI; however, since the silicide layer SC formed by siliciding the surface of the epitaxial layer T1 is part of the epitaxial layer T1, it can be said that the epitaxial layer T1 is covering the upper surface of the isolation region STI.

The silicide layer SC is formed on the surfaces of the epitaxial layers T1 and T2. Therefore, in the direction along the main surface of the semiconductor substrate SB and in the direction orthogonal to the boundary between the SOI layer SL in the SOI region 1A and the isolation region STI, the distance L3 (see FIG. 22 and FIG. 23) between the end of the silicide layer SC on the surface of the epitaxial layer T1 in the vicinity of the boundary and the boundary is distant by 5 nm or more. Similarly, in the direction along the main surface of the semiconductor substrate SB and in the direction orthogonal to the boundary between the semiconductor region SB in the bulk region 1B and the isolation region STI, the distance L4 (see FIG. 22) between the end of the silicide layer SC on the surface of the epitaxial layer T2 in the vicinity of the boundary and the boundary is distant by 5 nm or more.

Figure 24:
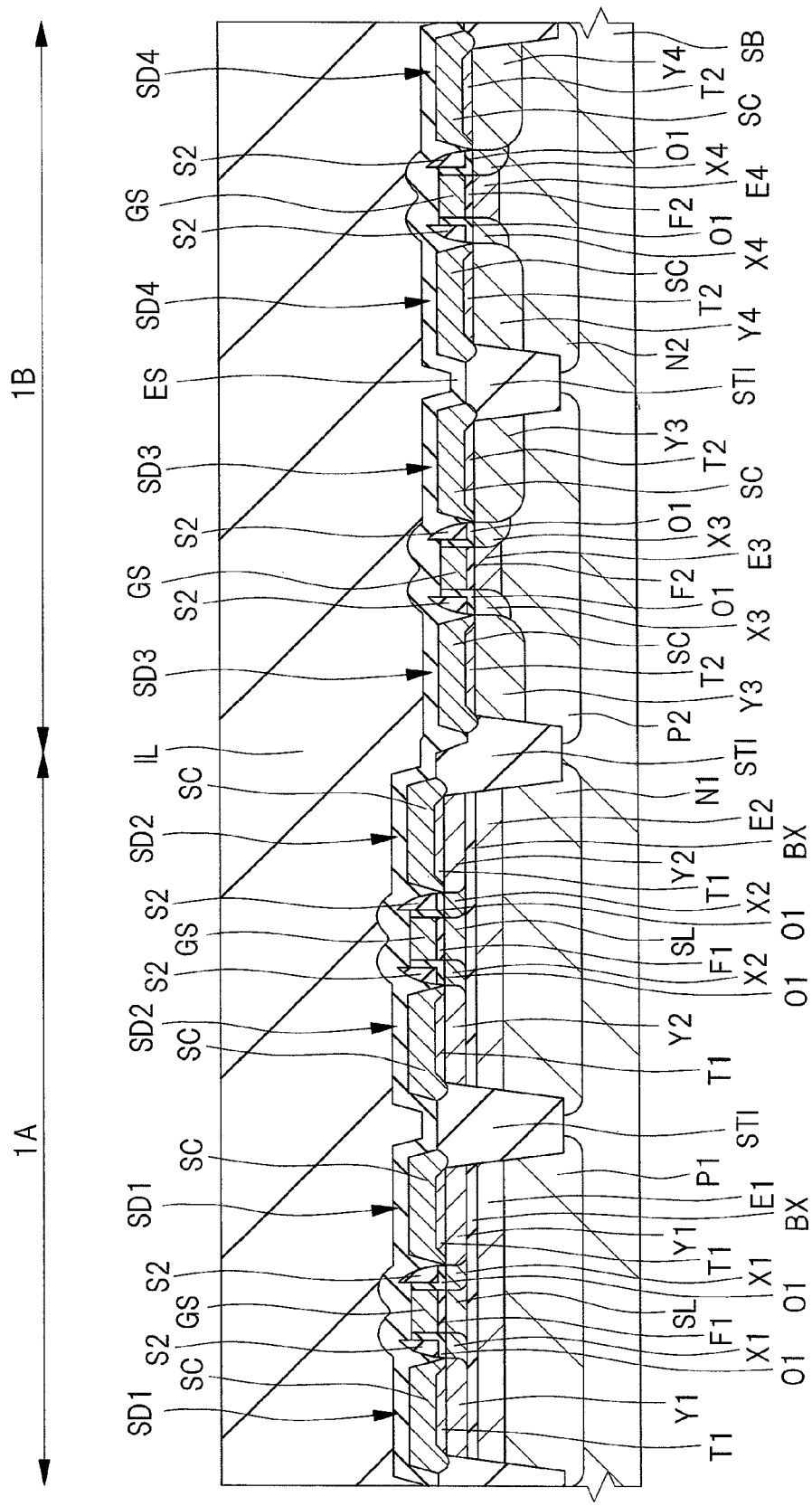
FIG. 24 is a cross-sectional view showing the method of manufacturing a semiconductor device continued from FIG. 22.

Then, as shown in FIG. 24, an insulating film ES, which is formed of a silicon nitride film and used as an etching stopper film, and an interlayer insulating film IL, which is formed of a silicon oxide film, are deposited and planarized.

Figure 25:
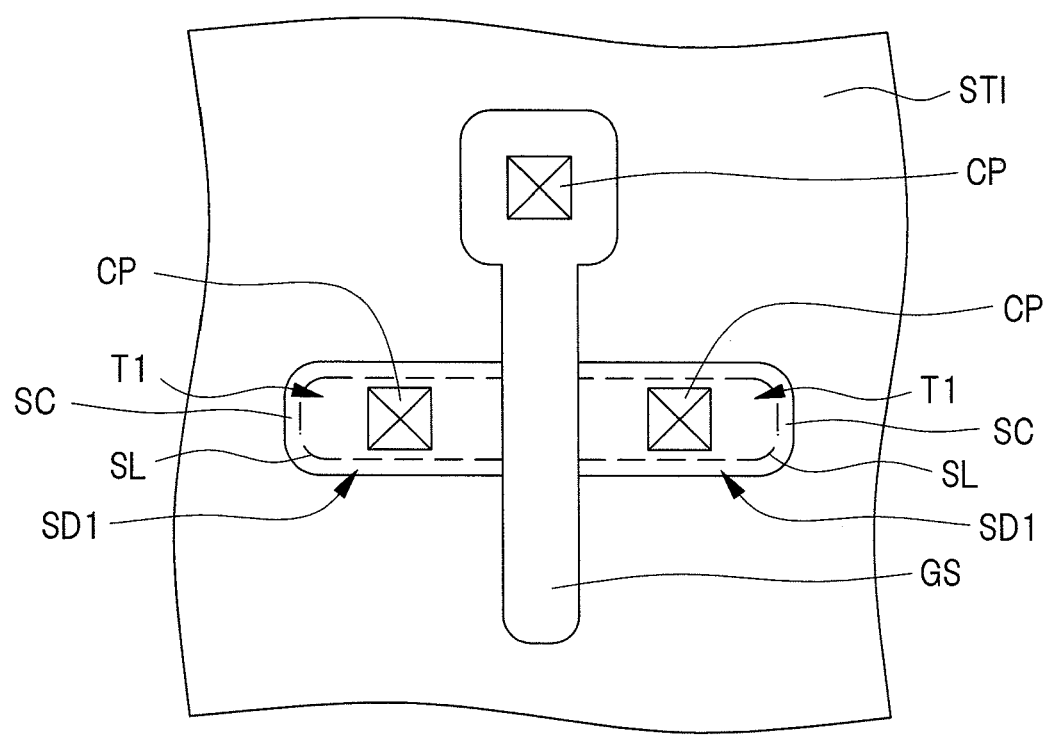
FIG. 25 is a plan view showing the method of manufacturing a semiconductor device continued from FIG. 24.
Figure 26:
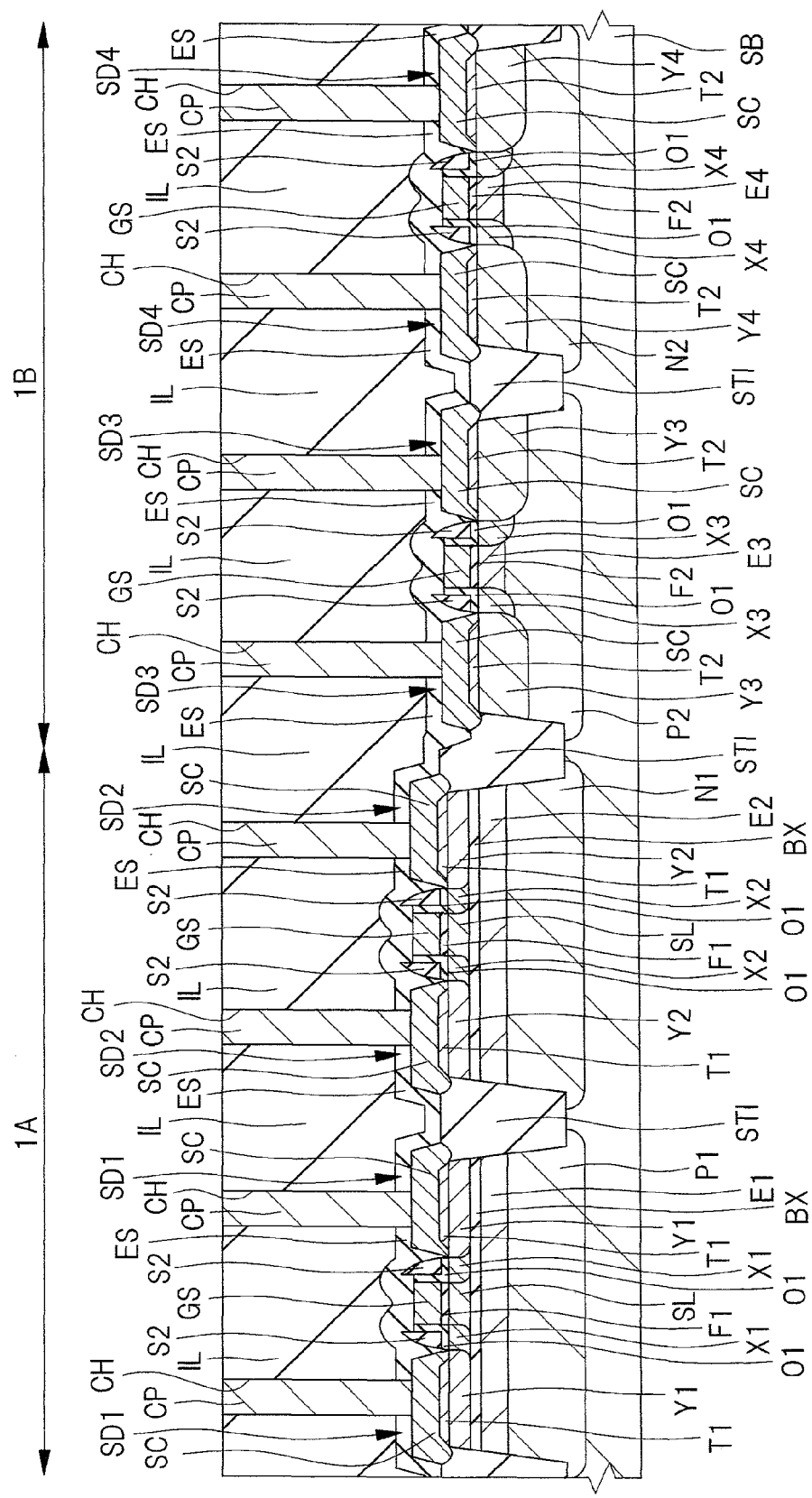
FIG. 26 is a cross-sectional view showing the method of manufacturing a semiconductor device continued from FIG. 24.
Figure 27:
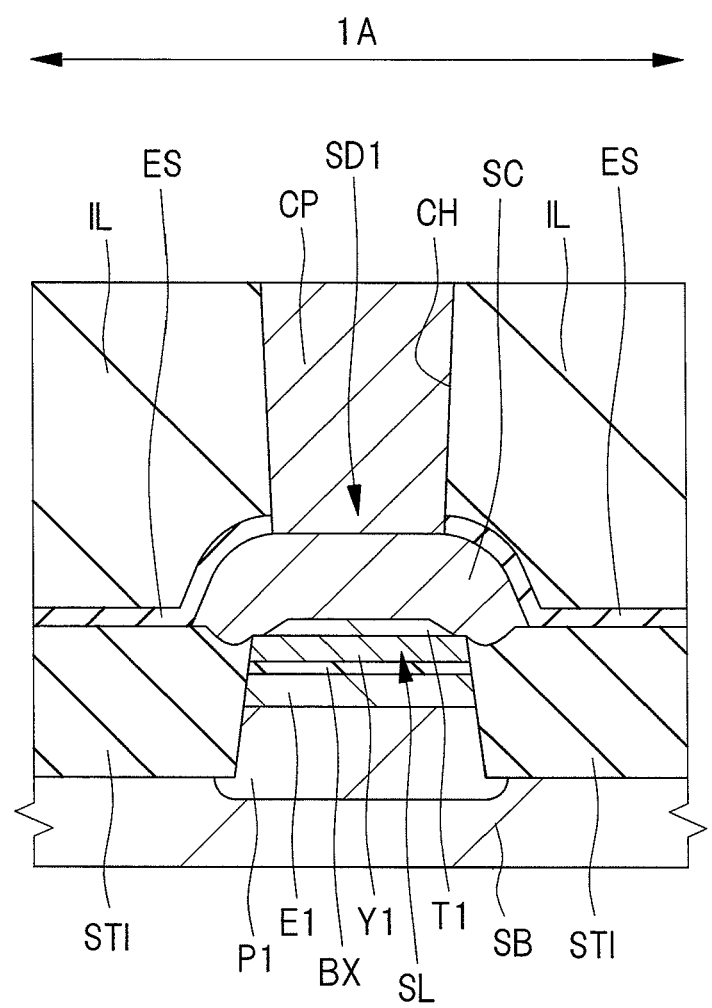
FIG. 27 is a cross-sectional view showing the method of manufacturing a semiconductor device continued from FIG. 24.

Then, as shown in FIG. 25, FIG. 26, and FIG. 27, when the contact plugs CP, which reach the gates, back gates, and source/drain regions, are formed, a semiconductor device structure of the present embodiment is completed. Then, although illustration is omitted, through a wiring step including deposition and patterning of a metal film and deposition, planarization polishing, etc. of an inter-wiring insulating film, a semiconductor device is completed. FIG. 11 and FIG. 25 are plan views showing mutually the same location, and FIG. 26 and FIG. 27 are cross-sectional views showing the same locations as the regions shown in FIG. 12 and FIG. 13, respectively.

In the plan view shown in FIG. 25, the silicide layer SC is shown in the vicinity of the active region. However, the epitaxial layer T1 and the SOI layer SL are formed below the silicide layer SC, and the SOI layer SL includes the n-type diffusion layer SD1 constituting the source/drain regions. This also applies to the plan view shown in FIG. 28, which will be described later.

The contact plugs CP shown in FIG. 26 are formed by forming a plurality of contact holes CH, which are holes penetrating through the interlayer insulating film IL and the insulating film ES, by carrying out anisotropic dry etching by lithography techniques and then burying a conductor film mainly containing, for example, W (tungsten) in the contact holes CH.

Specifically, in the above-described etching step using the lithography techniques, part of the photoresist film applied so as to cover the interlayer insulating film IL is subjected to exposure, and part of the photoresist film is subsequently removed by a developing solution to form a resist pattern. Then, dry etching is carried out while using the resist pattern as a mask, thereby forming holes in the interlayer insulating film IL and the insulating film ES. An exposure apparatus is used when the photoresist film is subjected to exposure, and pattern transfer is carried out by exposing the photoresist film via a photo mask in the exposure apparatus.

Then, in the step of burying the above-described conductor film, first, for example, a barrier conductor film containing Ti (titanium) and a tungsten film are sequentially formed, for example, by sputtering to completely bury the interiors of the contact holes Cll. Then, the bather conductor film and the tungsten film on the interlayer insulating film IL are removed, for example, by CMP to expose the upper surface of the interlayer insulating film IL, thereby forming the contact plugs CP, which are columnar conductor films formed of the barrier conductor film and the tungsten film remaining in the contact holes CH.

The contact plug CP has to be reliably connected to the gate electrode GS, the source/drain region, or the like. This is for preventing a situation that, as a result of misalignment of the formation position of the contact plug CP, the contact area between the contact plug CP and the connection target region thereof is reduced to increase contact resistance, wherein the semiconductor element does not normally operate. If misalignment of the formation position of the contact plug CP is further increased, there is a risk that the contact plug CP and the connection target region thereof may not be electrically connected. Therefore, upon formation of the contact plugs CP, high positional precision is required.

The formation positions of the contact plugs CP are determined by the positions at which the contact holes CH, in which the contact plugs CP are buried, are formed. The precision of the formation positions of the contact holes CH largely affects the precision, etc. of the above-described exposure apparatus used upon formation of the contact holes CH. In a MISFET of a comparatively low withstand voltage constituting, for example, a logic circuit, the area of source/drain regions in a plan view is small, and particularly the width in the gate-width direction is small. Therefore, with respect to the source/drain regions, etc., it is conceived to be hard to precisely form the contact plugs CP, which require predetermined diameters, at desired positions.

Figure 28:
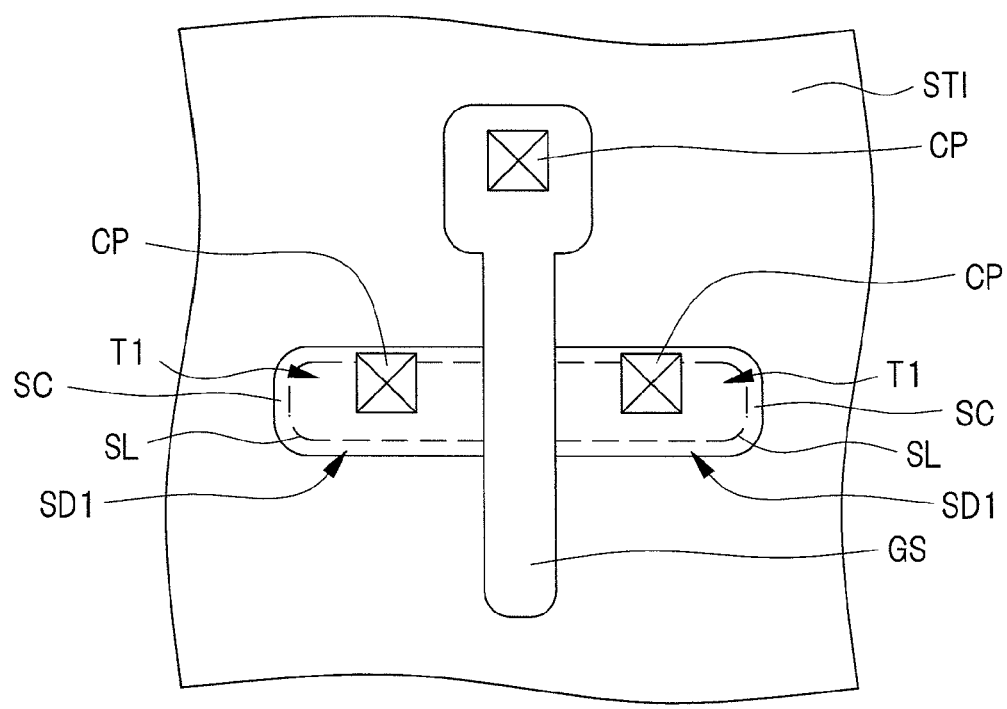
FIG. 28 is a plan view showing the method of manufacturing a semiconductor device continued from FIG. 24.
Figure 29:
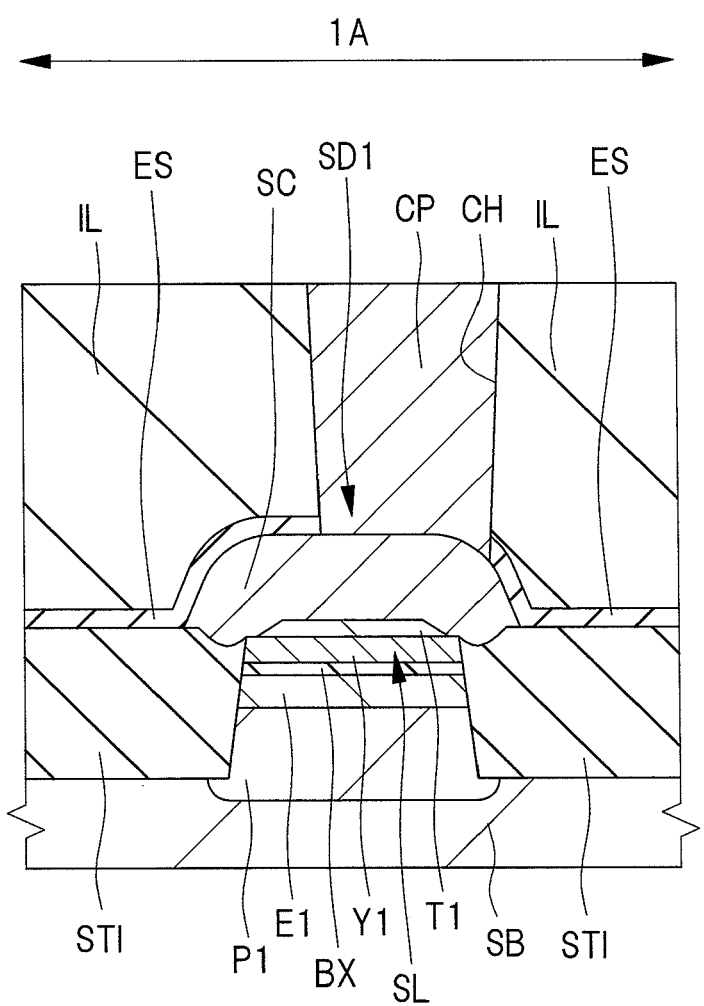
FIG. 29 is a cross-sectional view showing the method of manufacturing a semiconductor device continued from FIG. 24.
Figure 30:
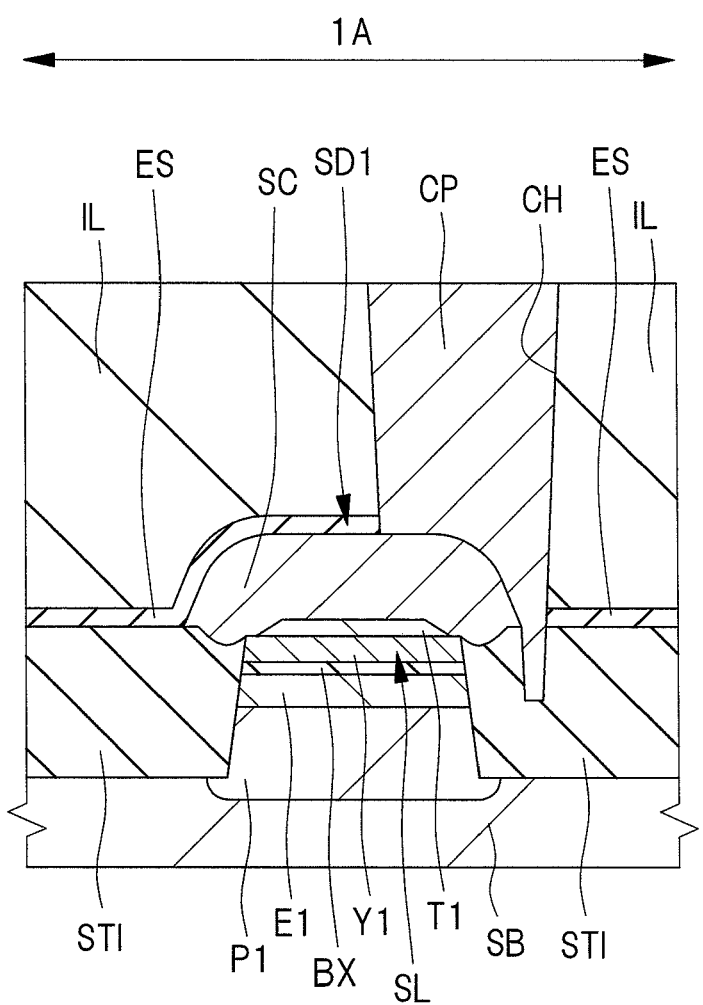
FIG. 30 is a cross-sectional view showing the method of manufacturing a semiconductor device continued from FIG. 22.

FIG. 25 to FIG. 27 show the structures of a case in which the contact plugs CP are formed at desired positions. On the other hand, hereinafter, a case in which the formation position of the contact plug CP is misaligned in the manufacturing steps of the semiconductor device of the present embodiment will be described with reference to FIG. 28, FIG. 29, and FIG. 30. FIG. 28, FIG. 29, and FIG. 30 show the structures at the points when the contact plug CP is formed by carrying out the same steps as the steps described with reference to FIG. 25 to FIG. 27. FIG. 28 is a plan view showing the same location as FIG. 25, and FIG. 29 and FIG. 30 are cross-sectional views showing the same location as FIG. 27. FIG. 29 and FIG. 30 show the cases in which the contact plug CP is formed at mutually different positions.

As shown in FIG. 28, FIG. 29, and FIG. 30, the contact hole CH and the contact plug CP are formed at the positions misaligned in the gate-width direction compared with the desired formation position (see FIG. 25 and FIG. 27). Part of the contact plug CP connected to the source/drain region is formed so as to protrude to outside of the SOI layer SL in the gate-width direction. Thus, in a plan view, part of the contact plug CP is not overlapped with the upper surface of the SOI layer SL, but is formed at a position overlapped with the upper surface of the isolation region STI.

More specifically, the contact plug CP is formed so as to be overlapped with the upper surfaces of the SOI layer SL and the isolation region STI in the plan view. In other words, the contact plug CP is formed so as to straddle immediately above the SOI layer SL and immediately above the isolation region STI adjacent to the SOI layer SL.

However, the structure composed of the epitaxial layer Tl covering the upper surface of the SOI layer SL and the silicide layer SC formed on the surface thereof has a larger width than that of the SOI layer SL in the lateral direction which is the direction along the main surface of the semiconductor substrate SB and covers the upper surface of the isolation region STI adjacent to the SOI layer SL. Therefore, the contact plug CP protruding from the SOI layer SL in the plan view is not in contact with the isolation region STI, but is connected to the upper surface of the epitaxial layer T1 via the silicide layer SC.

More specifically, the contact plug CP and the isolation region STI are overlapped with each other in the plan view, the contact plug CP is not in contact with the isolation region STI since the epitaxial layer T1 and the silicide layer SC formed on the surface thereof are interposed between the contact plug CP and the isolation region STI.

FIG. 29 shows the structure in which the contact plug CP is formed only immediately above the silicide layer SC formed on the surface of the epitaxial layer T1. On the other hand, FIG. 30 shows the structure in which the formation position of the contact plug CP is further misaligned, and part of the contact plug CP is formed to protrude to the isolation region STI side beyond the end of the silicide layer SC formed on the surface of the epitaxial layer T1.

In the structure shown in FIG. 30, since the formation position of the contact hole CH in which the contact plug CP is buried is misaligned, the isolation region STI is exposed from the bottom surface of the hole formed in the step of forming the contact hole CH, and the isolation region STI is partially removed. Therefore, the contact plug CP buried in the contact hole CH is formed so as to be connected to the silicide layer SC formed on the surface of the epitaxial layer T1 and is also formed in the hole formed in the upper surface of the isolation region STI.

The bottom surface of the hole formed in the upper surface of the isolation region STI is at the same height as the upper surface of the semiconductor substrate SB immediately below the SOI layer SL adjacent to the STI or reaches a position deeper than that. In other words, the height of the lowest bottom surface of the contact plug CP is positioned at the height equal to or lower than the height of the upper surface of the semiconductor substrate SB in contact with the BOX film BX.

In the present embodiment, the sidewalls of the trench in which the isolation region STI is buried are tapered, and, in a plan view, the semiconductor substrate SB constituting the sidewalls is exposed from the SOI layer SL and the BOX film BX, but is covered with the silicide layer SC formed on the surface of the epitaxial layer T1.

Therefore, as shown in FIG. 29, even if the formation position of the contact plug CP is misaligned to form part of the contact plug CP outside of the SOI layer SL, in other words, outside of the active region in the plan view, the contact plug CP is prevented from being connected to the semiconductor substrate SB, which is the supporting substrate of the SOI region 1A, like a comparative example described later by FIG. 50. In this case, both ends of the bottom surface of the contact plug CP are terminated immediately above the silicide layer SC on the surface of the epitaxial layer T1 or T2.

As shown in FIG. 30, the distance between the semiconductor substrate SB exposed from the SOI layer SL in the vicinity of the sidewall of the trench in which the isolation region STI is buried and the end of the silicide layer SC formed on the surface of the epitaxial layer T1 in the plan view is distant from each other by 5 nm or more. Therefore, even if the contact plug CP protruding to outside from the end of the silicide layer SC in the plan view is formed to reach a depth in the isolation region STI as a result of the formation position of the contact plug CP largely misaligned to the inactive region side, the contact plug CP does not contact the semiconductor substrate SB.

As a comparative example, a case in which the epitaxial layer is formed by a width equivalent to that of the SOI layer, which is a base, will be described with reference to FIG. 45 to FIG. 50. In the comparative example, as well as the above-described embodiment, MISFETs are formed on a semiconductor substrate having an SOI region and a bulk region.

Figure 45:
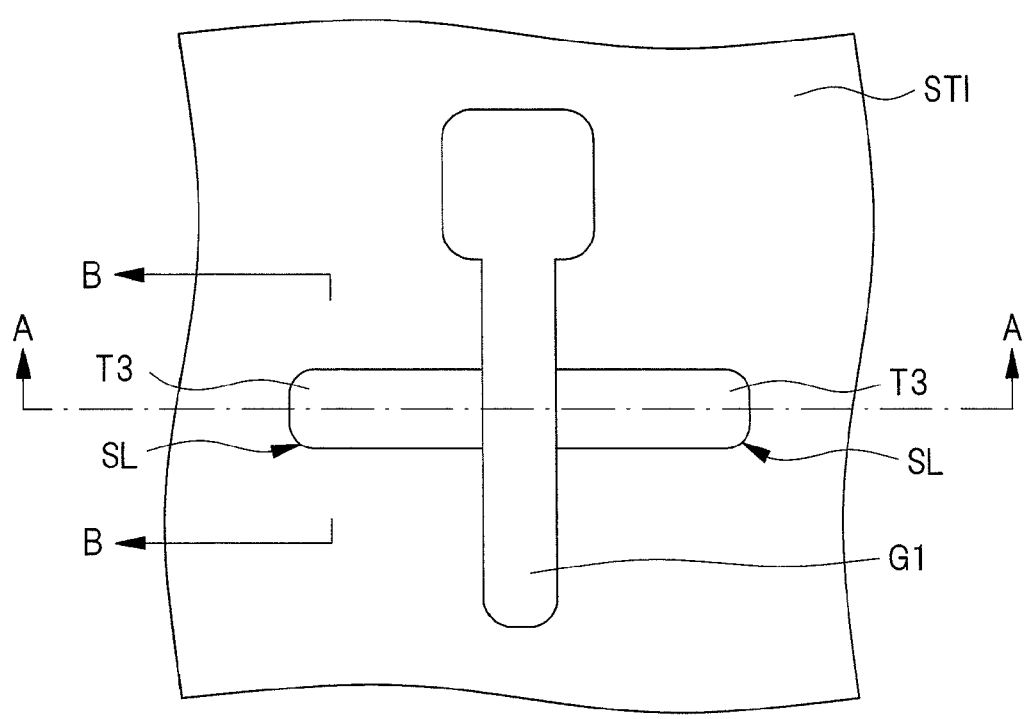
FIG. 45 is a plan view showing a method of manufacturing a semiconductor device of a comparative example.
Figure 46:
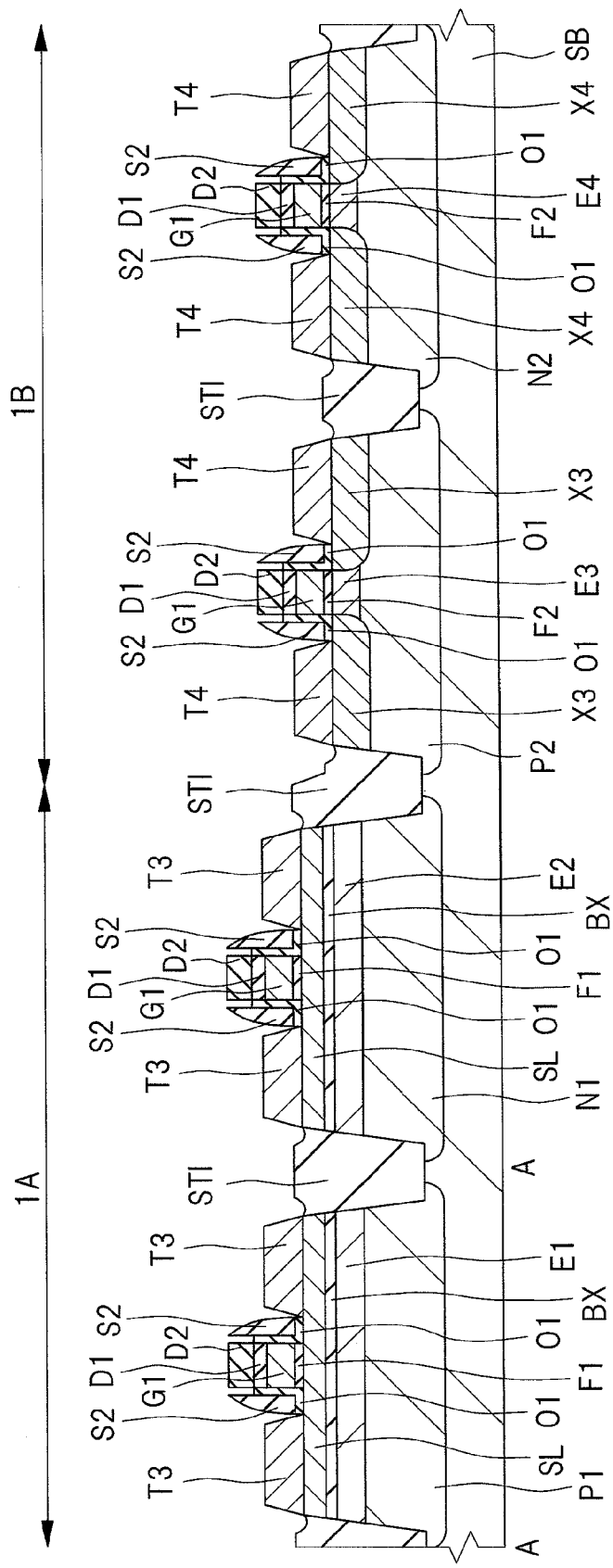
FIG. 46 is a plan view showing a method of manufacturing a semiconductor device of a comparative example.
Figure 47:
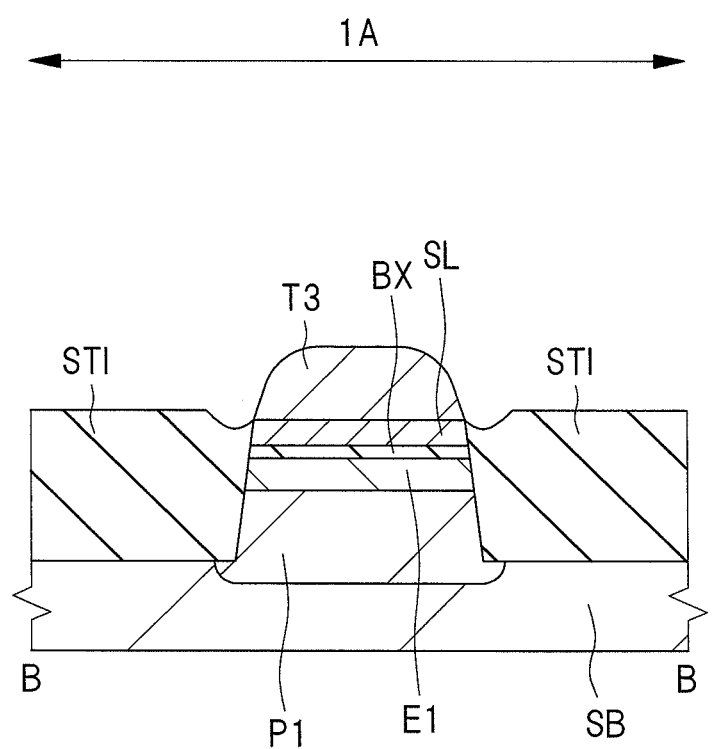
FIG. 47 is a plan view showing a method of manufacturing a semiconductor device of a comparative example.
Figure 48:
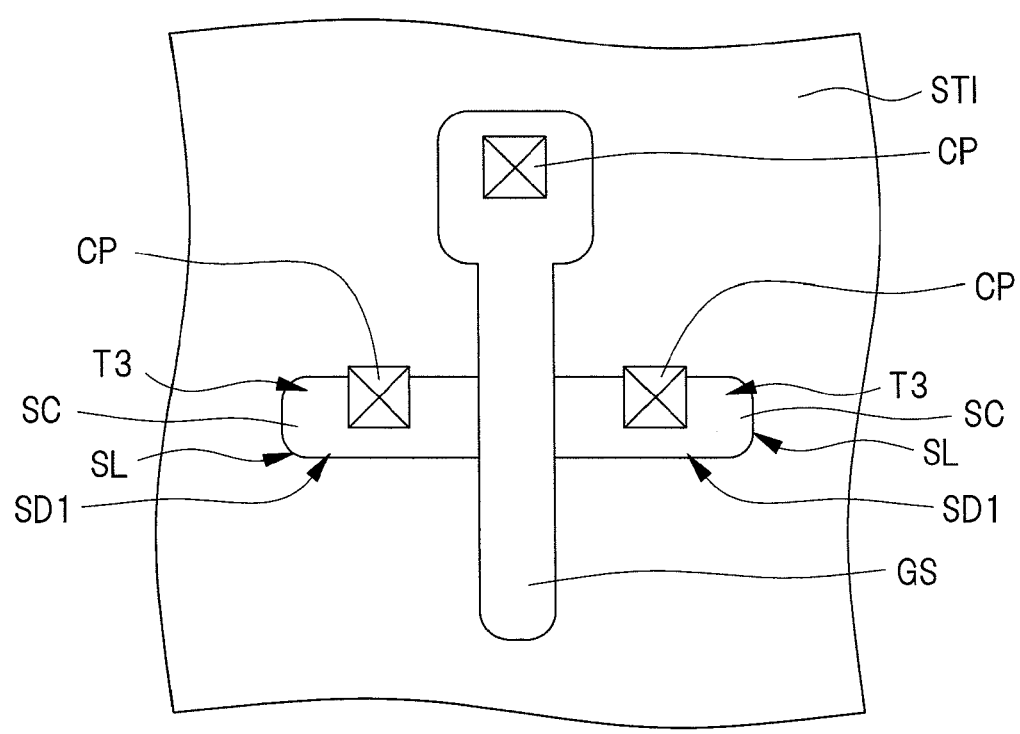
FIG. 48 is a plan view showing the method of manufacturing a semiconductor device continued from FIG. 45.
Figure 49:
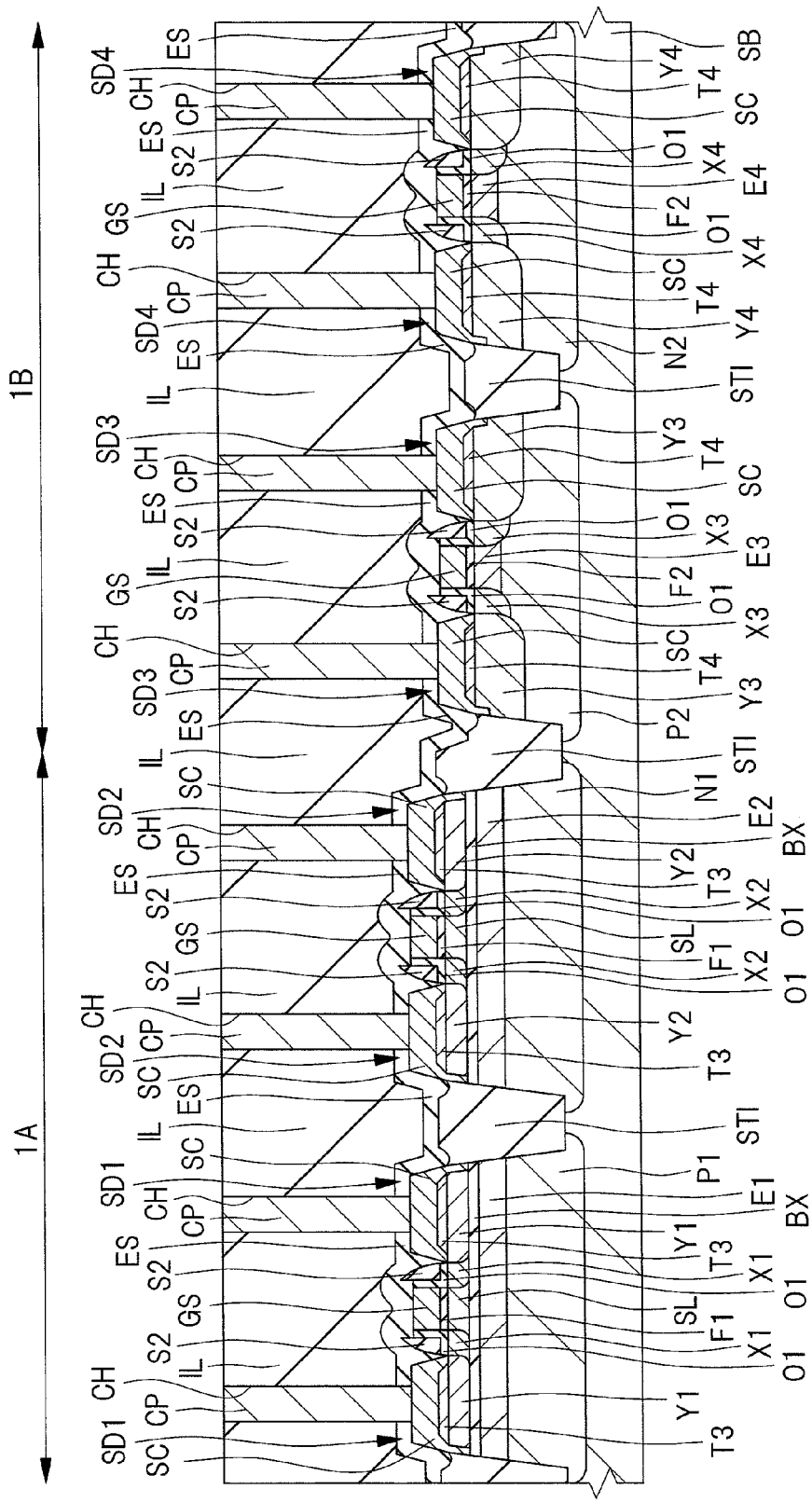
FIG. 49 is a cross-sectional view showing the method of manufacturing a semiconductor device continued from FIG. 45.

FIG. 45 and FIG. 48 are plan views showing manufacturing steps of a semiconductor device, which is the comparative example; FIG. 47 is a cross-sectional view at a line B-B of FIG. 45, and FIG. 50 is a cross-sectional view at the same position as FIG. 47. FIG. 46 and FIG. 49 are cross-sectional views at the same location as FIG. 15, FIG. 46 shows the cross section at a line A-A of FIG. 45 in the left side of the drawing, and FIG. 49 shows the cross section at a line A-A of FIG. 48 in the left side of the drawing.

In the manufacturing steps of the semiconductor device of the comparative example, first, the steps of FIG. 1 to FIG. 13 are carried out as well as the above-described present embodiment. In this case, the crystal plane orientation of the SOI layer SL and the semiconductor substrate SB is (100); however, different from the present embodiment, the channel orientation is 0 degree, in other words, <110> in the comparative example.

Then, as shown in FIG. 45, FIG. 46, and FIG. 47, an epitaxial layer T3 is formed on the SOI layer SL in the SOI region 1A, and T4 in the bulk region 1B is formed. Thus, this step corresponds to the step of forming the epitaxial layers described with reference to FIG. 14 to FIG. 16.

Different from the present embodiment described with reference to FIG. 14 to FIG. 16, in this case, the epitaxial layers T3 and T4 are formed by the widths equivalent to those of the active regions, which are bases. More specifically, in the SOI region 1A shown in FIG. 46, the transverse-direction width of the upper surface of the SOI layer SL exposed from the isolation region STI, the polysilicon film G1, and the sidewall S2 is approximately the same as the width of the epitaxial layer T3 in the same direction. Therefore, the epitaxial layer T3 is not covering the upper surface of the isolation region STI. Even if the epitaxial layer T3 is covering the upper surface of the isolation region STI, the region in which the upper surface of the isolation region STI is covered with the epitaxial layer T3 is only a region within a range that is less than 5 nm from the boundary between the isolation region STI and the SOI layer SL in the direction along the main surface of the semiconductor substrate SB.

In FIG. 45 and FIG. 47, the structure of the element in the manufacturing step of the SOI region is shown, and the above-described structure is similar also in the bulk region 1B as shown in FIG. 46. More specifically, the lateral-direction width of the epitaxial layer T4 in the bulk region 1B is equivalent to the width of the upper surface of the semiconductor substrate SB, which is the base thereof, in the same direction.

One of the reasons why the widths of the epitaxial layers T3 and T4 are formed to be narrow as described above is that the channel orientation of the elements is 0 degree, in other words, <110> as described above. This is for a reason that growth of the epitaxial layers in the lateral direction is suppressed in the case in which the channel orientation is <110> compared with the case in which the channel orientation is <100>.

Another reason why the widths of the epitaxial layers T3 and T4 are formed to be narrow is that removal of the epitaxial layers is facilitated by increasing selectivity by increasing an etching component of a gas supplied in an epitaxial growth step upon formation of the epitaxial layers T3 and T4.

Another reason why the widths of the epitaxial layers T3 and T4 are formed to be narrow is that the time for carrying out film formation in the epitaxial growth step upon formation of the epitaxial layers T3 and T4 is comparatively short.

Then, the steps described with reference to FIG. 17 to FIG. 24 are carried out, thereby covering the plurality of MISFETs formed on the semiconductor substrate SB with the insulating film ES and the interlayer insulating film IL.

Figure 50:
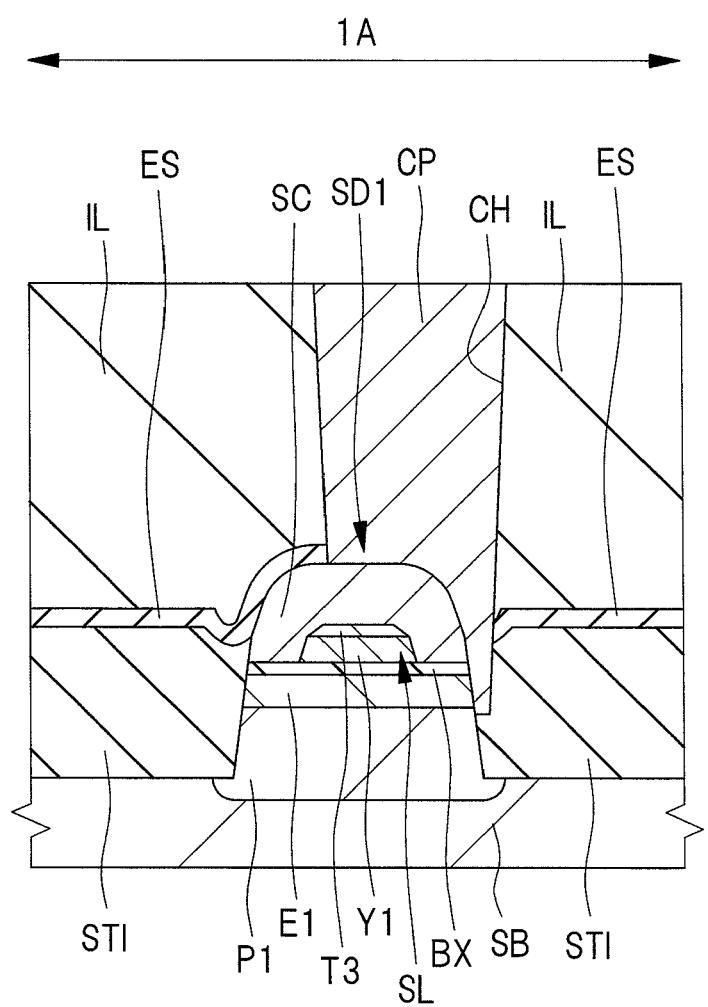
FIG. 50 is a cross-sectional view showing the method of manufacturing a semiconductor device continued from FIG. 45.

Then, as shown in FIG. 48, FIG. 49, and FIG. 50, after the contact holes CH penetrating through the insulating film ES and the interlayer insulating film IL are formed, the contact plugs CP, which bury the interiors of the contact holes CH, are formed. Thus, this step corresponds to the formation step of the contact plugs CP described with reference to FIG. 25 to FIG. 29.

Herein, a case in which the formation positions of the contact hole CH and the contact plug CP are misaligned in the gate-width direction of the MISFET as well as the structures described with reference to FIG. 28 and FIG. 29. As shown in FIG. 48 and FIG. 50, the epitaxial layer T3 is formed only immediately above the upper surface of the SOI layer SL, which is an active region exposed from the isolation region STI, and the upper surface of the isolation region STI is not covered with the epitaxial layer T3 or the silicide layer SC formed on the surface of the epitaxial layer T3.

The lateral-direction width of the epitaxial layer T3 is equivalent to the same-direction width of the upper surface of the SOI layer SL exposed therebelow from the films such as the sidewalls S2 and the isolation region STI. Therefore, if the contact plug CP, which is originally supposed to be formed without being overlapped with the isolation region STI in the plan view, is formed to be misaligned to the isolation region STI side beyond the boundary between the SOI layer SL and the isolation region STI, the structure as shown in FIG. 50 is obtained.

More specifically, in an etching step of forming the contact hole CH, when the interlayer insulating film IL is removed and an etching step of removing the insulating film ES is further carried out to form an opening in the insulating film, in some cases, the upper surface of the isolation region STI is exposed from the bottom surface of the opening, the isolation region STI is further etched, and, as a result, the surface of the semiconductor substrate SB is exposed in the opening. Thus, in this case, the bottom of the contact hole CH is at the same height as the upper surface of the semiconductor substrate SB, which is in contact with the BOX film BX below the SOI layer SL, or reaches a position deeper than that.

After the semiconductor substrate SB is exposed from the inside of the contact hole CH formed in the SOI region 1A in the above-described manner, the contact plug CP, which is formed so as to bury the interior of the contact hole CH, becomes a state that it is electrically connected to the semiconductor substrate SB. In the step thereafter, the semiconductor device of the comparative example is almost completed by forming wiring on the contact plug CP as well as the manufacturing step of the semiconductor device of the above-described present embodiment.

As shown in FIG. 48 and FIG. 50, in the comparative example, part of the contact plug CP formed to be misaligned from the desired position is formed outside of the SOI layer SL in the plan view and, therefore, may reach the semiconductor substrate SB below the SOI layer SL. In the semiconductor device including the SOI-MISFET to which the contact plug CP is connected in this manner, when the contact plug CP is formed to be in contact with both of the source/drain region and the supporting substrate, an electric potential supplied to the source/drain region is supplied also to the semiconductor substrate SB upon operation of the SOI-MISFET.

In this case, it becomes difficult to supply a desired electric potential to the semiconductor substrate SB, and the SOI-MISFET cannot be normally operated. More specifically, the semiconductor substrate serving as a supporting substrate of the SOI substrate can improve the current drive characteristic of the SOI-MISFET by fixing the electric potential thereof, can change the characteristics of the SOI-MISFET by changing the electric potential, and can use the semiconductor substrate as a back gate by controlling the electric potential. However, if the contact plug CP, which is formed in order to connect to the source/drain region of the SOI-MISFET, is unintentionally connected to the semiconductor substrate SB in the above-described manner, it becomes difficult to obtain the above-described effects, and the SOI-MISFET malfunctions. As a result, a problem that reliability of the semiconductor device is reduced occurs.

Moreover, since the lateral-direction width of the epitaxial layer T3 is as small as the same-direction width of the SOI layer SL as shown in FIG. 46 and FIG. 47, when siliciding is carried out by carrying out a step similar to the step described with reference to FIG. 22 and FIG. 23, the metal film covering the surface of the epitaxial layer T3 and Si (silicon) react with each other, and, not only the epitaxial layer T3, but also the SOI layer SL is silicided from the lateral-direction ends thereof.

As shown in FIG. 47, in the case in which the width of the SOI layer SL is small in the gate-width direction, when the both ends of the SOI layer SL in the same direction are silicided, the width of the SOI layer SL becomes extremely small. In this case, the region which functions as the source/drain region into which an n-type impurity (for example, (phosphorous)) is introduced is reduced, and the film thickness of the SOI layer SL is extremely thin; therefore, the resistance of the source/drain region is increased. Moreover, since the SOI layer SL shrinks, the contact area between the silicide layer SC and the source/drain region is reduced; therefore, the contact resistance between the silicide layer SC and the source/drain region is increased.

The height of the end of the upper surface of the isolation region STI is lower than the center part of the upper surface of the isolation region. If the sidewalls of the SOI layer SL are exposed from the isolation region STI since the ends of the upper surfaces of the isolation regions STI are concave, siliciding of the sidewalls of the SOI layer SL becomes notable, and the resistance of the source/drain region is further increased.

Therefore, the SOI-MISFET in the above-described comparative example cannot obtain desired characteristics and does not normally operate. Therefore, a problem that the reliability of the semiconductor device is reduced occurs. Moreover, since the resistance of the SOI-MISFET is increased, a problem that performance of the semiconductor device is reduced occurs.

In the bulk region 1B shown in FIG. 49, even in a case that the formation position of the contact plug CP is misaligned, for example, from the active region to the isolation region STI side in the gate-width direction and that the contact plug CP is formed in the contact hole CH, which is formed by partially removing the active-region isolation region STI, as long as the contact plug CP is connected to the source/drain region, the above-described problems do not occur. This is for a reason that, while the characteristic of the SOI-MISFET in the SOI region 1A is largely affected by the electric potential of the semiconductor substrate SB present via the BOX film BX below the SOI layer SL, the supporting substrate formed via the insulating film below the active region is not present in the bulk region.

Moreover, in the bulk region 1B, even if the source/drain region on the upper surface of the active region is silicided, for example, from the lateral direction in the gate-width direction as shown in FIG. 50, the source/drain region in the bulk region 1B is formed on the main surface of the semiconductor substrate SB, which has a sufficiently large film thickness than that of the SOI layer SL, and has a large joint depth; therefore, the resistance thereof is not greatly increased. Moreover, even if the upper end of the source/drain region of the upper surface of the active region is silicided from the lateral direction, the silicide layer SC formed by that is in contact with the source/drain region by the bottom surface thereof; therefore, the contact resistance between the silicide layer SC and the source/drain region is not increased in the bulk region 1B.

Against the above-described problems, in the present embodiment, as shown in FIG. 14 and FIG. 16, the epitaxial layer T1 is formed so that the width thereof in the direction along the main surface of the semiconductor substrate SB is large. In this case, particularly, the width is narrow in many cases because of the design thereof, and an object thereof is to expand the width of the epitaxial layer on the active region of which margin for the positional misalignment of the contact plug CP is small. In other words, it is an object to expand the gate-width-direction width of the epitaxial layer T1 on the source/drain region constituting, for example, the SOI-MISFET. By virtue of this, part of the upper surface of the isolation region STI adjacent to the SOI layer SL is covered with the silicide layer SC formed on the surface of the epitaxial layer T1.

Therefore, since the epitaxial layer T1 and the silicide layer SC on the surface thereof are formed to be expanded in the lateral direction, even if the formation position of the contact plug CP is misaligned due to, for example, precision of photolithography techniques, the silicide layer SC serves as a receiver of the contact plug CP, and all of the bottom surface of the contact plug CP is connected to the upper surface of the silicide layer SC. Therefore, even in a case of the SOI-MISFET in which, for example, the width of the SOI-layer SL in the gate-width direction is formed to be small due to, for example, miniaturization of the semiconductor device, the margin for the misalignment upon formation of the contact plug CP, which is to be connected to the source/drain region, can be largely ensured.

Thus, even in a case in which the contact plug CP is formed to straddle the active region and the inactive region, in other words, a case in which the single contact plug CP is formed to be overlapped with the SOI layer SL and the isolation region STI in a plan view as shown in FIG. 48, the contact plug CP, which is supposed to be connected to the source/drain region, can be prevented from being electrically connected to the semiconductor substrate SB.

By virtue of this, when the contact plug CP is formed to be protrude to the outside beyond the SOI layer SL in the plan view, the contact plug CP can be prevented from being connected to the semiconductor substrate SB below the SOI layer SL to conduct the supporting substrate and the element to each other. Therefore, since the SOI-MISFET can be prevented from malfunctioning, the reliability of the semiconductor device can be improved.

In this case, if the distance L1 from the end of the SOI layer SL to the end of the epitaxial layer T1 (see FIG. 16), which is formed to be flared like an eave to the isolation region STI side, in the direction along the main surface of the semiconductor substrate SB is 5 nm or more, the distance L3 from the end of the SOI layer SL to the end of the silicide layer SC (see FIG. 23) formed on the surface of the epitaxial layer T1 is 5 nm or more. If the distance L3 between the end of the SOI layer SL and the end of the silicide layer SC is distant by 5 nm or more, the margin of the formation position of the contact plug CP can be sufficiently increased.

Even in a case in which part of the contact plug CP is formed outside of the silicide layer SC formed on the surface of the epitaxial layer T1 and is formed in a hole which reaches an intermediate depth of the isolation region STI as shown in FIG. 30, the semiconductor substrate SB, which is in the vicinity of the sidewall of the isolation region STI and exposed from the SOI layer SL in the plan view, and the contact plug CP in the hole are distant from each other; therefore, they do not contact with each other. This is for a reason that the end of the SOI layer SL in the lateral direction and the end of the silicide layer SC formed on the surface of the epitaxial layer T1 are sufficiently distant from each other.

In this case, when the distance L3 between the end of the SOI layer SL and the end of the silicide layer SC is distant by 5 nm or more, the contact plug CP in the hole and the semiconductor substrate SB can be caused to be sufficiently distant from each other, and the contact plug CP can be prevented from being conducted to the semiconductor substrate SB.

Moreover, even in a case of a structure (not shown) in which the SOI layer SL and the contact plug CP are not overlapped with each other at all in the plan view since the formation position of the contact plug CP is further misaligned, as a result of forming the epitaxial layer T1 having a width wider than the SOI layer SL, the contact plug CP is not connected to the SOI-MISFET, and the MISFET can be prevented from malfunctioning. This effect can be obtained also in the bulk region 1B (see FIG. 26).

Moreover, in a case in which the contact plug CP is formed to straddle the active region and the inactive region like the above-described comparative example, the area by which the contact plug CP and the silicide layer SC are in contact with each other is reduced compared with the case in which the contact plug CP is formed at a normal position with respect to the silicide layer SC on the surface of the source/drain region, and there is a problem that the contact resistance thereof is increased. This problem occurs even when part of the contact plug CP does not reach the semiconductor substrate SB, which is the supporting substrate of the SOI substrate.

However, by increasing the width of the epitaxial layer T1 and increasing the margin of the formation position of the contact plug CP like the present embodiment, increase in the contact resistance between the contact plug CP and the silicide layer SC can be prevented even in the case in which the formation position of the contact plug CP is misaligned. This effect can be obtained also in the bulk region 1B (see FIG. 26).

Moreover, it can prevent reduction of the source/drain region and increase in the resistance of the SOI-MISFET due to siliciding of the end of the SOI layer SL in the direction along the main surface of the semiconductor substrate and prevent the semiconductor device from not operating normally. This is for a reason that, by largely growing the epitaxial layer T1 in the lateral direction in the step described with reference to FIG. 14 to FIG. 16, the region in which the metal film and Si (silicon) are reacted and chemically combined with each other in the silicide step described with reference to FIG. 22 and FIG. 23 can be prevented from reaching the SOI layer SL.

Even in a case in which the sidewall of the SOI layer SL is exposed from the isolation region STI since the end of the upper surface of the isolation region STI is concave, the sidewall of the SOI layer SL can be covered with a sufficiently thick silicon film by forming the epitaxial layer T1 so that the layer is expanded in the lateral direction as described above. In the present embodiment, it is formed so that the lateral width of the epitaxial layer T1 is increased to bury the concave at the end of the upper surface of the isolation region STI. More specifically, in the gate-length direction and the gate-width direction, the epitaxial layers T1 and T2 are buried in the concaves at the ends of the upper surfaces of the isolation regions STI. Therefore, even when the silicide step is carried out, the ends of the SOI layer SL can be prevented from being silicided, and the resistance of the SOI layer can be prevented from being increased.

In the present embodiment, even if the sidewalls of the SOI layer SL are partially silicided, since the epitaxial layer T1 is largely formed in the lateral direction, consumption of Si (silicon) of the SOI layer SL can be reduced, and the width of the SOI layer SL in the lateral direction can be sufficiently remained. In other words, in the gate-length direction and the gate-width direction, the width of the epitaxial layer T1 or T2 is larger than the width of the SOI layer SL. By virtue of this, increase in the resistance, which is caused by reduction of the volume of the source/drain region, and increase in the contact resistance between the SOI layer SL, which constitutes the source/drain region, and the silicide layer SC can be prevented, and increase in the parasitic resistance of the SOI-MISFET can be prevented.

When the distance L1 from the end of the SOI layer SL to the end of the epitaxial layer T1 (see FIG. 16) formed to be flared like an eave to the isolation region STI side is 5 nm or more in the direction along the main surface of the semiconductor substrate SB, siliciding of the SOI layer SL can be effectively prevented.

By virtue of this, the resistance of the source/drain region formed of the SOI layer SL having a thin film thickness can be prevented from being increased. Therefore, the SOI-MISFET can be prevented from not normally operating, and the reliability of the semiconductor device can be improved. Moreover, since the resistance of the SOI-MISFET is reduced, performance of the semiconductor device can be improved.

Second Embodiment

Figure 33:
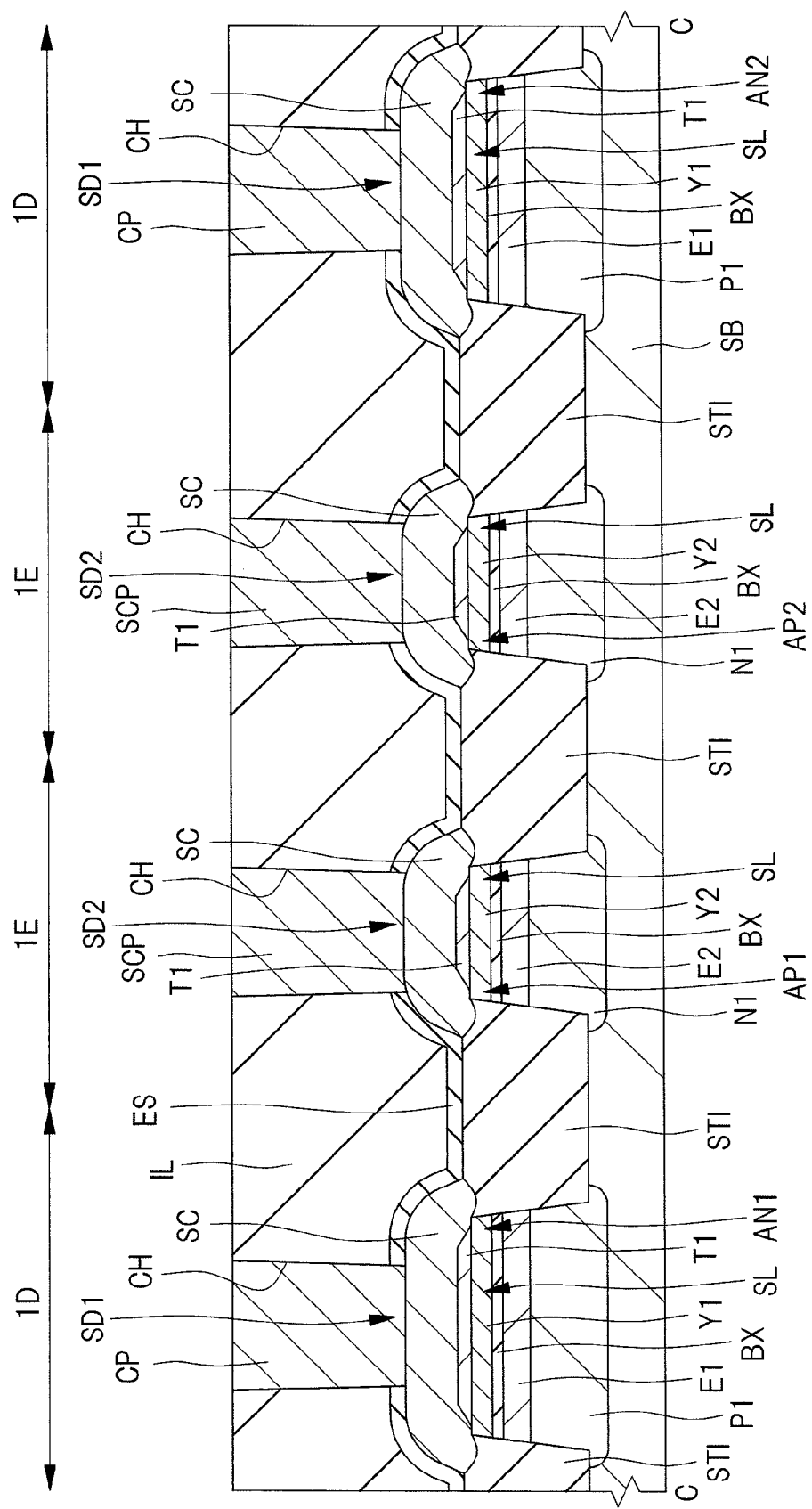
FIG. 33 is a cross-sectional view showing the method of manufacturing a semiconductor device continued from FIG. 31.
Figure 34:
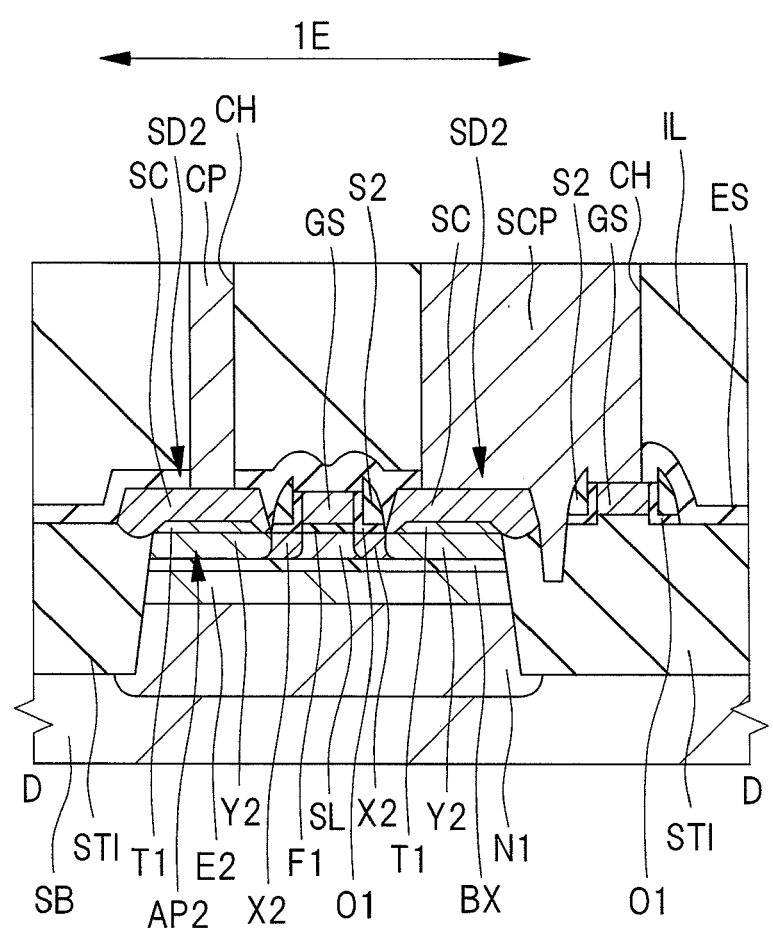
FIG. 34 is a cross-sectional view showing the method of manufacturing a semiconductor device continued from FIG. 31.
Figure 35:
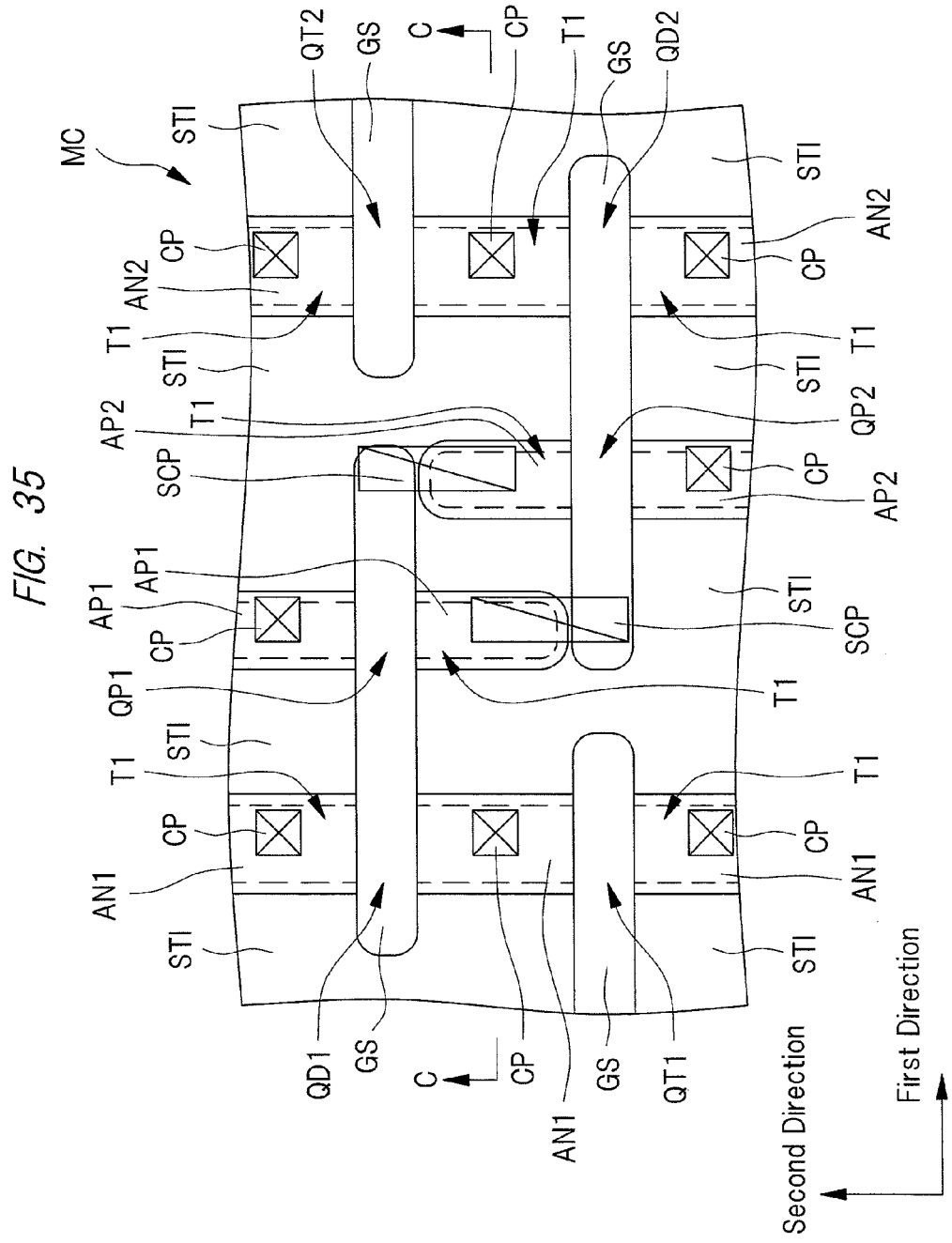
FIG. 35 is a plan view showing the method of manufacturing a semiconductor device continued from FIG. 32.
Figure 36:
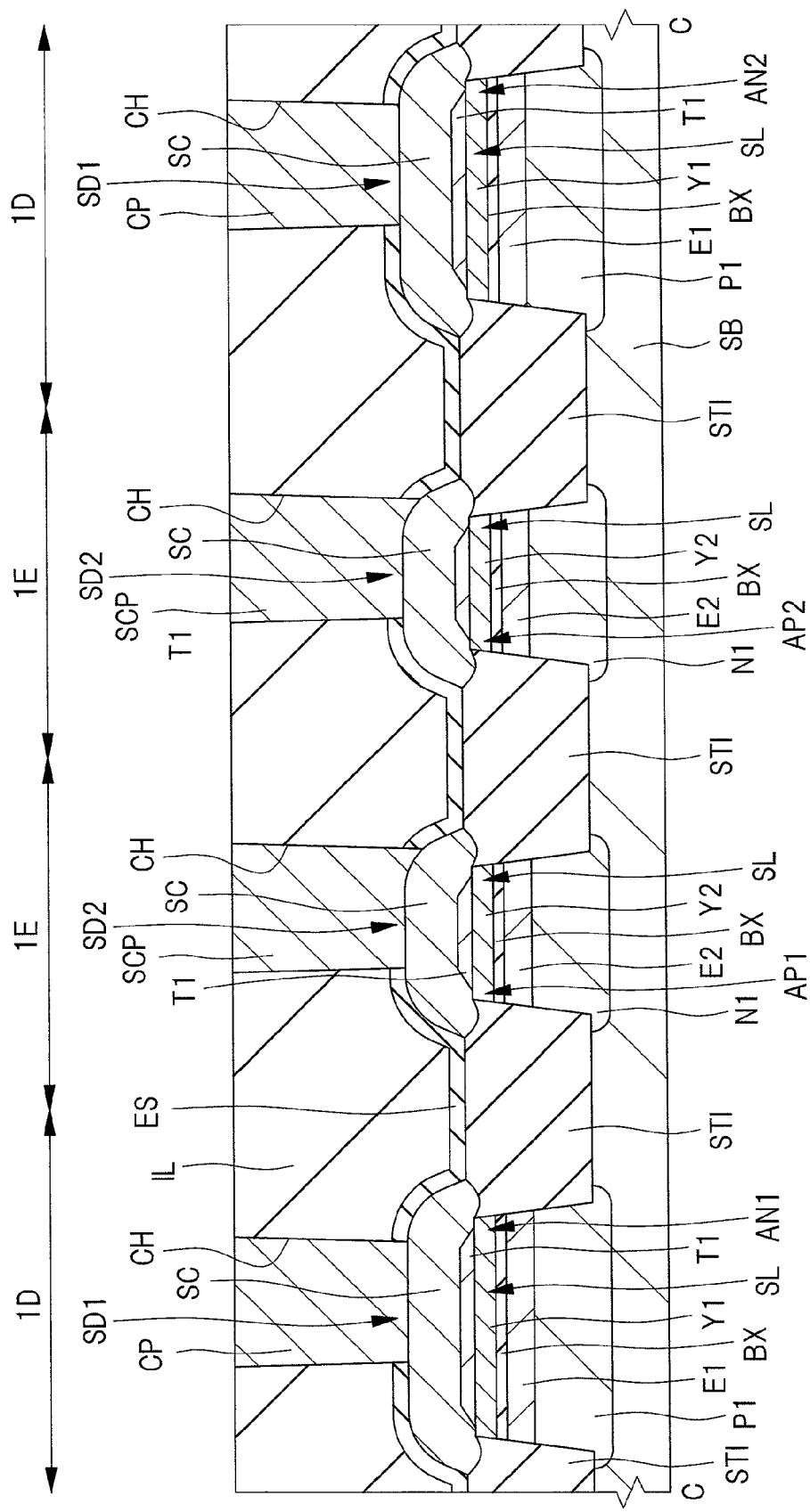
FIG. 36 is a cross-sectional view showing the method of manufacturing a semiconductor device continued from FIG. 32.
Figure 37:
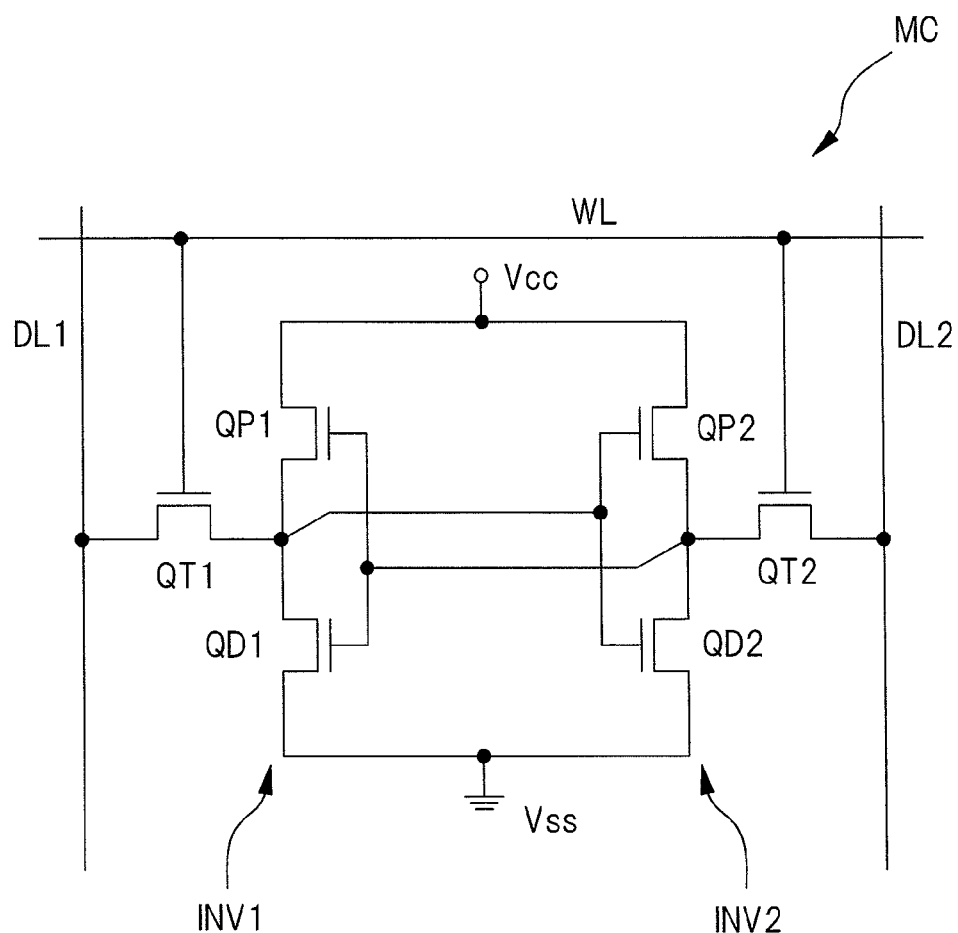
FIG. 37 is an equivalent circuit diagram of the semiconductor device of the second embodiment.

The present embodiment explains a case in which a structure in which the widths of the epitaxial layers explained in the above-described embodiment are increased is applied to a SRAM. Hereinafter, manufacturing steps of a semiconductor device of the present embodiment will be described with reference to FIG. 31 to FIG. 37. FIG. 31, FIG. 33, FIG. 34, and FIG. 36 are cross-sectional views used for explaining the manufacturing steps of the semiconductor device of the present embodiment. FIG. 32 and FIG. 35 are plan views used for explaining the manufacturing steps of the semiconductor device of the present embodiment. FIG. 37 is an equivalent circuit diagram used for explaining the structure of a SRAM formed in the present embodiment.

In FIG. 32 and FIG. 35, the boundary between an SOI layer below an epitaxial layer formed on an SOI layer, in other words, an active region AN1, AN2, AP1, or AP2 and an isolation region STI is shown by a broken line. In FIG. 32 and FIG. 35, the shapes of patterns covered with shared contact plugs SCP are transparently shown.

Figure 31:
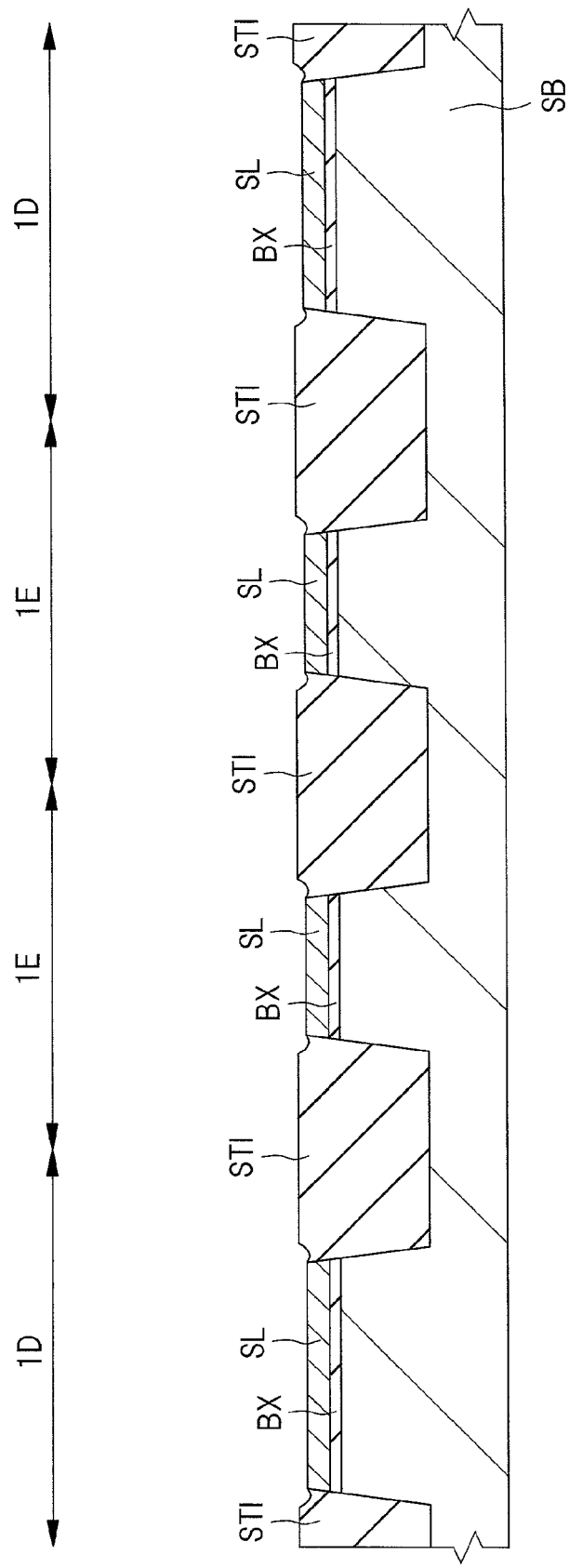
FIG. 31 is a cross-sectional view showing a method of manufacturing a semiconductor device according to a second embodiment of the present invention.
Figure 32:
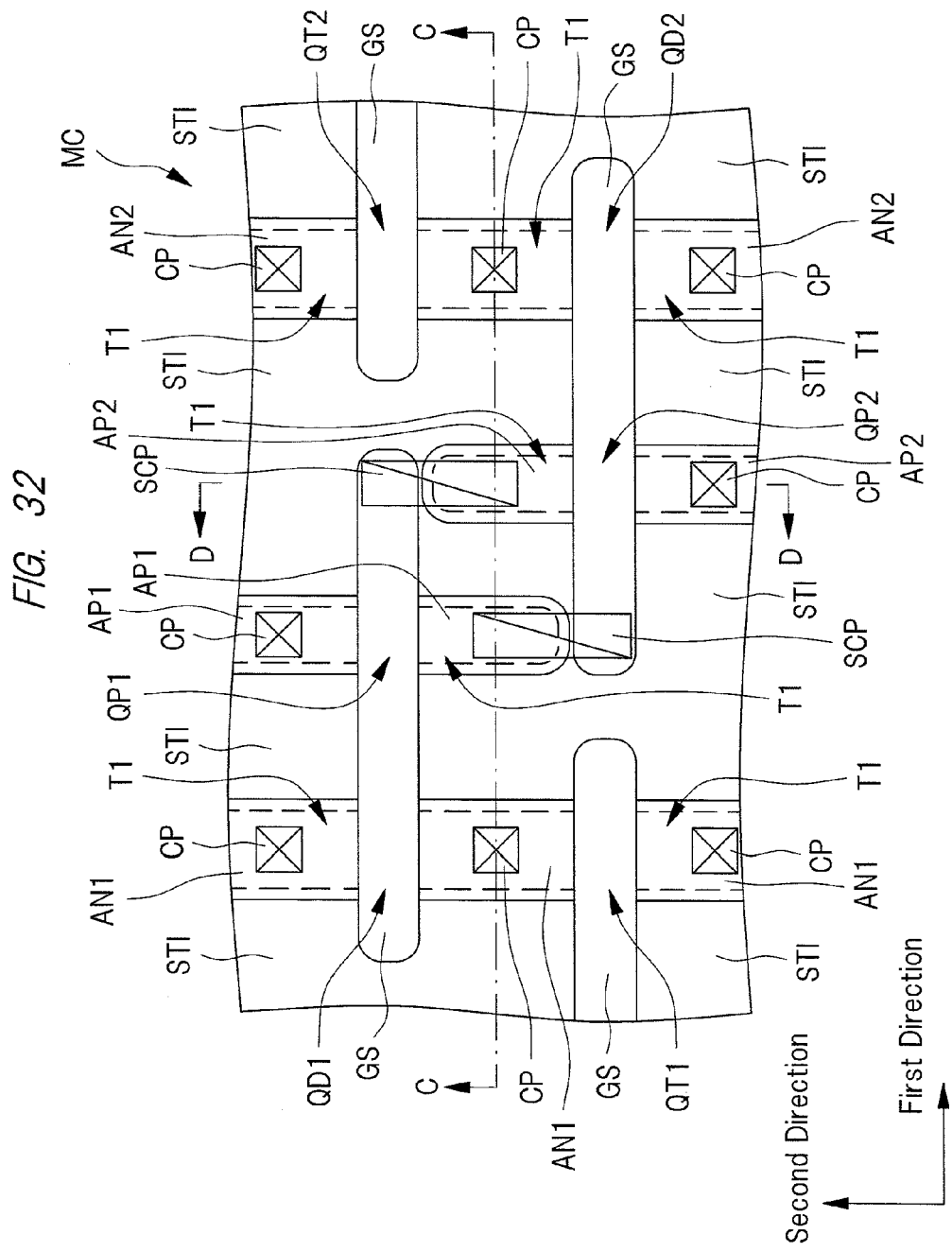
FIG. 32 is a plan view showing the method of manufacturing a semiconductor device continued from FIG. 31.

First, as shown in FIG. 31, an SOI substrate is prepared, and a plurality of isolation regions STI, which separate a plurality of regions on the SOI substrate, are formed. In other words, the steps described with reference to FIG. 1 and FIG. 2 are carried out. In FIG. 31, different from the above-described first embodiment, the region in which the SOI layer is removed to form the bulk substrate is not shown, and only the SOI substrate is shown. Thus, all the MISFETS which constitute the SRAM formed in the present embodiment are formed on the SOI substrate. FIG. 31 shows, sequentially from the left side of the drawing, formation regions of four elements, i.e., an N-type SOI-MISFET, a P-type SOI-MISFET, a P-type SOI-MISFET, and an N-type SOI-MISFET.

The cross-sectional view shown in FIG. 31 is not showing a cross-section in the gate-length direction like FIG. 26, but is a cross section along the gate-width direction of the MISFETs, which are to be formed in later steps, as well as FIG. 27 and shows a location in which source/drain regions of the MISFETs are formed. FIG. 31 is the cross-sectional view at the same position as those of later-described FIG. 33 and FIG. 36. Hereinafter, the N-type MISFET will be referred to as NMIS, and the P-type MISFET will be referred to as PMIS. In FIG. 31, among four juxtaposed element formation regions, the regions at left/right both ends of the drawing are referred to as NMIS regions 1D, and the two regions at the center are referred to as PMIS regions 1E.

Then, among the steps described with reference to FIG. 3 to FIG. 27, the steps carried out for the formation region of the N-type SOI-MISFET in the SOI region 1A (see FIG. 26) are carried out for the NMIS region 1D, and the steps carried out for the formation region of the P-type SOI-MISFET in the SOI region 1A (see FIG. 26) are carried out for the PMIS region 1E. As a result, as shown in FIG. 32 to FIG. 34, a memory cell MC of the SRAM formed of six PMISs and NMISs is formed, and contact plugs CP and the shared contact plugs SCP connected to the memory cell MC are formed. Then, although illustration is omitted, when wiring is formed on the contact plugs CP and on the shared contact plugs SCP, a semiconductor device is almost completed.

FIG. 32 shows a planar layout of the memory cell MC, which is one unit composed of six MISFETs. FIG. 33 is a cross-sectional view along the gate-width direction of the MISFETs and is a cross-sectional view at a line C-C of FIG. 32. FIG. 34 is a cross-sectional view in the vicinity of the shared contact plug SCP, which connects a drain region of a later-described load MISFET QP2, a gate electrode GS of a load MISFET QP1, and a gate electrode GS of a drive MISFET QD1 (see FIG. 32), wherein a cross-sectional view along the gate-length direction of the load MISFETs QP1 and QP2 is shown. The shared contact plugs SCP are conductors formed in the same steps as those of the contact plugs CP.

FIG. 32 shows the gate electrodes GS and the shared contact plugs SCP connected to the upper surfaces of the active regions AP1 and AP2, respectively. FIG. 32 shows the contact plugs CP connected to the upper surfaces of the active regions AP1, AP2, AN1, and AN2 of the MISFETs. Although not shown in the drawing, the contact plugs CP are connected also onto the gate electrodes GS to which the shared contact plugs SCP are not connected.

In the structures shown in FIG. 32 to FIG. 34, the contact plugs CP and the shared contact plugs CP are formed without misalignment of the formation positions thereof. As shown in FIG. 33 and FIG. 34, as a characteristic of the present embodiment, an epitaxial layer T1 on an SOI layer SL constituting the source/drain regions of the MISFETs is formed to protrude to the isolation region STI side from the upper surface end of the SOI layer SL by 5 nm or more in the lateral direction.

The SRAM formed by the above-described steps will be explained below.

First, an equivalent circuit of the memory cell constituting the SRAM will be explained. As shown in the equivalent circuit diagram of FIG. 37, the memory cell MC is disposed at the intersecting part of a pair of complementary data lines (a data line DL1 and a data line DL2) and a word line WL and is composed of a pair of drive MISFET QD1 and QD2, the pair of load MISFETs QP1 and QP2, and a pair of transfer MISFETs QT1 and QT2. The drive MISFETs QD1 and QD2 and the transfer MISFETs QT1 and QT2 are formed of NMISs, and the load MISFETs QP1 and QP2 are formed of PMISs.

Among the above-described six MISFETs constituting the memory cell MC, the drive MISFET QD1 and the load MISFET QP1 constitute a CMIS (Complementary Metal Insulator Semiconductor) inverter INV1, and the drive MISFET QD2 and the load MISFET QP2 constitute a CMIS inverter INV2.

Input/output terminals (accumulation nodes A and B) of the pair of CMIS inverters INV1 and INV2 are cross-coupled to each other to constitute a flip-flop circuit as an information accumulation part, which stores information of 1 bit. One of the input/output terminals (the accumulation node A) of the flip-flop circuit is connected to one of the source region and the drain region of the transfer MISFET QT1, and the other input/output terminal (the accumulation node B) is connected to one of the source region and the drain region of the transfer MISFET QT2.

Furthermore, the other one of the source region and the drain region of the transfer MISFET QT1 is connected to the data line DL1, and the other one of the source region and the drain region of the transfer MISFET QT2 is connected to the data line DL2. A first end of the flip-flop circuit (the source regions of the load MISFETs QP1 and QP2) is connected to a power-supply voltage (Vcc), and a second end thereof (the source regions of the drive MISFETs QD1 and QD2) is connected to a reference voltage (Vss).

Working of the above-described circuit will be explained. When the accumulation node A of the CMIS inverter INV1 in one side is at a high electric potential (H), the drive MISFET QD2 becomes ON; therefore, the accumulation node B of the other CMIS inverter INV2 is at a low electric potential (L). Therefore, the drive MISFET QD1 becomes OFF, and the high electric potential (H) of the accumulation node A is maintained. Thus, while the mutual state of the accumulation nodes A and B is maintained by a latch circuit cross-coupling the pair of CMTS inverters INV1 and INV2 and while the power-supply voltage is applied, information is maintained.

The word line WL is connected to the gate electrodes of the transfer MISFETs QT1 and QT2, and conduction/non-conduction of the transfer MISFETs QT1 and QT2 is controlled by the word line WL. More specifically, when the word line is at a high electric potential (H), the transfer MISFETs QT1 and QT2 are ON, and the latch circuit and the complementary data lines (the data lines DL1 and DL2) are electrically connected; therefore, the electric-potential state (H or L) of the accumulation nodes A and B appears on the data lines DL1 and DL2 and is read as the information of the memory cell MC.

In order to write information to the memory cell MC, the word line WL is caused to be at a (H) electric-potential level, the transfer MISFETs QT1 and QT2 are caused to be in an ON state, and the information of the data lines DL1 and DL2 is transmitted to the accumulation nodes A and B. In the above-described manner, the SRAM can be operated.

Next, the layout configuration of the SRAM in the present embodiment will be explained. The memory cell MC of the SRAM is composed of, for example, as shown in FIG. 32, six field-effect transistors, i.e., the pair of drive MISFETs QD1 and QD2 formed on the semiconductor substrate, the pair of load MISFETs QP1 and QP2, and the pair of transfer MISFETs QT1 and QT2. In this case, the pair of drive MISFETs QD1 and QD2 and the pair of transfer MISFETs QT1 and QT2 are formed of NMISs, and the pair of load MISFETs QP1 and QP2 are formed of PMISs.

Specifically, the semiconductor substrate is partitioned into the plurality of active regions AN1, AN2, AP1, and AP2 by the isolation regions STI. The plurality of active regions AN1, AN2, AP1, and AP2 partitioned by the isolation regions STI have structures which are juxtaposed in a first direction, which is the direction along the main surface of the semiconductor substrate, are disposed so as to extend in a second direction orthogonal to the first direction, and surround the peripheries of the active regions AN1, AN2, AP1, and AP2 by the isolation regions STI.

In the active regions AN1 and AN2 in which NMISs are formed, source regions and drain regions are formed by introducing an n-type impurity such as P (phosphorous) or As (arsenic) into the active regions AN1 and AN2. Then, the gate electrodes GS are formed via a gate insulating film on the active regions AN1 and AN2 between the source regions and the drain regions.

Each of the plurality of gate electrodes GS is extending in the first direction intersecting with the second direction in which the active regions AN1 and AN2 extend. In this manner, the NMISs are formed by the gate electrodes GS, which are formed on the active regions AN1 and AN2, and the source regions and the drain regions, which are formed in the active regions AN1 and AN2 so as to sandwich the gate electrodes GS. Similarly, the PMISs are formed by the gate electrodes GS, which are formed on the active regions AP1 and AP2, and the source regions and the drain regions, which are formed in the active regions AP1 and AP2 so as to sandwich the gate electrodes GS.

For example, in the memory cell MC of the SRAM, the drive MISFET QD1 and the transfer MISFET QT1 are formed in the same active region AN1 by the source regions, the drain regions, and the two gate electrodes GS formed in the active region AN1. Moreover, the load MISFET QP1 is formed by the source region, the drain region, and the gate electrode GS formed in the active region AP1, and the load MISFET QP2 is formed by the source region, the drain region, and the gate electrode GS formed in the active region AP2. Similarly, the drive MISFET QD2 and the transfer MISFET QT2 are formed in the same active region AN2 by the source regions, the drain regions, and the gate electrodes GS formed in the active region AN2.

As shown in FIG. 33, in the active regions in which the source/drain regions are formed, also in the NMIS region 1D and the PMIS region 1E, as well as the structure shown in FIG. 27, the epitaxial layer T1 is formed to be in contact with each of the upper surfaces of the plurality of SOI layers SL on the upper surface of the SOI substrate, and a silicide layer SC is formed on the surfaces of each epitaxial layer T1.

In the SOI layer SL of the NMIS region 1D, in other words, in the active regions AN1 and AN2, a semiconductor region Y1 is formed, and the semiconductor region Y1 and the epitaxial layer T1 constitute an n-type diffusion layer SD1. A semiconductor region Y2 is formed in the SOI layer SL in the PMIS region 1E, in other words, in the active regions AP1 and AP2, and the semiconductor region Y2 and the epitaxial layer T1 constitute a p-type diffusion layer SD2. The contact plugs CP are connected to the upper surface of the silicide layer SC in the NMIS region 1D, and the shared contact plugs SCP are connected to the upper surface of the silicide layers SC in the PMIS region 1E.

As shown in FIG. 32 and FIG. 33, the load MISFETs QP1 and QP2 have smaller dimensions of the active regions than those of the drive MISFETs QD1 and QD2 and the transfer MISFETs QT1 and QT2. This is for a reason that the load MISFETs QP1 and QP2 are elements for which high-speed operation and low power consumption is required. The load MISFETs QP1 and QP2 are formed to have particularly small dimensions among all the MISFETs on a semiconductor chip.

More specifically, for example as shown in FIG. 33, the widths of the active regions AP1 and AP2 in the gate-width direction are smaller than those of the active regions AN1 and AN2. Therefore, the contact plugs CP which are connected to the active regions AP1 and AP2 are required to have particularly high precision for the formation positions thereof.

Moreover, as shown in FIG. 34, the shared contact plug SCP has a larger width than that of the contact plug CP in the gate-length direction and is connected to the drain region of the load MISFET QP2, the gate electrode GS of the load MISFET QP1 (see FIG. 32), and the gate electrode GS of the drive MISFET QD1 (see FIG. 32). Both ends of the single shared contact plug SCP are terminated immediately above the silicide layer SC on the surface of the epitaxial layer T1 above the drain region and immediately above the gate electrode GS in the gate-length direction. As well as the above-described first embodiment, the epitaxial layer T1 is formed to be wide also in the gate-length direction and is formed so as to straddle the upper surfaces of the SOI layer SL and the isolation region STI adjacent to the SOI layer SL, which is the isolation region STI in which the gate electrode GS is formed immediately thereabove.

In some cases, the surface of the isolation region STI is exposed between the gate electrode GS and the epitaxial layer T1, which are connected by the shared contact plug SCP. This is for a reason that, as shown in FIG. 32, even when the shapes of the active regions and the gate electrodes GS in a plan view are desired to be, for example, rectangular, corners of the patterns thereof are rounded in practice, and the upper surface of the isolation region STI immediately below the shared contact plug SCP cannot be covered with the gate electrode GS or the like depending on the location in some cases.

Therefore, as shown in FIG. 34, the shared contact plug SCP is formed also in the hole formed in the upper surface of the isolation region STI exposed between the gate electrode GS and the epitaxial layer T1. This is for a reason that, if the isolation region STI is exposed in the formation step of the contact hole CH, the isolation region STI is also partially removed by etching of forming the contact hole CH as described with reference to FIG. 30. In this manner, in some cases, the shared contact plug SCP is formed to be in contact with the isolation region STI, which is exposed between the gate electrode GS and the epitaxial layer T1.

Figure 51:
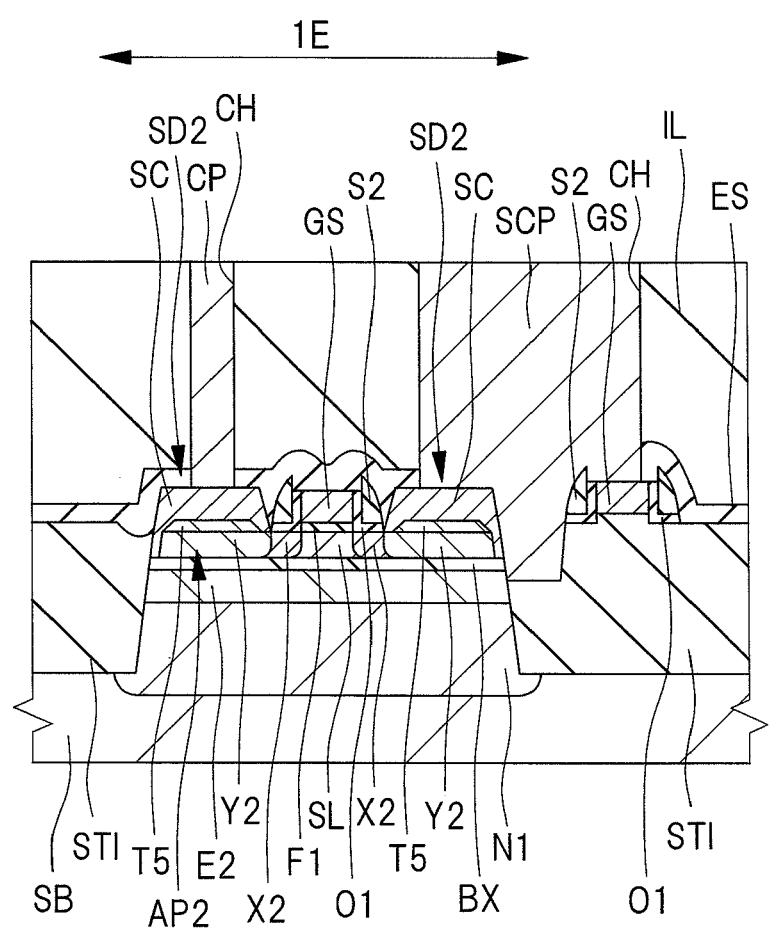
FIG. 51 is a plan view showing a method of manufacturing a semiconductor device of a comparative example.

As a comparative example, FIG. 51 which is a cross-sectional view of the same location as FIG. 34 is shown, wherein it is a cross-sectional view of a case in which an epitaxial layer T5 is formed at a width equivalent to that of the upper surface of the SOI layer SL exposed from an insulating film immediately therebelow. In the comparative example shown in FIG. 51, at the location where the shared contact plug SCP is formed, the isolation region STI adjacent to the SOI layer SL is not covered with the gate electrode GS, the epitaxial layer T5, or the silicide layer SC. Therefore, the semiconductor substrate SB below the SOI layer SL, the SOI layer SL, and the gate electrode GS are connected to the shared contact plug SCP, and a problem that the semiconductor device does not normally operates occurs.

More specifically, when an SRAM is formed on an SOI substrate in the above-described manner, even if the formation position of the contact plug is not misaligned, the isolation region STI is exposed between the epitaxial layer T5 and the gate electrode GS in some cases. In such a case, the shared contact plug SCP is buried in the opening of the isolation region STI, and the SOI layer SL and the gate electrode GS may be mutually conducted to the semiconductor substrate SB.

On the other hand, in the present embodiment, as shown in FIG. 34, the epitaxial layer T1 and the silicide layer SC formed on the surface thereof are formed so as to straddle the upper surface of the SOI layer SL and the upper surface of the isolation region STI; therefore, the shared contact plug SCP, which is buried in the contact hole CH formed in the isolation region STI, is distant from the semiconductor substrate SB, which is immediately below the SOI layer SL. Therefore, the SOI layer SL and the gate electrode GS can be prevented from being conducted to the semiconductor substrate SB, and the reliability of the semiconductor device can be improved.

When the epitaxial layer T1 is formed to be wide so as to be placed immediately on the isolation region STI, the upper surface of the isolation region STI which is exposed between the SIO layer SL and the gate electrode GS can be completely covered with the epitaxial layer T1. More specifically, the lateral-direction width of the epitaxial layer T1 can be formed to be increased so as to be in contact with the sidewall S2 at the sidewall of the gate electrode GS on the isolation region STI. In this case, in the vicinity of the SOI layer SL, the contact hole CH can be prevented from being formed in the isolation region STI; therefore, the shared contact plug SCP buried in the contact hole CH can be prevented from being connected to the semiconductor substrate SB below the SOI layer SL.

Next, a case in which the formation positions of the contact plugs are formed to be misaligned in the gate-width direction will be described with reference to FIG. 35 and FIG. 36. FIG. 36 is a cross-sectional view at a line C-C of FIG. 35. In FIG. 35, boundaries between the active regions AN1 and AN2, in other words, the SOI layer and the isolation regions STI are shown by broken lines.

As shown in FIG. 35 and FIG. 36, even if the formation positions of the contact plugs CP and the shared contact plugs SCP are formed to be misaligned, the contact plugs CP connected to the active regions AN1 and AN2 having comparatively large dimensions in the memory cell MC are conceived to be formed within the active regions AN1 and AN2 in a plan view. However, even if the misalignment of the formation positions of the contact plugs are small like that, some of the contact plugs CP and the shared contact plugs SCP connected to the active regions AP1 and AP2 having comparatively small dimensions in the memory cell MC may be formed to protrude from ends of the active regions AP1 and AP2 to the isolation regions STI side.

Figure 52:
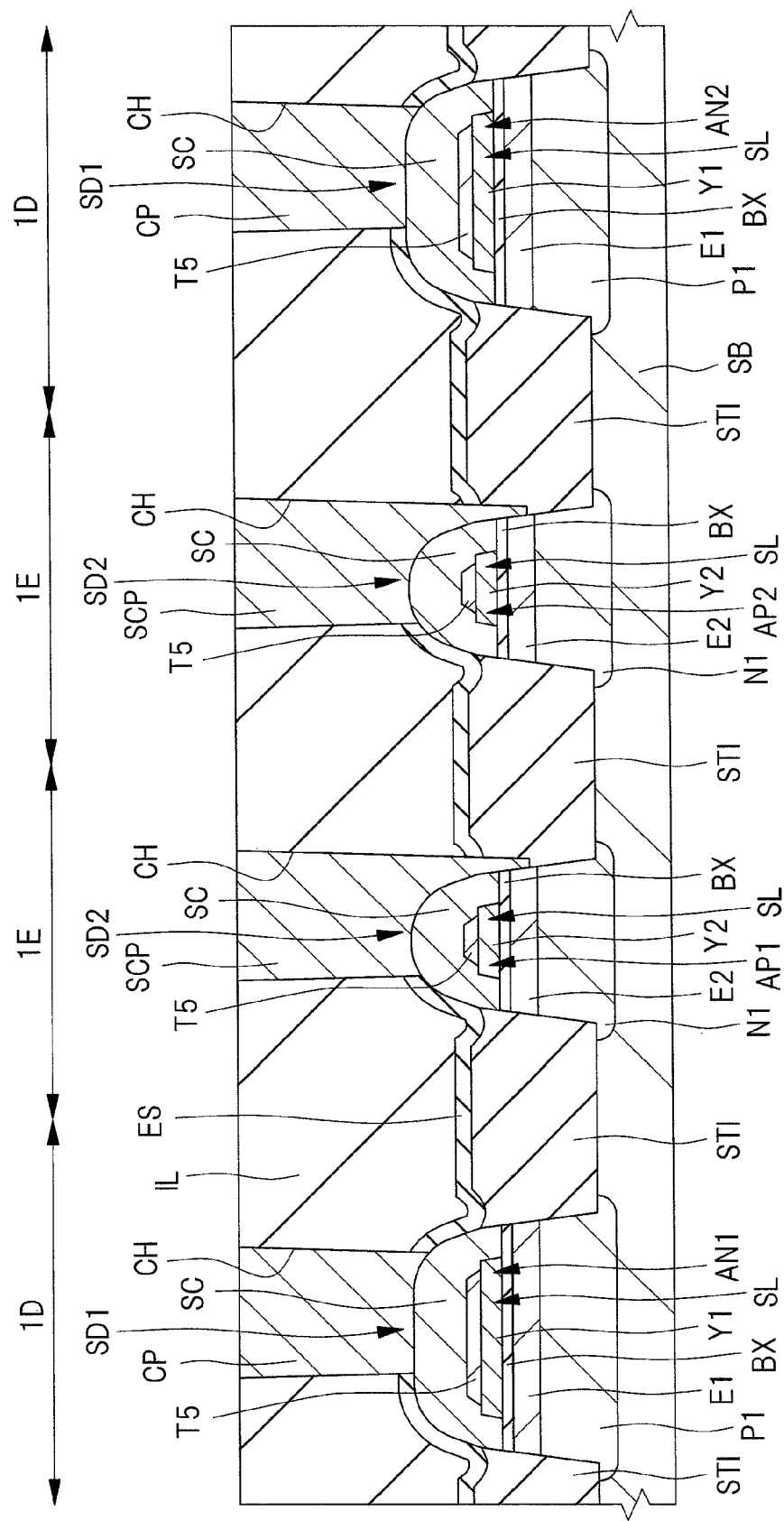
FIG. 52 is a plan view showing a method of manufacturing a semiconductor device of a comparative example.

FIG. 52, which is a cross-sectional view of the same location as FIG. 36, is shown as a comparative example, wherein FIG. 52 is a cross-sectional view of a case in which, when the formation positions of the plugs are misaligned in this manner, the epitaxial layer T5 is formed to have an equivalent width as that of the upper surface of the SOI layer SL exposed from each insulating film immediately below the epitaxial layer T5.

As described with reference to FIG. 36, if the misalignment of the formation positions of the plugs is small, the contact plugs CP connected to the active regions AN1 and AN2 are formed not to protrude from immediately above the active regions AN1 and AN2 to the isolation region STI side; and, also in the comparative example shown in FIG. 52, conduction between the contact plugs CP and the semiconductor substrate SB does not occur. However, even if the misalignment of the formation positions of the plugs is small in this manner, the contact plugs CP and the shared contact plugs SCP connected to the active regions AP1 and AP2 formed to have smaller dimensions than those of the active regions AN1 and AN2 may be formed to protrude from immediately above the active regions AP1 and AP2 to the isolation region STI side in the plan view.

As shown in FIG. 52, which is the comparative example, the epitaxial layer T5 and the silicide layer SC formed on the surface thereof are not covering the upper surface of the isolation region STI adjacent to the SOI layer SL. Therefore, the contact plugs CP of which formation positions are misaligned from immediately above the active regions AP1 and AP2 to the isolation region STI side may be connected to the semiconductor substrate SB as described with reference to FIG. 50. In that case, the load MISFETs do not normally operate, and a problem that the reliability of the semiconductor device is reduced occurs.

Moreover, as described with reference to FIG. 50, since the lateral-direction width of the epitaxial layer T5 (see FIG. 52) is small, the same-direction ends of the SOI layer SL are silicided, and the resistance of the source/drain regions of the load MISFETs is increased. In that case, it becomes difficult to increase the operation speed of and reduce the power consumption of the SRAM. Therefore, a problem that the performance of the semiconductor device is reduced occurs.

As described above, the active regions AP1 and AP2 of the load MISFETs QP1 and QP2 constituting the SRAM are the patterns which particularly have small dimensions on the semiconductor chip. Therefore, the contact plugs CP and the shared contact plugs SCP (see FIG. 35) connected to the active regions AP1 and AP2 easily cause short-circuiting with the semiconductor substrate due to the misalignment of the formation positions thereof.

On the other hand, in the present embodiment, as shown in FIG. 36, the epitaxial layer T1 and the silicide layer SC formed on the surface thereof are formed so as to straddle the upper surface of the SOI layer SL and the upper surface of the isolation region STI. Therefore, even if the formation positions of the contact plugs CP and the shared contact plugs SCP (see FIG. 35) are misaligned, the silicide layer SC covering the upper surfaces of the isolation regions STI serve as a receiver of the contact plugs CP and the shared contact plugs SCP (see FIG. 35).

Therefore, the contact plugs CP and the shared contact plugs SCP (see FIG. 35) can be prevented from being connected to the active regions AP1 and AP2, which constitute the load MISFETs QP1 and QP2, in other words, to the semiconductor substrate SB immediately below the SOI layer SL. By virtue of this, the reliability of the semiconductor device can be prevented from being reduced.

Moreover, since the epitaxial layer T1 (see FIG. 36) is formed to have a larger width compared with the comparative example shown in FIG. 52, the ends of the SOI layer SL can be prevented from being silicided. As a result, reduction in the volume of the SOI layer SL and increase in the parasitic resistance caused by reduction in the contact area between the SOI layer SL and the silicide layer SC can be prevented. Therefore, the load MISFETs QP1 and QP2 can be normally operated, and the reliability of the semiconductor device can be therefore improved. Moreover, since the parasitic resistance of the MISFETs constituting the SRAM is reduced, the performance of the semiconductor device can be improved.

As described above, in the present embodiment, even in a memory cell of a SRAM in which short-circuiting between a semiconductor substrate and elements easily occur due to positional misalignment of contact plugs, effects similar to those of the above-described embodiment can be obtained. Moreover, the shared contact plug may be short-circuited with the semiconductor substrate even in a case in which positional misalignment of the contact plugs does not occur in the SRAM; however, by increasing the width of the epitaxial layer, the above-described short-circuiting can be prevented, and the reliability of the semiconductor device can be improved.

Third Embodiment

In the present embodiment, as well as the above-described first embodiment and the above-described second embodiment, prevention of malfunctioning of MISFETs caused when contact plugs connected to active regions are overlapped with inactive regions in a plan view in a semiconductor device having an SOI substrate will be explained. The present embodiment is characterized in that, when a SRAM is formed by an SOI substrate, transfer MISFETs and drive MISFETs are formed on the SOI substrate, and load MISFETs are formed on a bulk silicon substrate.

Manufacturing steps of a semiconductor device of the present embodiment will be described with reference to FIG. 38 to FIG. 42. FIG. 38 and FIG. 40 to FIG. 42 are cross-sectional views used for explaining the manufacturing steps of the semiconductor device of the present embodiment. FIG. 39 is a plan view used for explaining the manufacturing steps of the semiconductor device of the present embodiment.

Figure 38:
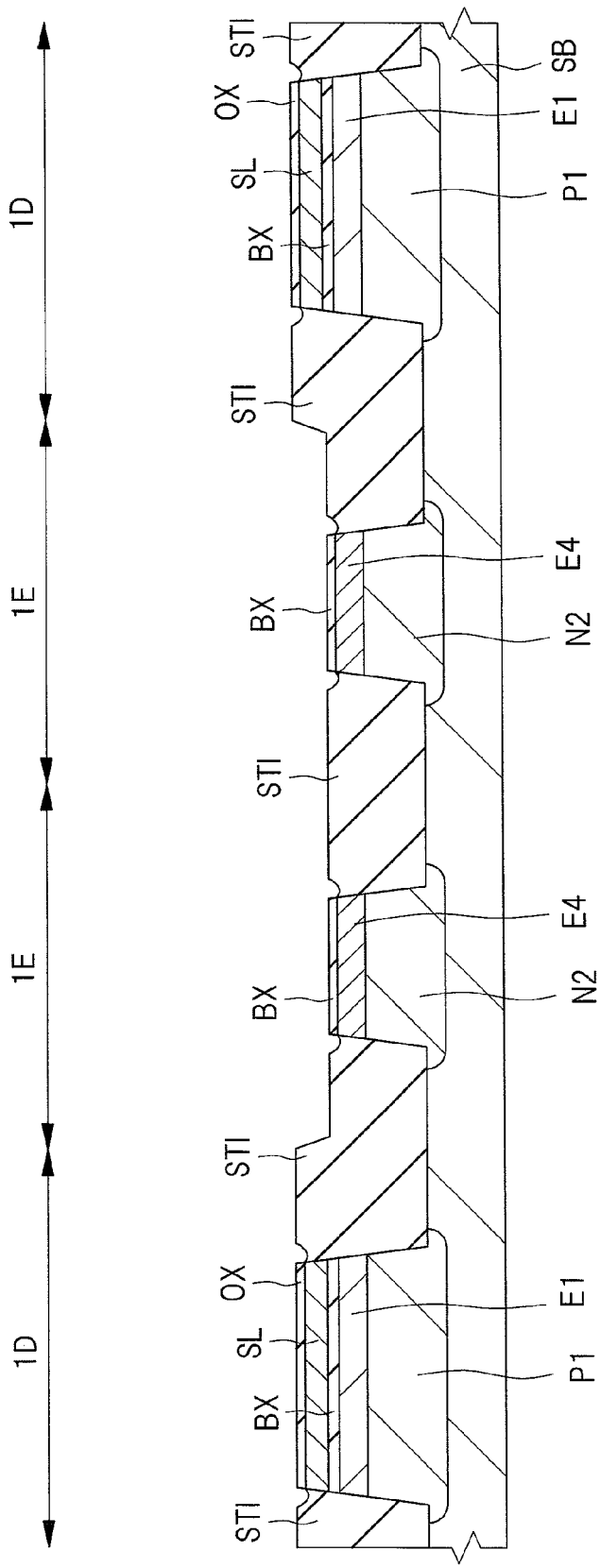
FIG. 38 is a cross-sectional view showing a method of manufacturing a semiconductor device according to a third embodiment of the present invention.
Figure 39:
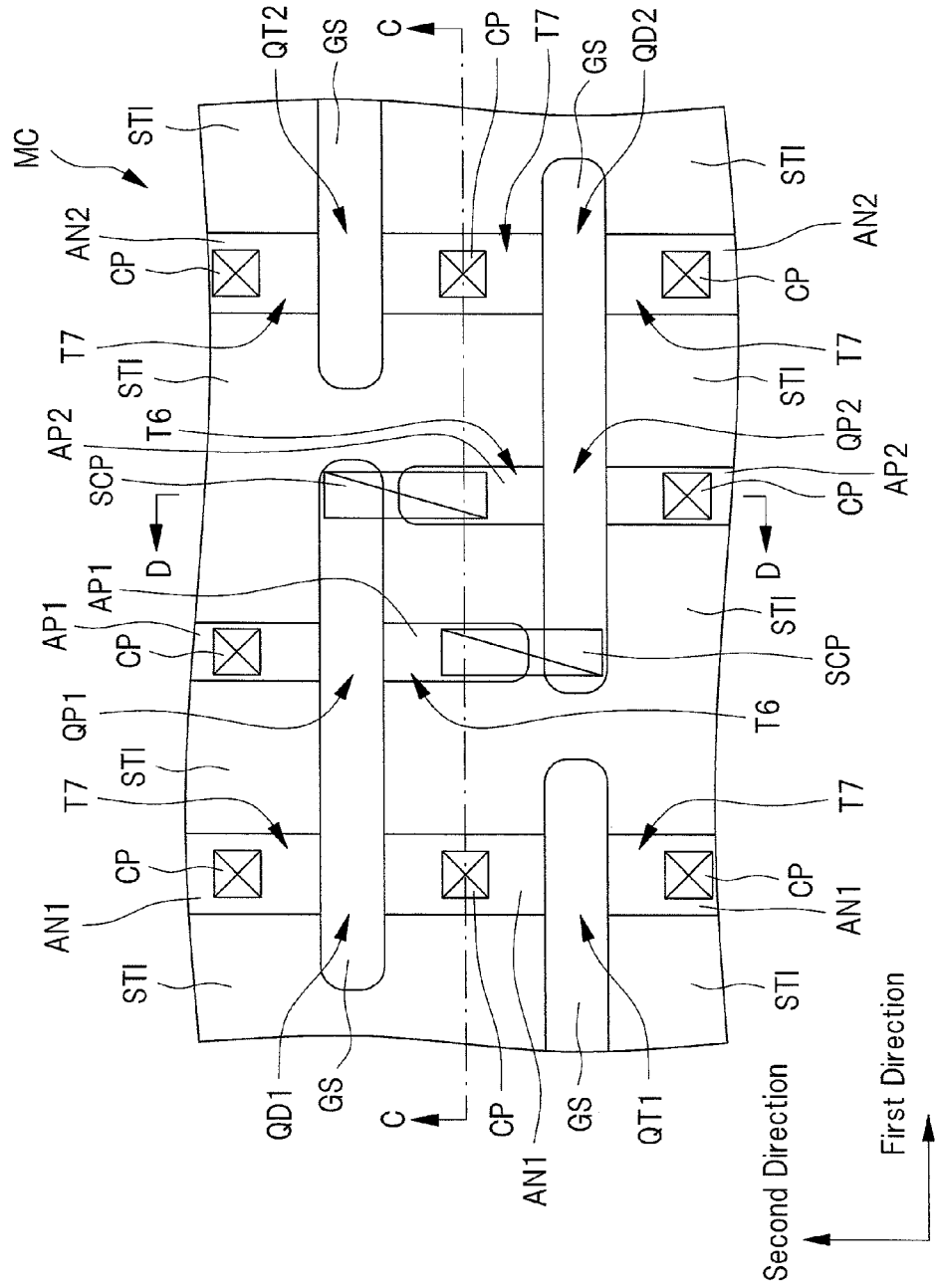
FIG. 39 is a plan view showing the method of manufacturing a semiconductor device continued from FIG. 38.

First, as shown in FIG. 38, an SOI substrate having an upper surface on which a plurality of isolation regions STI are formed is prepared by carrying out the steps described with reference to FIG. 1 and FIG. 2. Then, an SOI region and a bulk region are formed on the semiconductor substrate SB by carrying out the steps described with reference to FIG. 3 to FIG. 7. As well as FIG. 31 used for explaining the above-described second embodiment, FIG. 38 shows formation regions of four MISFETs, i.e., a NMIS region 1D, a PMIS region 1E, a PMIS region 1E, and a NMIS region 1D sequentially from the left side of the drawing. FIG. 38 shows the regions in which source/drain regions of the four MISFETs are formed.

In this step, the step carried out for the bulk region 1B in the step described with reference to FIG. 3 to FIG. 5 and FIG. 7 in the above-described first embodiment is carried out for the PMIS region 1E (see FIG. 38). Moreover, in this step, the step carried out for the SOI region 1A in the step described with reference to FIG. 3 to FIG. 5 and FIG. 7 in the above-described first embodiment is carried out for the NMIS region 1D (see FIG. 38). More specifically, the NMIS region 1D, which is a region in which transfer MISFETs and drive MISFETs constituting a SRAM are formed, is caused to be an SOI region, and the PMIS region 1E, which is a region in which load MISFETs constituting the SRAM are formed, is caused to be a bulk region.

Figure 40:
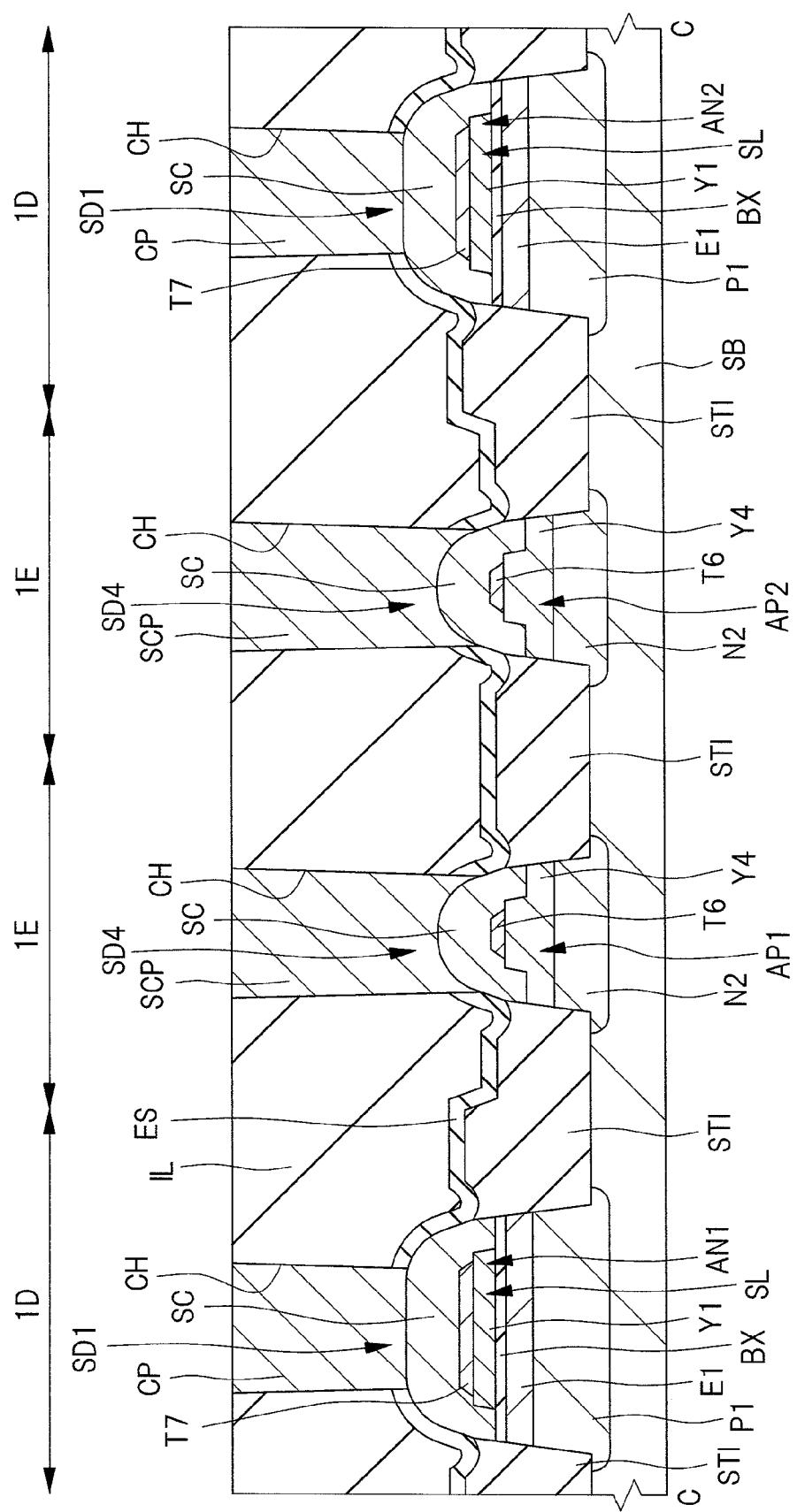
FIG. 40 is a cross-sectional view showing the method of manufacturing a semiconductor device continued from FIG. 38.

Then, as shown in FIG. 39 and FIG. 40, the steps carried out for the bulk region 1B in the steps described with reference to FIG. 8 to FIG. 27 are carried out for the PMIS region 1E (see FIG. 40). Moreover, in these steps, the steps carried out for the SOI region 1A in the steps described with reference to FIG. 8 to FIG. 27 are carried out for the NMIS region 1D (see FIG. 40). FIG. 40 is a cross-sectional view at a line C-C of FIG. 39 and is a cross-sectional view at the same location as FIG. 38. FIG. 39 and FIG. 40 show the structure of a case in which the formation positions of contact plugs are not misaligned.

As a result, a p-type bulk-MISFET is formed in the PMIS region 1E, and an N-type SOI-MISFET is formed in the NMIS region 1D. Contact plugs CP or shared contact plugs CP are connected to the source/drain regions of the MISFETs. An epitaxial layer T6 is formed on the upper surface of the semiconductor substrate SB in the PMIS region 1E, and an epitaxial layer T7 is formed on the upper surface of the SOI layer SL in the NMIS region 1D.

However, in this case, different from the above-described first embodiment and the above-described second embodiment, the channel orientation is 0 degree, in other words, <110>. Moreover, the etching component of a gas supplied in an epitaxial growth step upon formation of the epitaxial layers T6 and T7 is increased to increase selectivity so that the epitaxial layers can be easily removed. Moreover, the time for carrying out the epitaxial growth is shorter than that of the above-described first embodiment and the above-described second embodiment. Therefore, the lateral-direction widths of the epitaxial layers T6 and T7 are approximately equivalent to the same-direction width of the semiconductor substrate SB serving as a base or the upper surface of the SOI layer SL serving as a base, and ends of the epitaxial layers T6 and T7 are not covering the upper surfaces of the adjacent isolation regions STI.

As shown in FIG. 39, the layout of a memory cell MC of the SRAM of the present embodiment is similar to the SRAM of the above-described second embodiment. As well as the above-described second embodiment, the lateral-direction widths of the active regions AP1 and AP2 in the PMIS regions 1E are smaller than the same-direction width of the NMIS region 1D. However, as described above, the widths of the epitaxial layers T6 and T7 formed herein are equivalent to the widths of the upper surfaces of the active regions exposed immediately therebelow, and this point is different from the above-described second embodiment. Moreover, since the active regions AP1 and AP2 are formed in the bulk region, gate electrodes GS constituting the load MISFETs QP1 and QP2 and the drive MISFETs QD1 and QD2 are formed to straddle the SOI region and the bulk region. On the other hand, the gate electrodes GS constituting the transfer MISFETs QT1 and QT2 are formed only in the SOI regions.

Figure 41:
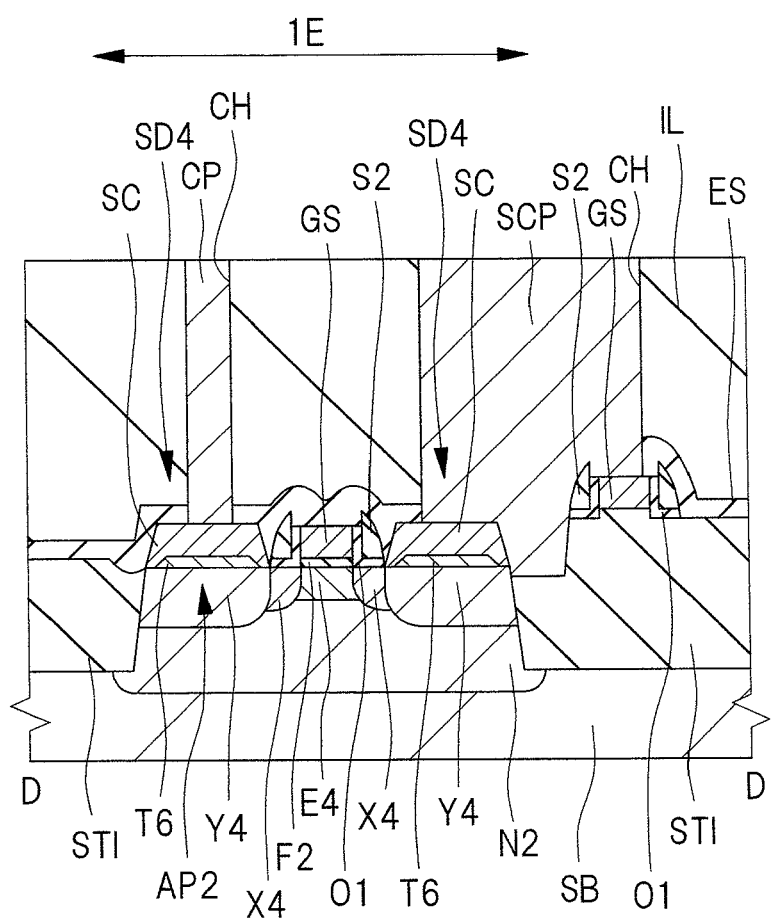
FIG. 41 is a cross-sectional view showing the method of manufacturing a semiconductor device continued from FIG. 38.

A cross-sectional view at a line D-D of FIG. 39 is shown in FIG. 41. The structure shown in FIG. 41 is similar to the structure shown in FIG. 34, but is different from the above-described second embodiment in a point that the width of the epitaxial layer T6 is small and in a point that the shared contact plug SCP is in contact with the semiconductor substrate SB. The epitaxial layer T6 is formed not to protrude from the boundary between the isolation region STI and the semiconductor substrate SB to the isolation region STI side and is not covering the upper surface of the isolation region STI.

Part of the isolation region STI exposed between the gate electrode GS and the semiconductor substrate SB is removed upon formation of the contact hole CH, and the shared contact plug SCP is buried in the hole formed as a result of that. In this process, since the epitaxial layer T6 is not covering ends of the upper surface of the isolation region STI, different from the structure shown in FIG. 34, the hole is formed not to be distant from the semiconductor substrate SB, but is formed so as to expose the surface of the semiconductor substrate SB at the sidewall of the trench in which the isolation region STI is buried. Therefore, the shared contact plug SCP formed in the contact hole CH is connected to the semiconductor substrate SB at the sidewall of the trench.

However, different from the comparative example described with reference to FIG. 51 in the above-described second embodiment, the load MISFETs QP1 and QP2 (see FIG. 39) in the PMIS regions 1E of the present embodiment are formed on the bulk silicon substrate; therefore, even if the shared contact plug SCP is connected to the semiconductor substrate SB at the sidewall in the trench of the isolation region STI, a problem of non-normal operation of the MISFET does not occur. This is for a reason that, while the characteristics of SOI-MISFETs are largely affected by the electric potential of the semiconductor substrate SB, which is present via the BOX film below the SOI layer, a supporting substrate formed via an insulating film below the active region is not present in the bulk region.

As described in the above-described second embodiment, immediately below the shared contact plug SCP connecting the gate electrode GS and the drain region of the load MISFET in the SRAM, the upper surface of the isolation region STI is exposed from, for example, the gate electrode GS in some cases. However, even in such a case, when the load MISFET is a bulk-MISFET, the MISFET can be prevented from malfunctioning, and the reliability of the semiconductor device can be improved.

If SOI-MISFETs are used in the SRAM, there is an advantage that impurity variations of the MISFETs can be suppressed. However, the influence exerted on the operation stability of the SRAM by the variations of a PMIS is comparatively smaller than that of a NMIS. More specifically, among the elements which constitute the SRAM, when the NMIS is formed on the SOI substrate, the operation stability of the SRAM is improved; however, even when the PMIS is formed on the SOI substrate, it does not greatly contribute to improvement of the operation stability of the SRAM. Therefore, even when, among the elements constituting the SRAM, the PMISs which are the load MISFETs are changed to bulk-MISFETs, adverse effects on the operation stability of the SRAM are not generated almost at all.

Figure 42:
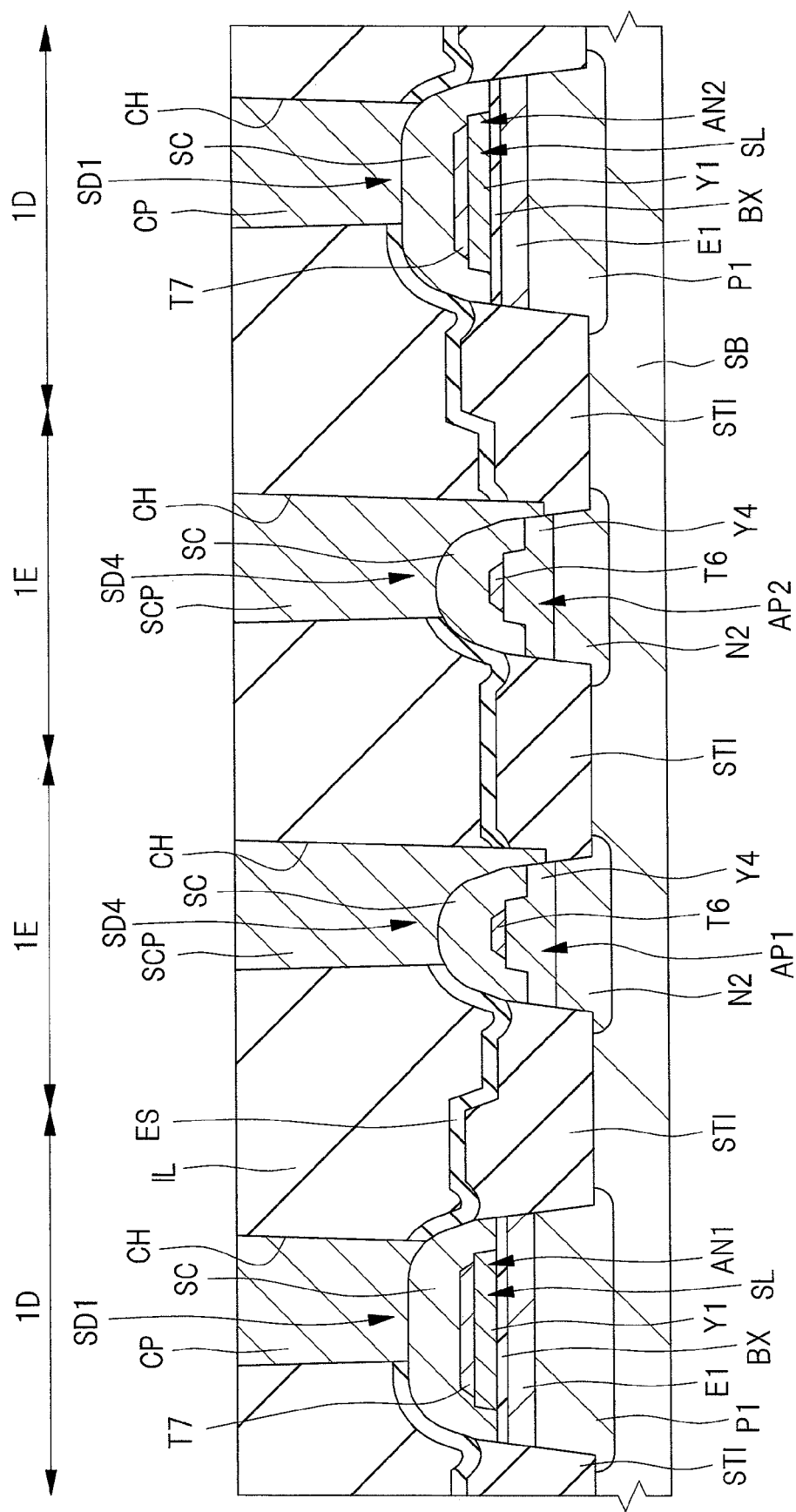
FIG. 42 is a cross-sectional view showing a semiconductor device of the third embodiment of the present invention.

Next, a case in which the formation positions of the contact plugs CP and the shared contact plugs SCP are misaligned will be described with reference to FIG. 42. FIG. 42 is a cross-sectional view of the semiconductor device of the present embodiment and is showing a cross section at the same location as FIG. 40.

As shown in FIG. 42, misalignment of the formation positions of the contact plugs CP is comparatively small; therefore, in the NMIS regions 1D in which the widths of the active regions AN1 and AN2 are larger than those in the MIS regions 1E, the contact plugs CP are formed only immediately above the silicide layer SC on the surface of the epitaxial layer T7 without protruding to the isolation region STI side and are not connected to the semiconductor substrate SB. On the other hand, in the active regions AP1 and AP2 having smaller widths in the gate-width direction than those of the active regions AN1 and AN2, part of each of the contact plugs SCP and the contact plugs CP (not shown) is formed to protrude to the isolation STI side and is connected to the semiconductor substrate SB at the sidewall of the trench in which the isolation region STI is buried.

If MISFETs in the PMIS regions 1E are formed on the SOI substrate, when the contact plugs CP connected to the source/drain regions of the MISFETs are connected to the semiconductor substrate, the MISFETs malfunction. However, as described above, in the present embodiment, the load MISFETs are formed on the bulk silicon substrate in the PMIS regions 1E; therefore, even if the contact plugs CP are connected to the semiconductor substrate SB due to positional misalignment, operation of the load MISFETs is not affected.

Thus, in the present embodiment, instead of forming all of the MISFETs, which constitute the SRAM, on the SOI substrate, the PMISs which are the load MISFETs are the bulk-MISFETs; therefore, even if the formation positions of the contact plugs CP are misaligned, the PMISs can be prevented from malfunctioning. By virtue of this, the reliability of the semiconductor device can be improved.

Since the widths of the epitaxial layers T6 and T7 are formed to be narrow in this case, it is conceivable that the ends of the upper surfaces of the SOI layer SL or the semiconductor substrate SB, which is the base thereof, may be silicided. However, since the layout dimensions of the active regions AN1 and AN2 in the NMIS regions 1D are large compared with those in the PMIS regions 1E, even if the ends are silicided, the parasitic resistance of the MISFETs are not greatly increased. Since the active regions AN1 and AN2 have large dimensions as described above, even if the upper ends of the source/drain regions are silicided from the lateral direction, the contact resistance between the silicide layer SC, which is formed as a result of this, and the source/drain regions is not greatly increased.

Moreover, since the active regions AP1 and AP2, which are bases of the epitaxial layer T6, are formed on the upper surface of the semiconductor substrate SB, which is thicker than the SOI layer SL, in the PMIS region 1E, even if the source/drain regions in the active regions are silicided from the lateral direction, the resistance thereof is not increased almost at all. Moreover, even if the upper ends of the active regions AP1 and AP2 are silicided from the lateral direction, the silicide layer SC formed as a result of this is in contact with the source/drain regions by the bottom surface thereof; therefore, the contact resistance between the silicide layer SC and the source/drain regions is not increased.

As described above, in the present embodiment, the PMISs particularly having small gate-width-direction dimensions are bulk-MISFETs instead of being SOI-MISFETs; as a result, increase in the parasitic resistance of the MISFETs caused by siliciding can be prevented. By virtue of this, the PMIS can be prevented from not normally operating, and the reliability of the semiconductor device can be improved. Moreover, since increase in the parasitic resistance of the PMISs can be prevented, the SRAM can be operated at a higher speed, and power consumption can be reduced. Therefore, the performance of the semiconductor device can be improved.

Figure 43:
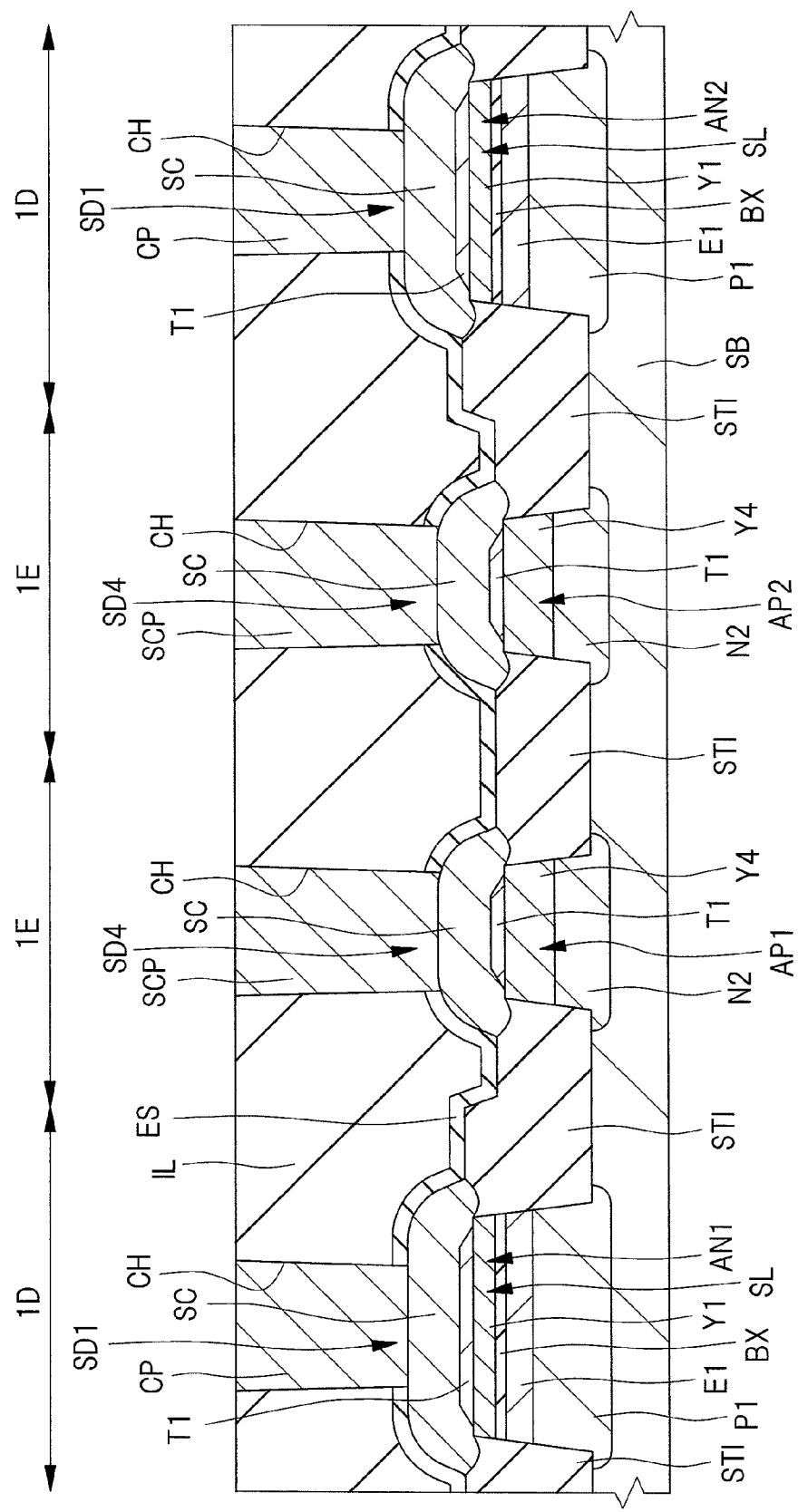
FIG. 43 is a cross-sectional view showing a semiconductor device of a modification example of the third embodiment of the present invention.
Figure 44:
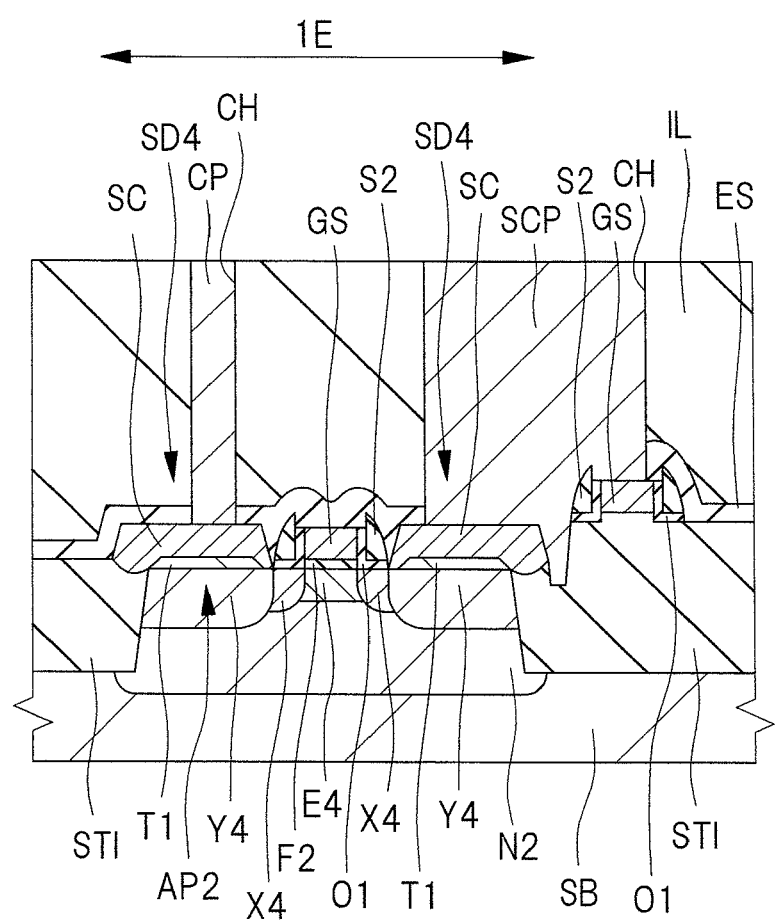
FIG. 44 is a cross-sectional view showing a semiconductor device of a modification example of the third embodiment of the present invention.

In the above-described second embodiment, preventing the contact plugs from being connected to the semiconductor substrate by increasing the width of the epitaxial layer has been explained, and this structure may be applied to the semiconductor device described with reference to FIG. 38 to FIG. 42. As a modification example, a structure of a case that PMISs which are load MISFETs constituting a SRAM are bulk-MISFETs and that the width of an epitaxial layer of each of MISFETs constituting the SRAM is formed to be increased is shown in FIG. 43 and FIG. 44. FIG. 43 is a cross-sectional view at the same location as FIG. 40, and FIG. 44 is a cross-sectional view at the same location as FIG. 41.

As shown in FIG. 43, the epitaxial layer T1 is formed to increase the width thereof so as to cover ends of the upper surfaces of the isolation regions STI adjacent to the active regions AP1, AP2, AN1, and AN2; therefore, margins of the positional misalignment of the contact plugs CP can be increased. Therefore, even if the formation positions of the contact plugs CP are misaligned, the contact plugs CP can be prevented from being connected to the semiconductor substrate SB, and effects similar to the above-described second embodiment can be obtained.

The epitaxial layer T1 on each of the semiconductor substrate SB or the SOI layer SL constituting the source/drain regions of the MISFETs is formed to protrude from the ends of the upper surface of the semiconductor substrate SB or the SOI layer SL to the isolation region STI side by 5 nm or more in the lateral direction.

Moreover, as shown in FIG. 44, at the location where the shared contact plug SCP is formed, the epitaxial layer T1 is formed to have an increased width as described above; as a result, the shared contact plug SCP can be prevented from being connected to the semiconductor substrate SB, and effects similar to those of the above-described second embodiment can be obtained.

Moreover, in the modification example, even if the contact plug CP is directly connected to the semiconductor substrate SB in the region in which the load MISFET is formed, the load MISFET in this case is a bulk-MISFET instead of an SOI-MISFET; therefore, the MISFET can be prevented from malfunctioning, and the reliability of the semiconductor device can be improved. Moreover, since the load MISFET is a bulk-MISFET instead of an SOI-MISFET, increase in the parasitic resistance of the load MISFET caused by siliciding can be prevented, and the performance of the semiconductor device can be improved.

In a case in which the formation positions of the contact plugs and the shared contact plugs are misaligned, if part of the plugs is formed to be overlapped with the isolation regions outside of the epitaxial layer, the contact area between the epitaxial layer and the plugs is reduced, and the contact resistance thereof is increased. However, in the modification example shown in FIG. 43 and FIG. 44, the width of the epitaxial layer T1 is increased to cover part of the upper surfaces of the isolation regions STI to increase the margins against misalignment of the formation positions of the contact plugs CP and the shared contact plugs SCP. Therefore, even if the formation positions of the plugs are misaligned, increase in the contact resistance between the source/drain regions of the MISFETs and the plugs can be prevented.

The invention accomplished by the present inventor has been specifically explained above based on the embodiments. However, the present invention is not limited to the above-described embodiments, and it goes without saying that various modifications can be made within a range not departing from the gist thereof.

In addition, part of the contents described in the embodiments is described below.

(1) A method of manufacturing a semiconductor device including the steps of:

(a1) preparing an SOI substrate having a semiconductor substrate having a first region and a second region, a first insulating film on the semiconductor substrate, and a semiconductor layer on the first insulating film;

(b1) forming an isolation region including a second insulating film buried in a trench formed in the semiconductor layer and the semiconductor substrate;

(c1) forming a bulk region by removing the semiconductor layer in the second region;

(d1) forming a plurality of first gate electrodes straddling the first region and the second region and forming a plurality of second gate electrodes in the first region;

(e1) introducing a P-type impurity into the upper surface of the semiconductor substrate in the first region to form first source/drain regions and form a load transistor having the first source/drain regions and the first gate electrode;

(f1) introducing an N-type impurity into the upper surface of the semiconductor layer in the second region to form second source/drain regions to form a plurality of drive transistors each having the second source/drain regions and the first gate electrode and a plurality of transfer transistors each having the second source/drain regions and the second gate electrode; and (g1) connecting contact plugs to the first source/drain regions, the second source/drain regions, the first gate electrodes, the second gate electrodes, respectively.

(2) In the method of manufacturing the semiconductor device according to the method of item (1), the contact plugs are formed to be overlapped with the first source/drain regions and the isolation region in a plan view.

(3) The method of manufacturing the semiconductor device according to (1), further including the step of (d2) after the step (d1), forming an epitaxial layer on each of the upper surface of the semiconductor substrate beside the first gate electrode and on the upper surface of the semiconductor layer beside the second gate electrode; in which the epitaxial layer is formed so as to cover the upper surfaces of the first source/drain regions or the upper surfaces of the second source/drain regions and the upper surface of the isolation region.

What is claimed is:

1. A semiconductor device comprising:
an SOI (Silicon On Insulator) substrate including a semiconductor substrate, an insulating film on the semiconductor substrate, and a semiconductor layer on the insulating film;
a field-effect transistor including a first gate electrode formed on the semiconductor layer via a gate insulating film and including source/drain regions formed in the semiconductor layer beside the first gate electrode and in an epitaxial layer in contact with an upper surface of the semiconductor layer;
an isolation region buried in a trench formed in an upper surface of the SOI substrate by forming an opening in the semiconductor layer and the semiconductor substrate; and
a contact plug connected to the epitaxial layer,
wherein the epitaxial layer is formed so as to cover the upper surface of the semiconductor layer and an upper surface of the isolation region,
wherein the contact plug is formed to be overlapped with the semiconductor layer and the isolation region in a plan view,
wherein the contact plug is connected to a second gate electrode formed immediately above the isolation region, and
the contact plug is in contact with the isolation region exposed between the epitaxial layer and the second gate electrode.

2. The semiconductor device according to claim 1,
wherein an end of a bottom surface of the contact plug is terminated immediately above the epitaxial layer.

3. The semiconductor device according to claim 1,
wherein a silicide layer is formed on a surface of the epitaxial layer, and
the contact plug is connected to the epitaxial layer via the silicide layer.

4. The semiconductor device according to claim 1,
wherein a concave portion is formed at an end of the upper surface of the isolation region,
the height of an upper surface of the concave portion is lower than the upper surface of the semiconductor layer, and
the epitaxial layer is buried in the concave portion.

5. The semiconductor device according to claim 4,
wherein a sidewall of the semiconductor layer is covered with the epitaxial layer.

6. The semiconductor device according to claim 1,
wherein the field-effect transistor further includes a channel region formed between the source region and the drain region, the channel region having a 45 degree orientation with respect to the semiconductor layer.

7. The semiconductor device according to claim 1,
wherein the field-effect transistor is a P-type load transistor forming an SRAM (Static Random Access Memory);
the SRAM has a plurality of the load transistors, a plurality of N-type drive transistors, and a plurality of N-type transfer transistors; and
the contact plug is connected to the second gate electrodes respectively forming the transfer transistor and the drive transistor and to a drain region of the load transistor.

8. A semiconductor device comprising:
a semiconductor substrate having a bulk region and an SOI region; and
a SRAM including a plurality of load transistors formed in the bulk region, a plurality of drive transistors formed in the SOI region, and a plurality of transfer transistors formed in the SOI region, wherein source/drain regions of each of the plurality of load transistors, the plurality of drive transistors, and the plurality of transfer transistors is surrounded by an isolation region in a plan view, and contact plugs are connected to upper surfaces of the source/drain regions, respectively.

9. The semiconductor device according to claim 8, wherein the contact plugs are formed to be overlapped with the source/drain regions of the plurality of load transistors and the isolation region adjacent to the source/drain regions in the plan view.

10. The semiconductor device according to claim 8, wherein an epitaxial layer in contact with the upper surfaces of the source/drain regions is formed, and the epitaxial layer is formed so as to cover the upper surfaces of the source/drain regions and an upper surface of the isolation region.

* * * * *